(12) United States Patent
Uhm et al.

(10) Patent No.: US 12,354,838 B2
(45) Date of Patent: Jul. 8, 2025

(54) PLASMA GENERATING DEVICE

(71) Applicant: EN2CORE TECHNOLOGY INC., Daejeon (KR)

(72) Inventors: Sae Hoon Uhm, Hwaseong-si (KR); Yun Seong Lee, Daejeon (KR); Yeong Hoon Sohn, Daejeon (KR); Se Hong Park, Daejeon (KR); Ji Hoon Kim, Daejeon (KR)

(73) Assignee: EN2CORE TECHNOLOGY INC., Daejeon (KR)

( * ) Notice: Subject to any disclaimer, the term of this patent is extended or adjusted under 35 U.S.C. 154(b) by 165 days.

(21) Appl. No.: 18/146,423

(22) Filed: Dec. 26, 2022

(65) Prior Publication Data

US 2023/0136018 A1 May 4, 2023

Related U.S. Application Data

(63) Continuation of application No. PCT/KR2021/008035, filed on Jun. 25, 2021.

(30) Foreign Application Priority Data

Jun. 26, 2020 (KR) .................. 10-2020-0078516
Mar. 15, 2021 (KR) .................. 10-2021-0033623

(51) Int. Cl.
*H01J 37/32* (2006.01)
*H03H 7/38* (2006.01)
*H05H 1/24* (2006.01)

(52) U.S. Cl.
CPC ..... *H01J 37/3211* (2013.01); *H01J 37/32165* (2013.01); *H01J 37/32183* (2013.01);
(Continued)

(58) Field of Classification Search
CPC .......... H01J 37/3211; H01J 37/32165; H01J 37/32183; H01J 37/32348;
(Continued)

(56) References Cited

U.S. PATENT DOCUMENTS 6,531,031 B1   3/2003   Becker et al.
10,541,114 B2  1/2020   Uhm et al.
(Continued)

FOREIGN PATENT DOCUMENTS

EP    3537471 A1    9/2019
JP    2001-23797 A  1/2001
(Continued)

OTHER PUBLICATIONS

International Search Report, International Application No. PCT/KR2021/008035; Oct. 25, 2021; Korean Intellectual Property Office, Daejeon, Korea.
(Continued)

*Primary Examiner* — Abdullah A Riyami
*Assistant Examiner* — Syed M Kaiser
(74) *Attorney, Agent, or Firm* — Central California IP Group, P.C.; Andrew D. Fortney

(57) ABSTRACT

According to one embodiment of the present disclosure, there can be provided a plasma generating device for performing plasma discharge, the plasma generating device having multiple operation modes including a first mode and a second mode, and including: a first power supply capable of changing a frequency within a first frequency range; a second power supply capable of changing a frequency within a second frequency range that is at least partially different from the first frequency range; a dielectric tube; and an antenna module including a first unit coil wound around the dielectric tube at least one time, a second unit coil wound around the dielectric tube at least one time, and a first
(Continued)

capacitor connected in series between the first unit coil and the second unit coil.

20 Claims, 37 Drawing Sheets

(52) U.S. Cl.
CPC .. *H01J 37/32348* (2013.01); *H01J 37/32357* (2013.01); *H01J 37/32844* (2013.01); *H03H 7/38* (2013.01); *H05H 1/246* (2021.05); *H05H 1/2465* (2021.05); *H01J 2237/335* (2013.01); *H05H 2245/17* (2021.05)

(58) Field of Classification Search
CPC ........... H01J 37/32357; H01J 37/32844; H01J 2237/335; H01J 37/32174; H01J 37/321; H03H 7/38; H05H 1/246; H05H 1/2465; H05H 2245/17
See application file for complete search history.

(56) References Cited

U.S. PATENT DOCUMENTS

| | | | |
|---|---|---|---|
| 11,515,119 | B2 | 11/2022 | Kaneko et al. |
| 2008/0188087 | A1 | 8/2008 | Chen et al. |
| 2017/0137944 | A1 | 5/2017 | Kubota et al. |
| 2018/0122619 | A1* | 5/2018 | Uhm ........................ H05H 1/30 |
| 2018/0031558 | A1 | 11/2018 | Hayami et al. |
| 2019/0333740 | A1 | 10/2019 | Bennett |
| 2020/0105502 | A1* | 4/2020 | Uhm ...................... C23C 16/452 |
| 2020/0111641 | A1* | 4/2020 | Uhm ........................ H05H 1/46 |

FOREIGN PATENT DOCUMENTS

| | | | |
|---|---|---|---|
| JP | 2020-17445 | A | 1/2020 |
| JP | 2020-502721 | A | 1/2020 |
| KR | 10-2011-0131834 | A | 12/2011 |
| KR | 10-1657303 | B1 | 9/2016 |
| KR | 10-2017-0026384 | A | 3/2017 |
| KR | 2017-0028289 | A | 3/2017 |
| KR | 10-2018-0001804 | A | 1/2018 |
| KR | 10-1826883 | B1 | 2/2018 |
| KR | 10-2018-0116225 | A | 10/2018 |
| WO | WO-2018084508 A1 * | | 5/2018 ............. C23C 16/50 |

OTHER PUBLICATIONS

Written Opinion, International Application No. PCT/KR2021/008035; Oct. 25, 2021; Korean Intellectual Property Office, Daejeon, Korea.
Office Action, Korean Pat. Appl. No. 10-2020-0078516; issued May 13, 2022; Korean Intellectual Property Office, Daejeon, Korea.
Notice of Allowance, Japanese Pat. Appl. No. 2022-580009; issued Nov. 11, 2023; Japan Patent Office, Tokyo, Japan.
Search Report, EP Patent Application No. 21827961.0, issued Jul. 9, 2024; European Patent Office, Munich, Germany.
Notice of Reasons for Refusal, Japanese Patent Application No. 2023-214649, issued Dec. 3, 2024; Japan Patent Office, Tokyo, Japan.

* cited by examiner (a)

(b)

(a)

(b)

(a)

(b)

(a)

(b)

(a)

(b)

(a)

(b)

PLASMA GENERATING DEVICE

This application is a continuation of International Pat. Appl. No. PCT/KR2021/008035, filed Jun. 25, 2021, now expired, which claims the benefit of Korean Pat. Appl. Nos. 10-2021-0033623, filed Mar. 15, 2021, and 10-2020-0078516, filed Jun. 26, 2020.

TECHNICAL FIELD

The present disclosure relates to a plasma generating device and a control method thereof. More particularly, the present disclosure relates to a plasma generating device and a control method thereof for reducing a by-product produced during plasma discharge.

BACKGROUND ART

Plasma discharge is used in many industrial application fields and scientific application fields, and through plasma discharge, active species of various gases used in various industrial fields, such as semiconductor wafer processing, are generated or, processing of by-products produced in industrial processes is achieved.

A plasma source for performing plasma discharge largely uses an inductively coupled plasma method or a capacitively coupled plasma method. The inductively coupled plasma method is a method of forming an induced electric field by applying RF power to a coil and of performing plasma discharge through the induced electric field.

Impurities may be introduced to active species during performance of plasma discharge because active species or ions generated by discharge collide with a dielectric tube because of the voltage applied to an antenna for discharge. Therefore, it is required to develop a plasma generating device to reduce impurities contained in active species through a structure or design of the antenna for performing plasma discharge.

The foregoing is intended merely to aid in the understanding of the background of the present disclosure, and is not intended to mean that the present disclosure falls within the purview of the related art that is already known to those skilled in the art.

DISCLOSURE

Technical Problem

The present disclosure is directed to providing a plasma generating device.

In addition, the present disclosure is directed to providing a plasma generating device providing active species with reduced impurities.

Technical problems to be solved by the present disclosure are not limited to the aforementioned technical problems and other technical problems which are not mentioned will be clearly understood by those skilled in the art from the present disclosure and the accompanying drawings.

Technical Solution

According to an embodiment of the present disclosure, there is provided a plasma generating device for performing plasma discharge, the plasma generating device having multiple operation modes including a first mode and a second mode, and comprising: a first power supply capable of changing a frequency within a first frequency range; a second power supply capable of changing a frequency within a second frequency range that is at least partially different from the first frequency range; a dielectric tube; and an antenna module including a first unit coil wound around the dielectric tube at least one time, a second unit coil wound around the dielectric tube at least one time, and a first capacitor connected in series between the first unit coil and the second unit coil, wherein when the operation mode is the first mode, the antenna module induces a first plasma discharge based on a power signal having a first frequency within the first frequency range, or when the operation mode is the second mode, the antenna module induces a second plasma discharge based on a power signal having a second frequency within the second frequency range, and wherein the first unit coil and the second unit coil have a first inductance, the first capacitor has a first capacitance, and the first frequency corresponds to a first resonance frequency that is determined according to the first inductance and the first capacitance.

According to another embodiment of the present disclosure, there is provided a control method of a plasma generating device including: a first power supply capable of changing a frequency within a first frequency range, a second power supply capable of changing a frequency within a second frequency range that is at least partially different from the first frequency range, a dielectric tube, and an antenna module including a first unit coil wound around the dielectric tube at least one time, a second unit coil wound around the dielectric tube at least one time, and a first capacitor connected in series between the first unit coil and the second unit coil, the control method comprising: operating in a first mode in which an RF power is provided to the antenna module using a first frequency as a driving frequency; and operating in a second mode in which an RF power is provided to the antenna module using a second frequency as the driving frequency, wherein the first unit coil and the second unit coil have a first inductance, and the first capacitor has a first capacitance, wherein the second frequency corresponds to a second resonance frequency that is determined by the first inductance and the first capacitance.

According to still another embodiment of the present disclosure, there is provided a plasma generating device for generating plasma by receiving power from a first power supply capable of changing a frequency within a first frequency range when an operation mode is a first mode, or by receiving power from a second power supply capable of changing a frequency within a second frequency range that is at least partially different from the first frequency range when the operation mode is a second mode, the plasma generating device comprising: a dielectric tube; and an antenna module including a first unit coil wound around the dielectric tube at least one time, a second unit coil wound around the dielectric tube at least one time, and a first capacitor connected in series between the first unit coil and the second unit coil, wherein when the operation mode is the first mode, the antenna module induces a first plasma discharge based on a power signal having a first frequency within the first frequency range, or when the operation mode is the second mode, the antenna module induces a second plasma discharge based on a power signal having a second frequency within the second frequency range, and wherein the first unit coil and the second unit coil have a first inductance, the first capacitor has a first capacitance, and the first frequency corresponds to a first resonance frequency that is determined based on the first inductance and the first capacitance.

Technical solutions in the present description may not be limited to the above, and other not-mentioned technical solutions will be clearly understandable to those skilled in the art from the present description and the accompanying drawings.

Advantageous Effects

According to the present disclosure, a plasma generating device capable of being utilized in various environments can be provided.

According to the present disclosure, a plasma generating device enabling reduced impurities contained in active species can be provided.

Effects of the present disclosure are not limited to the aforementioned effects, and other effects which are not described herein should be clearly understood by those skilled in the art from the disclosure and the accompanying drawings.

BEST MODE FOR INVENTION

Figure 1:
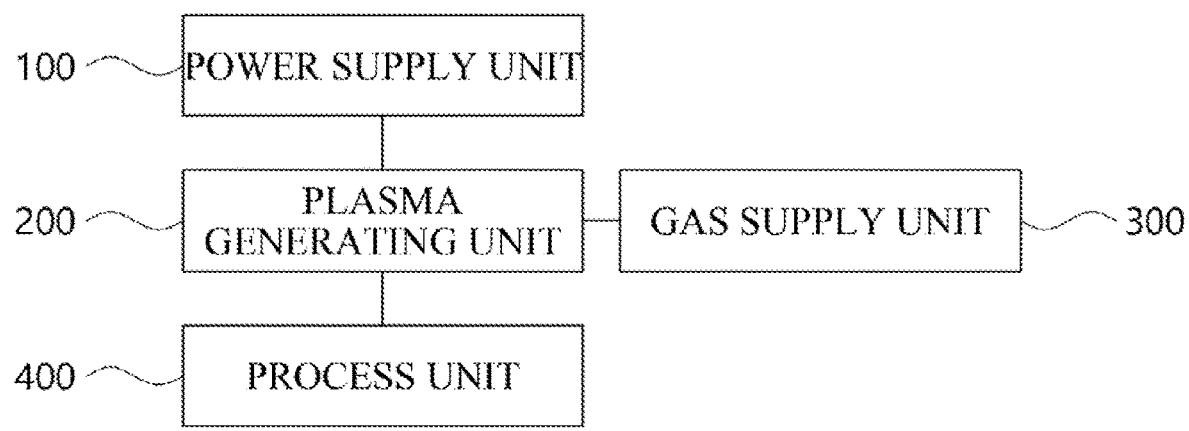
FIG. 1 is a diagram illustrating a plasma generation system according to an embodiment of the present disclosure.

According to an embodiment of the present disclosure, there is provided a plasma generating device for performing plasma discharge, the plasma generating device having multiple operation modes including a first mode and a second mode, and comprising: a first power supply capable of changing a frequency within a first frequency range; a second power supply capable of changing a frequency within a second frequency range that is at least partially different from the first frequency range; a dielectric tube; and an antenna module including a first unit coil wound around the dielectric tube at least one time, a second unit coil wound around the dielectric tube at least one time, and a first capacitor connected in series between the first unit coil and the second unit coil, wherein when the operation mode is the first mode, the antenna module induces a first plasma discharge based on a power signal having a first frequency within the first frequency range, or when the operation mode is the second mode, the antenna module induces a second plasma discharge based on a power signal having a second frequency within the second frequency range, and wherein the first unit coil and the second unit coil have a first inductance, the first capacitor has a first capacitance, and the first frequency corresponds to a first resonance frequency that is determined according to the first inductance and the first capacitance.

According to an embodiment of the present disclosure, the first power supply may include a first matching element having a first impedance.

According to an embodiment of the present disclosure, when the operation mode is the first mode, the antenna module may perform the first plasma discharge based on the power signal having the first frequency, wherein the first frequency may correspond to the first resonance frequency that is determined based on the first impedance, the first inductance, and the first capacitance.

According to an embodiment of the present disclosure, the second power supply may include a second matching element having a second impedance, and when the operation mode is the second mode, the antenna module may perform the second plasma discharge based on the power signal having the second frequency, wherein the second frequency may correspond to a second resonance frequency that is determined based on the second impedance, the first inductance, and the first capacitance and is different from the first resonance frequency.

According to an embodiment of the present disclosure, the second resonance frequency may be higher than the first resonance frequency, and a first voltage that is a voltage between one end of the first unit coil not connected to the first capacitor and one end of the second unit coil not connected to the first capacitor when the operation mode is the first mode may be lower than a second voltage that is a voltage between the one end of the first unit coil not connected to the first capacitor and the one end of the second unit coil not connected to the first capacitor when the operation mode is the second mode.

According to an embodiment of the present disclosure, when the operation mode is the first mode, a voltage between both ends of the first unit coil may correspond to a voltage between one end of the first unit coil not connected to the first capacitor and one end of the second unit coil not connected to the first capacitor.

According to an embodiment of the present disclosure, a voltage between both ends of the antenna module when the operation mode is the first mode may be lower than a voltage between the both ends of the antenna module when the operation mode is the second mode.

According to an embodiment of the present disclosure, a size of a first current flowing through the antenna module when the operation mode is the first mode may be smaller than a size of a second current flowing through the antenna module when the operation mode is the second mode.

According to an embodiment of the present disclosure, power consumed by the antenna module when the operation mode is the first mode may be a first power, and power consumed by the antenna module when the operation mode is the second mode may be a second power that is lower than the first power.

According to another embodiment of the present disclosure, there is provided a control method of a plasma generating device comprising: a first power supply capable of changing a frequency within a first frequency range, a second power supply capable of changing a frequency within a second frequency range that is at least partially different from the first frequency range, a dielectric tube, and an antenna module including a first unit coil wound around the dielectric tube at least one time, a second unit coil wound around the dielectric tube at least one time, and a first capacitor connected in series between the first unit coil and the second unit coil, the control method comprising: operating in a first mode in which an RF power is provided to the antenna module using a first frequency as a driving frequency; and operating in a second mode in which an RF power is provided to the antenna module using a second frequency as the driving frequency, wherein the first unit coil and the second unit coil have a first inductance, and the first capacitor has a first capacitance, wherein the second frequency corresponds to a second resonance frequency that is determined by the first inductance and the first capacitance.

According to an embodiment of the present disclosure, the second power supply may include a second matching element having a second impedance, and the operating in the second mode may include operating with the second frequency as the driving frequency, wherein the second frequency may correspond to the second resonance frequency that is determined based on the first inductance, the first capacitance, and the second impedance.

According to an embodiment of the present disclosure, the first power supply may include a first matching element having a first impedance, and the operating in the first mode may include operating with the first frequency as the driving frequency, wherein the first frequency may correspond to a first resonance frequency that is determined based on the first inductance, the first capacitance, and the first impedance.

According to an embodiment of the present disclosure, power consumed by the antenna module when the operation mode is the first mode may be a first power, and power consumed by the antenna module when the operation mode is the second mode may be a second power that is higher than the first power.

According to an embodiment of the present disclosure, when the operation mode is the first mode, a voltage between both ends of the first unit coil may correspond to a voltage between one end of the first unit coil not connected to the first capacitor and one end of the second unit coil not connected to the first capacitor.

According to an embodiment of the present disclosure, a size of a first current flowing through the antenna module when the operation mode is the first mode may be smaller than a size of a second current flowing through the antenna module when the operation mode is the second mode.

According to an embodiment of the present disclosure, the control method of the plasma generating device may further comprise: acquiring a current flowing through the antenna module when the operation mode is the first mode; and changing the operation mode to the second mode when the current flowing through the antenna module is equal to or smaller than a reference value.

According to an embodiment of the present disclosure, the control method of the plasma generating device may further comprise: acquiring a current flowing through an inverter of the first power supply when the operation mode is the first mode; and changing the operation mode to the second mode when the current flowing through the inverter of the first power supply is equal to or smaller than a reference value.

According to still another embodiment of the present disclosure, there is provided a plasma generating device for generating plasma by receiving power from a first power supply capable of changing a frequency within a first frequency range when an operation mode is a first mode, or by receiving power from a second power supply capable of changing a frequency within a second frequency range that is at least partially different from the first frequency range when the operation mode is a second mode, the plasma generating device including: a dielectric tube; and an antenna module including a first unit coil wound around the dielectric tube at least one time, a second unit coil wound around the dielectric tube at least one time, and a first capacitor connected in series between the first unit coil and the second unit coil, wherein when the operation mode is the first mode, the antenna module induces a first plasma discharge based on a power signal having a first frequency within the first frequency range, or when the operation mode is the second mode, the antenna module induces a second plasma discharge based on a power signal having a second frequency within the second frequency range, and wherein the first unit coil and the second unit coil have a first inductance, the first capacitor has a first capacitance, and the first frequency corresponds to a first resonance frequency that is determined based on the first inductance and the first capacitance.

According to an embodiment of the present disclosure, a voltage between both ends of the antenna module when the operation mode is the first mode may be lower than a voltage between the both ends of the antenna module when the operation mode is the second mode.

According to an embodiment of the present disclosure, when the operation mode is the first mode, a voltage between both ends of the first unit coil may correspond to a voltage between one end of the first unit coil not connected to the first capacitor and one end of the second unit coil not connected to the first capacitor.

According to an embodiment of the present disclosure, there can be provided an antenna module coupled with a dielectric tube and supplied with a power from a power source, the antenna module comprising: a first unit antenna comprising a first unit turn having a first point and a second point and a second unit turn having a third point and a fourth point, wherein the first unit turn is placed between the dielectric tube and the second unit turn, and wherein the second end of the first unit turn is connected to the third point of the second unit turn; a first capacitor electrically interposed between a first terminal of the power source and the first point of the first unit turn, wherein the first point of the first unit turn is connected to the first capacitor; and a second capacitor electrically interposed between a second terminal of the power source and the fourth point of the second unit turn, wherein a capacitance of the second capacitor is smaller than a capacitance of the first capacitor, whereby a damage of the dielectric tube and a production of by-product caused by a voltage applied to the antenna module can be minimized.

According to an embodiment of the present disclosure, the antenna module may further comprise a third capacitor electrically interposed between the fourth point of the second unit turn and the second capacitor, wherein a capacitance of the third capacitor is smaller than the capacitance of the second capacitor.

According to an embodiment of the present disclosure, the capacitance of the first capacitor may be more than twice of the capacitance of the second capacitor.

According to an embodiment of the present disclosure, a total capacitance of the first capacitor and the second capacitor may correspond to the capacitance of the third capacitor.

According to an embodiment of the present disclosure, the antenna module may further comprise a second unit antenna comprising a third unit turn having a fifth point and a sixth point and a fourth unit turn having a seventh point and an eighth point, wherein the third unit turn is placed between the dielectric tube and the fourth unit turn, wherein the sixth point of the third unit turn is connected to the seventh point of the fourth unit turn, wherein the third capacitor is electrically interposed between the fourth point of the second unit turn and the fifth point of the third unit turn, and wherein the second capacitor is electrically interposed between the eighth point of the fourth unit turn and the second terminal of the power source.

According to an embodiment of the present disclosure, the first unit turn and the second unit turn may be placed in a plane which is perpendicular to a length direction of the dielectric tube, and wherein each of the first unit turn and the second unit turn may have a circular arc shape.

According to an embodiment of the present disclosure, the first point may be nearer to the dielectric tube than the fourth point.

According to an embodiment of the present disclosure, a voltage applied to a reactance component of the first capacitor may be smaller than a voltage applied to a reactance component between the first point and the second point and a voltage applied to a reactance component of the third capacitor may correspond to a voltage applied to a reactance component between the first point and the second point when a power is supplied to the antenna module.

According to an embodiment of the present disclosure, the antenna module resonates at a resonance frequency determined based on a capacitance of the third capacitor and an inductance of the first unit antenna, and when the antenna module is in a status of resonance, a point where electric potential of a reactance component to the first terminal is 0 may be placed on the first unit turn of the first unit antenna.

According to an embodiment of the present disclosure, the antenna module may resonate at a resonance frequency determined based on a capacitance of the third capacitor and an inductance of the first unit antenna, and wherein a voltage applied to a reactance component between the first point and the first terminal of the power source may be substantially same to a voltage applied to a reactance component between the second point and the first terminal of the power source.

According to an embodiment of the present disclosure, there can be provided an antenna module coupled with a dielectric tube and supplied with a power from a power source, the antenna module comprising: a first unit antenna comprising a first unit turn having a first point and a second point and a second unit turn having a third point and a fourth point, wherein the first unit turn is placed between the dielectric tube and the second unit turn, and wherein the second end of the first unit turn is connected to the third point of the second unit turn; a first capacitor electrically interposed between a first terminal of the power source and the first point of the first unit turn; and a second capacitor connected to the fourth point of the second unit turn, wherein the first capacitor is electrically interposed between a first terminal of the power source and the first point of the first unit turn, According to an embodiment of the present disclosure, the antenna module may resonate at a resonance frequency determined based on a capacitance of the second capacitor and an inductance of the first unit antenna, and wherein the one point where the voltage is minimized in the first unit antenna may be in the first unit turn when the antenna module is in resonance.

According to an embodiment of the present disclosure, when a power is applied to the antenna module, the one point where the voltage is minimized in the first unit antenna may be in the first unit turn.

According to an embodiment of the present disclosure, when a power is applied to the antenna module, a point where an absolute value of electric potential of a reactance component in the first unit antenna may be in the first unit turn.

According to an embodiment of the present disclosure, the capacitance of the first capacitor may be more than twice of the capacitance of the second capacitor.

According to an embodiment of the present disclosure, in order to minimize a damage of the dielectric tube and a production of by-product caused by a voltage applied to the antenna module, a capacitance of the second capacitor may be smaller than a capacitance of the first capacitor.

According to an embodiment of the present disclosure, the antenna module may further comprise a second unit antenna including a third unit turn extending from a fifth point to a sixth point and a fourth unit turn extending from a seventh point to an eighth point, wherein the third unit turn is positioned inner side of the fourth unit turn, and the sixth point is connected to the seventh point, wherein the second capacitor is connected between the fourth point and the fifth point, and wherein a third capacitor connected between the eighth point and the second terminal of the power source may be included.

According to an embodiment of the present disclosure, a capacitance of the second capacitor may be smaller than a capacitance of the third capacitor.

According to an embodiment of the present disclosure, a total capacitance of a capacitance of the first capacitor and a capacitance of the third capacitor may correspond to a capacitance of the second capacitor.

According to an embodiment of the present disclosure, there can be provided an antenna module coupled with a dielectric tube and supplied with a power from a power source, the antenna module comprising: a first unit antenna including a first unit turn extending from a first point to a second point and a second unit turn extending from a third point to a fourth point, the first unit turn is positioned inner side of the second unit turn and the second point is connected to the third point; a first capacitor connected to the first point of the first unit turn and connected between a first terminal of the power source and the first point; and a second capacitor connected between a second terminal of the power source and the fourth point; wherein a capacitance of the second capacitor is different from a capacitance of the first capacitor.

According to an embodiment of the present disclosure, the antenna module may further comprise, a third capacitor connected between the fourth point of the second unit turn and the second capacitor; a second unit antenna including a third unit turn extending from a fifth point to a sixth point and a fourth unit turn extending from a seventh point to an eighth point, the third unit turn positioned inner side of the fourth unit turn and the sixth point connected to the seventh point; wherein the third capacitor is connected between the fourth point and the fifth point, wherein the second capacitor is connected between the eighth point and the second terminal of the power source, and wherein a total capacitance of a capacitance of the first capacitor and a capacitance of the second capacitor may correspond to a capacitance of the third capacitor.

Mode for Invention

The above-described objectives, features, and advantages of the present disclosure will be more apparent from the following description in conjunction with the accompanying drawings. The present disclosure may be modified in various ways and implemented by various embodiments, so that specific embodiments are shown in the drawings and will be described in detail.

In the drawings, the thicknesses of layers and regions are exaggerated for clarity. In addition, it should be understood that when an element or layer is referred to as being on another element or layer, it may be disposed directly on the other element or layer or may be disposed on the other element with an intervening layer or element therebetween. Throughout the specification, the same reference numerals denote the same elements in principle. In addition, in the drawings of each embodiment, the elements having the same function within the same scope are described using the same reference numerals.

When it is determined that a detailed description of a known function or configuration related to the present disclosure may make the gist of the present disclosure unclear, the detailed description thereof will be omitted. In addition, the numbers (for example, first, second, etc.) used in describing the present disclosure are only identification symbols for distinguishing one element from other elements.

In addition, the words "module" and "unit" for elements used in the following description are given or mixed and used considering only easiness in preparing a specification, and do not have a meaning or role distinguished from each other in themselves.

A method according to an embodiment may be realized as program instructions executable by various computer means and may be recorded on a computer-readable medium. The computer-readable medium may include program instructions, data files, data structures, and the like separately or in combinations. The program instructions recorded on the medium may be specially designed and configured for the present disclosure or may be well-known to and usable by those skilled in the art of computer software. Examples of the computer-readable recording medium include: magnetic media such as hard disks, floppy disks, and magnetic tapes; optical media such as CD-ROMs, and DVDs; magneto-optical media such as floptical disks; and hardware devices, such as ROM, RAM, and flash memory, which are particularly structured to store and execute program instructions. Examples of the program instructions may include mechanical language codes made by a compiler, as well as high level language codes executable by a computer using an interpreter, etc. The above-described hardware devices may be configured to act as one or more software modules in order to perform the operation of an embodiment, or vice versa.

1. Plasma Generation System

According to an embodiment, a plasma generation system may be provided.

FIG. 1 is a diagram illustrating a plasma generation system according to an embodiment. Referring to FIG. 1, the plasma generation system may include: a power supply unit 100 providing power; a plasma generating unit 200 receiving power from the power supply unit 100 and generating plasma; and a gas supply unit 300 supplying gas to the plasma generating unit 200. The plasma generation system may further include a process unit 400 performing a process using the generated plasma.

The power supply unit 100 may supply power required for generating plasma. The power supply unit 100 may supply power to the plasma generating unit. The power supply unit 100 may include a DC power source and/or an RF power source. The power supply unit 100 may provide a high-voltage pulse to the plasma generating unit 200 through the DC power source. The power supply unit 100 may provide RF power to the plasma generating unit 200 through the RF power source.

The plasma generating unit 200 may perform plasma discharge. The plasma generating unit 200 may acquire a discharge gas and may perform plasma discharge through the discharge gas. The plasma generating unit 200 may perform inductively coupled plasma discharge or capacitively coupled plasma discharge.

The plasma generating unit 200 may be a remote plasma source. The plasma generating unit 200 may form active species, and provide the formed active species to the process unit 400.

The plasma generating unit 200 may include a normal-pressure plasma device performing plasma discharge at atmospheric pressure (normal pressure). For example, the plasma generating unit 200 may include a normal-pressure plasma device performing plasma discharge at several hundreds of Torr to atmospheric pressure (750 Torr).

The plasma generating unit 200 may include a low-pressure plasma device performing low-pressure plasma discharge. For example, the plasma generating unit 200 may include a low-pressure plasma device that creates an environment with an initial vacuum degree (base pressure) of $10^{-3}$ to $10^{-7}$ Torr or less and generates plasma at a process pressure of several mTorr to several Torr by using a desired process gas.

The plasma generating unit 200 may perform a low-temperature plasma discharge operation at several ten to several hundred degrees Celsius. For example, the plasma generating unit 200 may perform a low-pressure and low-temperature plasma discharge operation, such as cleaning, etching, deposition, surface treatment, and material synthesis of a process for a semiconductor and a display. In addition, for example, the plasma generating unit 200 may perform a normal-pressure and low-temperature plasma discharge operation for a cleaning process of a glass substrate, reforming of a hydrophilic/hydrophobic surface, nanotechnology, sterilization, removal of harmful substances, and reduction of carbon dioxide.

The plasma generating unit 200 may perform, at a high temperature of several thousand to several tens of thousand degrees Celsius, a high-temperature plasma discharge operation for gas reforming, micro-particle generation, plasma welding, cutting, and metallurgy.

Hereinafter, the plasma generating unit 200 or the plasma generating device may be interpreted as an apparatus performing the low-temperature plasma discharge or the high-temperature plasma discharge described above.

The plasma generating unit 200 may generate a seed charge in order to generate plasma. In particular, when the plasma generating unit 200 performs normal-pressure plasma discharge, the plasma generating unit 200 generates a seed charge for initial discharge. The plasma generating unit 200 includes a DC electrode, and generates a seed charge when a DC high-voltage pulse is provided to the DC electrode.

The plasma generating unit 200 may perform initial discharge and main discharge to generate plasma. The plasma generating unit 200 may perform initial discharge according to a capacitively coupled mode (mode E) or may perform main discharge according to an inductively coupled mode (mode H). The plasma generating unit 200 includes an inductively coupled antenna including a coil, and may perform initial discharge or main discharge as RF power is provided to the inductively coupled antenna.

A detailed configuration and operation of the plasma generating unit 200 will be described below.

The gas supply unit 300 may supply the plasma generating unit 200 with gas for plasma discharge. The gas supply unit 300 may supply the plasma generating unit 200 with a reactive gas or a process gas. The gas supply unit 300 may supply gas selected according to the function or use of the plasma generating unit 200 or the process unit 400.

For example, the gas supply unit 300 may supply the plasma generating unit 200 with any one gas of the following or a gas mixture of gas and air: nitrogen trifluoride gas ($NF_3$ gas), argon gas (Ar gas), xenon gas (Xe gas), krypton gas (Kr gas), nitrogen gas ($N_2$ gas), oxygen gas (O2 gas), hydrogen gas ($H_2$ gas), helium gas (He gas), neon gas (Ne gas), monosilane gas ($SiH_4$ gas), ammonia gas ($NH_3$ gas), phosphine gas ($PH_3$ gas), diborane gas ($B_2H_6$ gas), dichlorosilane gas (DCS gas), octafluorocyclopentene gas ($C_5F_8$ gas), carbon tetrafluoride gas ($CF_4$ gas), hydrogen bromide gas (HBr gas), chlorine gas ($Cl_2$ gas), xenon gas (Xe gas), krypton gas (Kr gas), sulfur hexafluoride gas ($SF_6$ gas), and methane gas ($CH_4$ gas). The gas supply unit 300 may supply gas to the plasma generating unit through a liquid precursor, such as tetra-ethyl-ortho-silicate (TEOS), Tetrakis (ethylmethylamino) zirconium, trimethyl aluminum, and hexamethyldisiloxane.

The process unit 400 may perform a process before or after plasma discharge. The process unit may perform a purpose process through the plasma generated by the plasma generating unit 200. Alternatively, the process unit 400 may transmit a material generated by performing the purpose process to the plasma generating unit.

The purpose process may be the following: a cleaning process of removing a fine oil film on a surface of a material to be processed, through collision of the surface and plasma ions/radicals; an etching process of generating plasma by using a reactive etching gas according to a process and of selectively removing materials by using the plasma; a deposition process of injecting a deposition gas appropriate for the purpose and an additional gas for plasma discharge and of depositing materials on the surface; a reforming process of changing the characteristics of the surface by using plasma; and a material decomposition process of decomposing a target material through plasma discharge.

The process unit 400 may perform a purpose operation related to processing of a semiconductor substrate. For example, the process unit 400 may receive active species (for example, hydrogen active species) from the plasma generating unit and may perform a process of cleaning inside a process chamber.

The process unit 400 may include: a process chamber; a substrate holder provided inside the process chamber and at which a semiconductor substrate (for example, a silicon semiconductor substrate) to be processed is positioned; a shower head located above the substrate holder and for supplying a substrate processing material into the process chamber; and/or a vacuum pump for discharging air from the process chamber.

Figure 2:
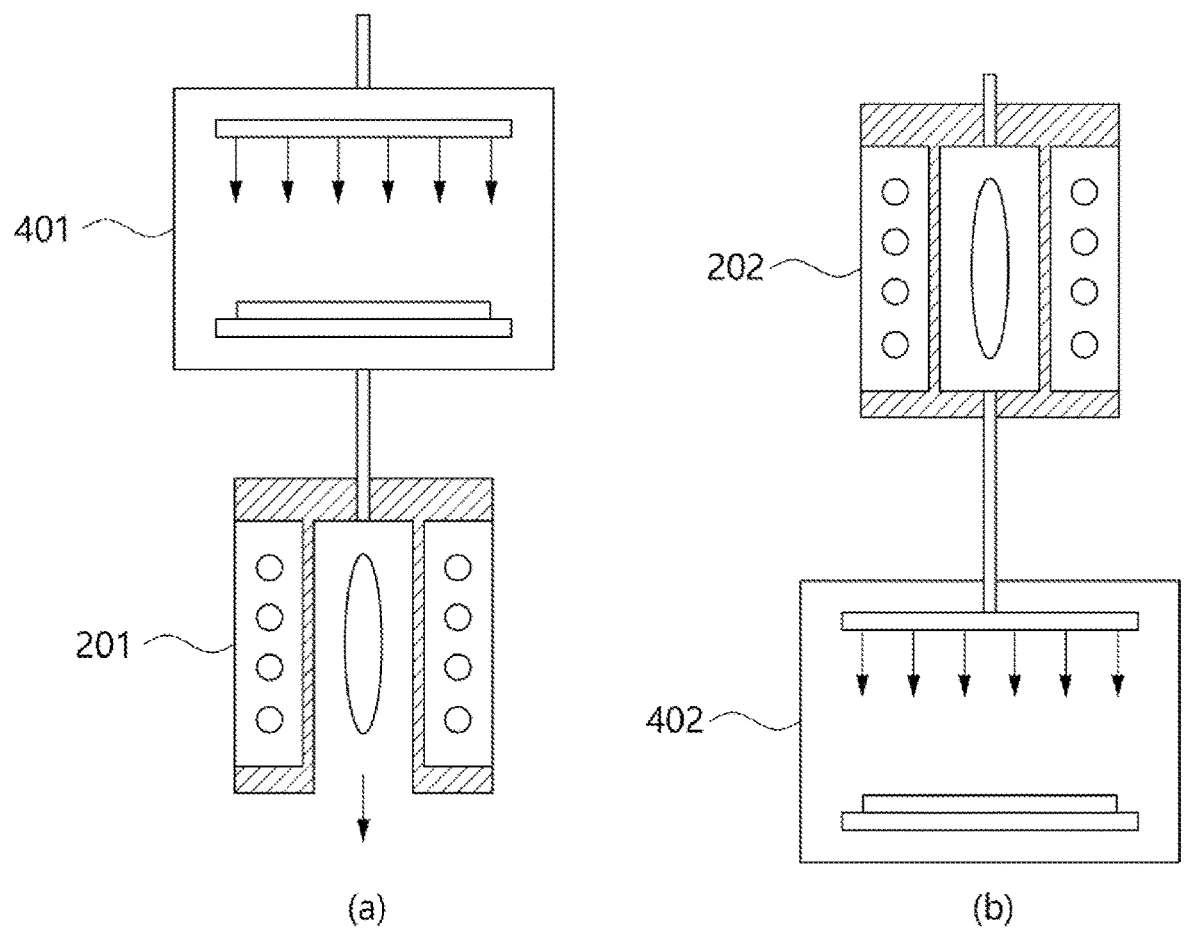
FIG. 2 is a diagram illustrating a plasma generation system according to an embodiment of the present disclosure.

The plasma generation system may be realized such that the process unit 400 performs the purpose process through the plasma generated by the plasma generating unit or that a by-product produced because of the purpose process of the process unit 400 is processed by the plasma generating unit 200. FIG. 2 is a diagram illustrating a plasma generation system according to several embodiments. Referring to (a) of FIG. 2, a plasma generation system according to an embodiment may include a process unit 401 and a plasma generating unit 201 processing materials generated by the process unit 401. For example, referring to (a) of FIG. 2, the plasma generation system may include a gas scrubber device. The process unit 401 is a device that performs a semiconductor manufacturing process. The plasma generating unit 201 may perform processing of a persistent gas, for example, sulfur hexafluoride ($SF_6$), carbon tetrafluoride ($CF_4$), and perfluorocarbon (PFC) gas, generated in the semiconductor manufacturing process of the process unit 401.

Referring to (b) of FIG. 2, a plasma generation system according to an embodiment may include: a plasma generating unit 202 generating active species and supplying the active species to a process unit 402; and the process unit 402 performing a process using active species. For example, the plasma generating unit 202 may generate active species through plasma discharge of gas such as $NF_3$, $H_2$, $N_2$, $O_2$, $C_3F_8$, CF4, $Cl_2$, and $SiH_4$. The process unit 402 may perform operations, such as dry etching, PECVD, PVD, asking, and cleaning, through the active species generated by the plasma generating unit 202.

2. Plasma Generating Device 2.1 Summary of Plasma Generating Device

Hereinafter, a plasma generating device that resonates at multiple resonance frequencies to perform plasma discharge will be described.

According to an embodiment, the plasma generating device may include multiple modules having different impedances. The plasma generating device resonates at resonance frequencies corresponding to the respective modules when power is supplied at the resonance frequencies corresponding to the respective modules. For example, the plasma generating device may include a first module having a first impedance and a second module having a second impedance, and may resonates at a first frequency corresponding to the first module and at a second frequency corresponding to the second module.

According to an embodiment, the plasma generating device may perform different functions according to the frequency of applied power. For example, when power is supplied at a first frequency, the plasma generating device performs initial discharge that promotes initial generation of plasma. Alternatively, when power supplied at a second frequency different from the first frequency, the plasma generating device performs main discharge that continuously generates and maintains plasma.

The plasma generating device may be configured such that constituents to which power is provided varies according to the frequency of applied power. When power is supplied at a first frequency, the plasma generating device supplies more power to a first module than to a second module. When power is supplied at a second frequency, the plasma generating device supplies more power to the second module than to the first module.

Hereinafter, a plasma generating device according to several embodiments will be described, the plasma generating device including the power supply unit and the plasma generating unit described above.

2.2 Configuration of Plasma Generating Device 2.2.1 Summary

Figure 3:
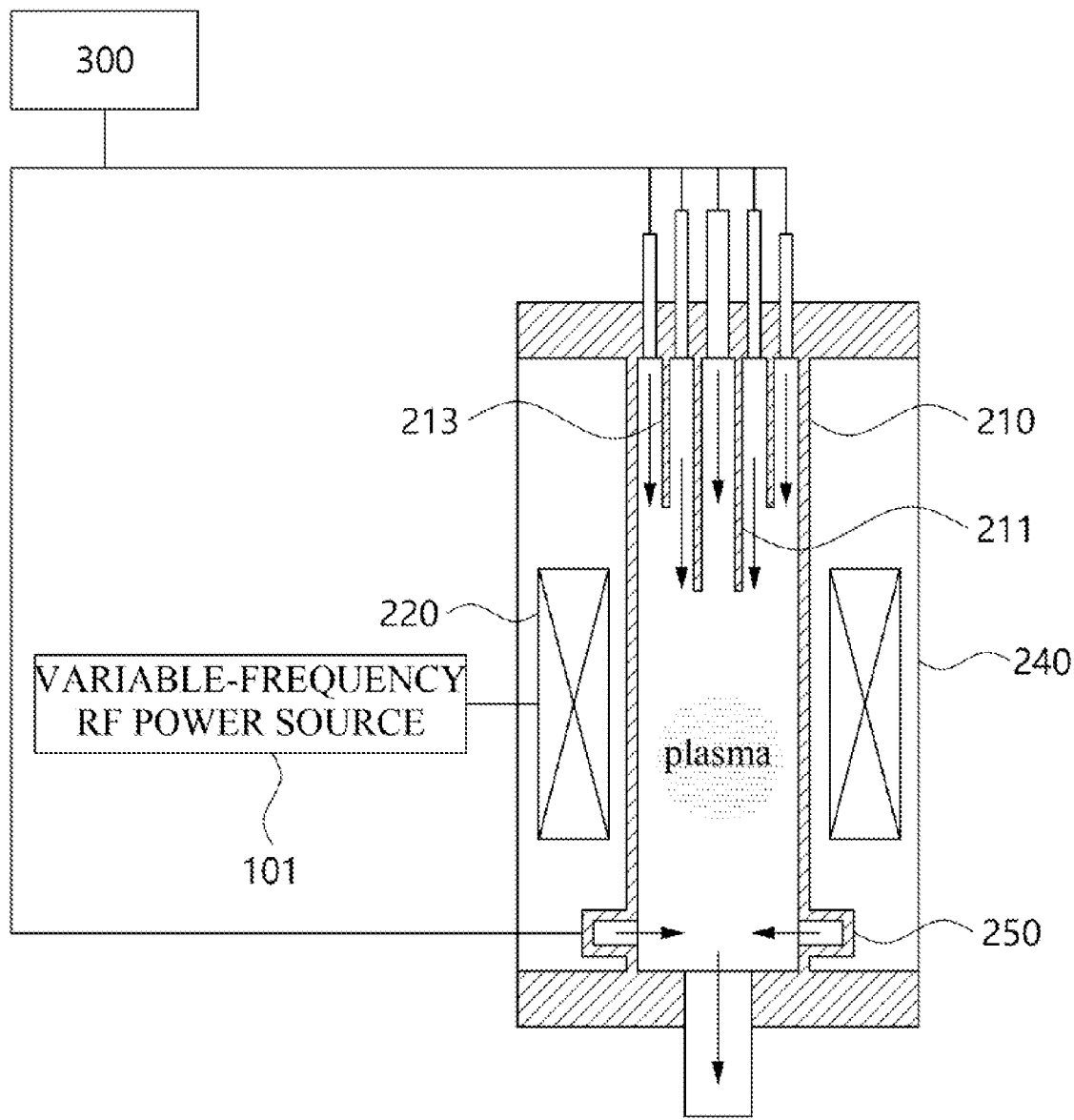
FIG. 3 is a diagram illustrating a plasma generating device according to an embodiment of the present disclosure.

FIG. 3 is a diagram illustrating a plasma generating device according to an embodiment. Referring to FIG. 3, a plasma generating device according to an embodiment may include: an RF power source 101 capable of changing frequency; and a plasma generating unit receiving power from the RF power source 101 and generating plasma. Referring to FIG. 3, the plasma generating unit may include: a dielectric tube 210; a gas tube (211, 213) located inside the dielectric tube 210; and an antenna module 220 provided near the dielectric tube 210, receiving power from the RF power source 101, forming an induced electric field, and generating plasma inside the dielectric tube 210. The plasma generating device may further include an auxiliary gas supply nozzle 250.

The RF power source 101 may change the driving frequency within a variable-frequency range. The RF power source 101 may have a variable-frequency range of several hundreds of kHz to several tens of MHz and/or power of several tens of kW or greater. For example, the RF power source 101 may be an AC power source that provides power at a frequency in a range of 100 kHz to 5 MHz.

According to an embodiment, the frequency of the RF power source 101 may be applied differently according to the shape of an antenna module. For example, the frequencies of the RF power source may vary according to the interval of capacitors included in the antenna module. For example, according to the interval of capacitors included in the antenna module, the RF power source having the maximum frequency of several MHz or several tens of MHz may be used.

The RF power source 101 may perform impedance matching by changing the driving frequency. The RF power source 101 may change the driving frequency so that the plasma generating unit operates in a resonance state.

The RF power source 101 may include: a rectifier converting commercial AC power into DC power; a controller controlling a driving frequency and power by providing a switching signal; and an inverter converting DC power into RF power based on the switching signal of the controller.

The dielectric tube 210 may be provided in the form of a cylindrical tube. The outer diameter of the dielectric tube 210 may be several centimeters to several ten centimeters. The inner diameter of the dielectric tube 210 may be smaller than the outer diameter thereof by several millimeters to several centimeters.

The dielectric tube 210 may be a dielectric tube. The dielectric tube 210 may be made of a non-conductive material such as ceramic (for example, alumina or AlN), sapphire, and quartz.

The dielectric tube 210 may provide a discharge region in which plasma is located. The internal pressure of the dielectric tube 210 may be adjusted differently from the external pressure. As needed, the internal pressure of the dielectric tube 210 is adjusted to an ultra-low pressure equivalent to vacuum, or to a low pressure of several mTorr to a normal pressure equal to or higher than atmospheric pressure.

The gas tube 211, 213 may provide a path for providing gas to the dielectric tube 210 and the inside of the dielectric tube 210. The gas tube 211, 213 may inhibit plasma from being in contact with the inner wall of the dielectric tube 210 and may secure plasma stability.

The gas tube 211, 213 may be one or more in number. The gas tube may include a first gas tube 211 and a second gas tube 213. The first gas tube 211 and the second gas tube 213 may have a concentric structure. The first gas tube 211 may provide an input path for a first gas (for example, gas for reaction such as methane gas). The second gas tube 213 may provide an input path for a second gas (for example, gas containing carbon dioxide as a main ingredient) having composition different from that of the first gas.

The first gas tube 211 and the second gas tube 213 may provide swirl flow. For example, the first gas tube 211 may provide inner swirl flow, and the second gas tube 213 may provide outer swirl flow.

The antenna module 220 may receive power from the RF power source 101 and may induce plasma discharge inside the dielectric tube 210. The antenna module 220 may receive AC power from the RF power source 101 and may generate inductively coupled plasma inside the dielectric tube 210. A more detailed example of the antenna module 220 will be described with electrode breakdown below.

The auxiliary gas supply nozzle 250 may supply an auxiliary gas into the dielectric tube 210. The auxiliary gas supply nozzle 250 may be located close to another end facing an end of the dielectric tube 210 where gas is input through. The auxiliary gas supply nozzle 250 may be provided near the dielectric tube 210 and may be provided between the antenna module 220 and a gas discharge hole (an outlet of the dielectric tube 210).

The plasma generating device may further include a safety case 190 for securing safety that shields the dielectric tube 210 and the antenna module 220 and blocks external influences.

2.2.2 Dc Power Source and Electrode

A plasma generating device according to an embodiment may include: a DC power source for applying a DC high voltage; and a DC electrode (ignition electrode) for causing capacitively coupled plasma discharge inside a dielectric tube when the DC high voltage is applied. In particular, in a case of a plasma generating device used for normal-pressure plasma discharge, inductively coupled plasma discharge may be more difficult than low-pressure plasma discharge, but a seed charge is provided using an ignition electrode, thereby assisting initial discharge and improving discharge stability.

The plasma generating device may include one or more discharge electrodes that cause discharge inside the dielectric tube. The plasma generating device may apply a DC voltage to the discharge electrodes to cause capacitively coupled discharge, for example, local streamer discharge, inside the dielectric tube. The plasma generating device may provide a seed charge inside the dielectric tube by applying a DC voltage to the discharge electrodes.

Figure 4:
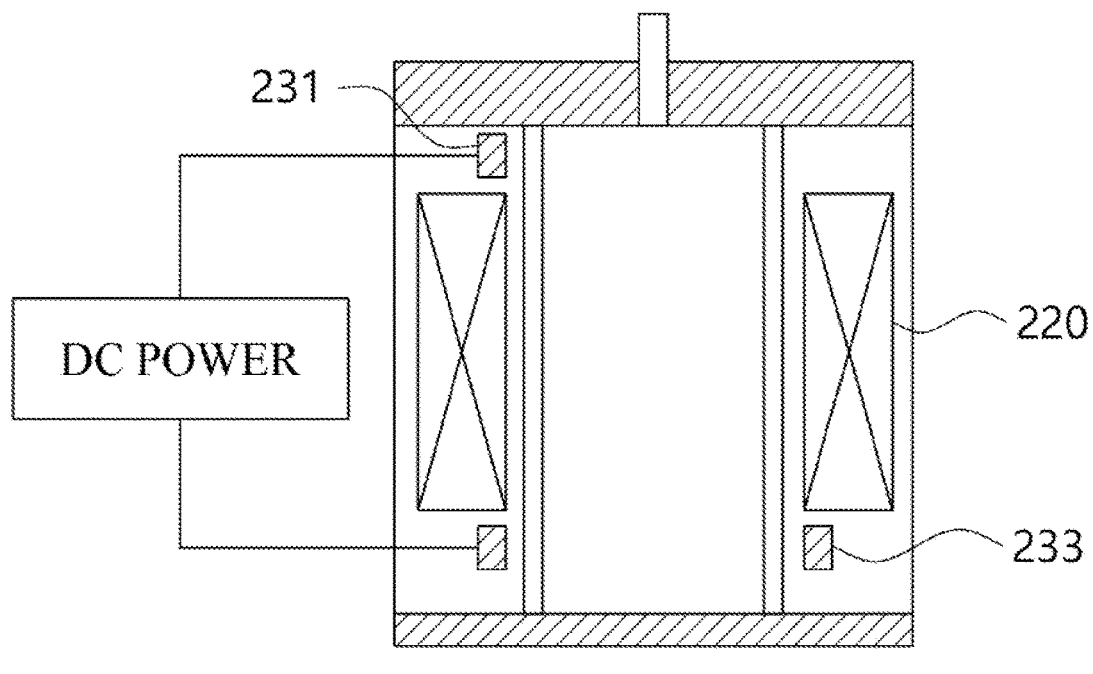
FIG. 4 is a diagram illustrating a DC electrode according to an embodiment of the present disclosure.
Figure 4:
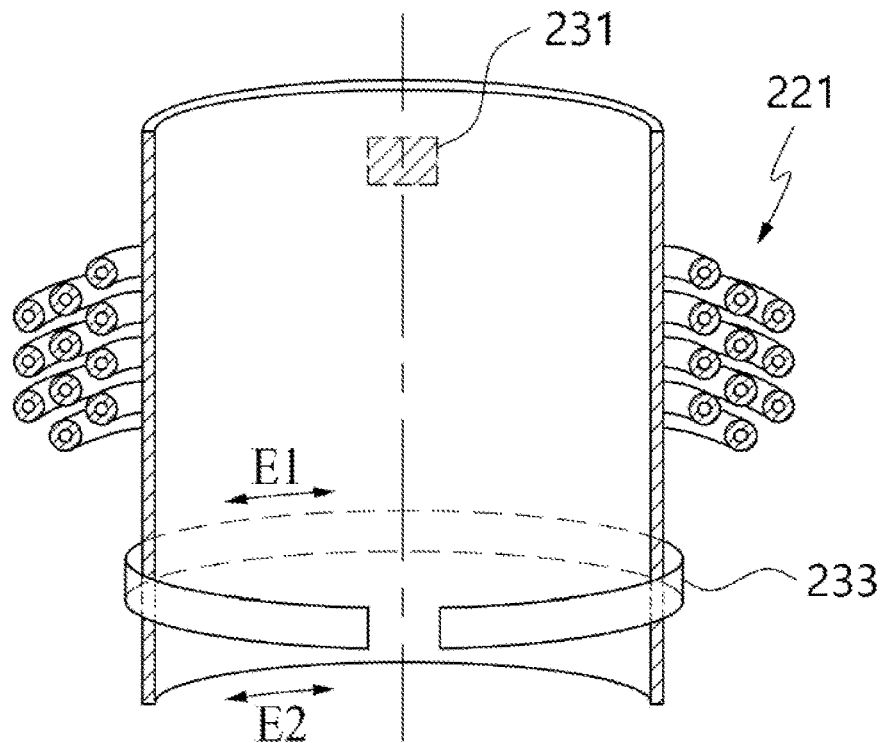

FIG. 4 is a diagram illustrating a discharge electrode according to an embodiment.

Referring to (a) of FIG. 4, a plasma generating device according to an embodiment may include one or more electrodes that are located near an antenna module 220 causing plasma discharge and are connected to a DC power source. The plasma generating device may include: a first electrode 231 located above the antenna module 220; and a second electrode 233 located below the antenna module 220.

Referring to (b) of FIG. 4, the plasma generating device may include: the first electrode 231 located at an outer surface of a dielectric tube and located above an inductive coil 221 of the antenna module 220; and the second electrode 233 provided to surround the outer surface of the dielectric tube and located below the inductive coil 221. Referring to FIG. 4B, the first electrode 231 may have the shape of a quadrangular plate. The second electrode 233 may have the shape of letter "C". Alternatively, the second electrode 233 may include multiple slits. In order to prevent eddy currents from flowing through the second electrode 233 due to the influence of induced electric fields E1 and E2 formed by the inductive coil, the second electrode 233 may have an open loop structure that does not completely surround the outer wall of the dielectric tube.

The DC power source may apply a positive high voltage to the first electrode 231 and may apply a negative high voltage to the second electrode 233. When a high-voltage pulse is applied between the first electrode 231 and the second electrode 233 by the DC power source, capacitively coupled plasma discharge, for example, vertical streamer discharge, occurs between the first electrode 231 and the second electrode 233.

Figure 5:
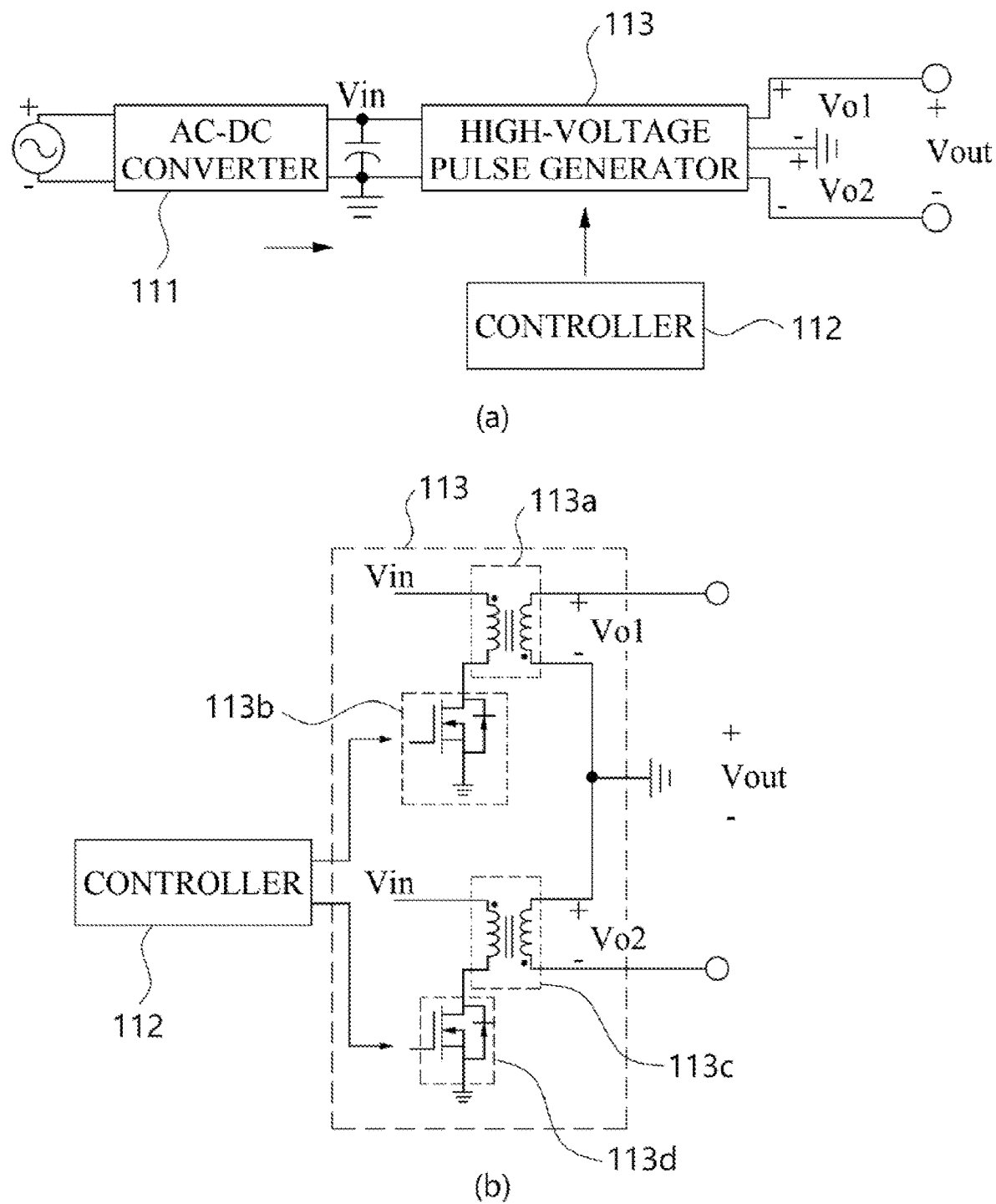
FIG. 5 is a diagram illustrating a DC power source according to an embodiment of the present disclosure.

FIG. 5 is a diagram illustrating a power source according to an embodiment.

Referring to (a) of FIG. 5, a DC power source may include: an AC-DC converter 111 converting commercial AC power to a DC voltage; a high-voltage pulse generator 113 generating a positive DC high-voltage pulse through the DC voltage; and a controller 112 controlling the high-voltage pulse generator.

(b) of FIG. 5 is a diagram illustrating an embodiment of the high-voltage pulse generator shown in (a) of FIG. 5.

Referring to (b) of FIG. 5, the high-voltage pulse generator 113 according to an embodiment may include: a first transformer 113a including a primary coil acquiring a DC voltage from the AC-DC converter and a secondary coil generating a positive DC high-voltage pulse; a first power transistor 113b connected to the primary coil of the first transformer 113a; a second transformer 113c including a primary coil acquiring a DC voltage from the AD-DC converter and a secondary coil generating a negative DC high-voltage pulse; and a second power transistor 113d connected to the primary coil of the second transformer. The controller 112 may control the gate of the first power transistor 113b and the gate of the second power transistor 113d. One end of the secondary coil of the first transformer 113a is grounded and another end of the secondary coil of the first transformer 113a may output a positive DC high-voltage pulse Vo1. One end of the secondary coil of the second transformer 113c is grounded and another end of the secondary coil of the second transformer 113c may output a negative DC high-voltage pulse Vo2.

The DC voltage Vin may be a DC power of 12 to 24 V. The controller 112 may perform control in a manner that synchronizes the on-time of the first power transistor 113b and the second power transistor 113d with a repetition frequency. A voltage of the DC high-voltage pulse may be several tens of kV, for example, 10 to 50 kV. A repetition frequency of the DC high-voltage pulse may be several kHz to several tens of kHz, for example, 10 kHz to 100 kHz.

Figure 6:
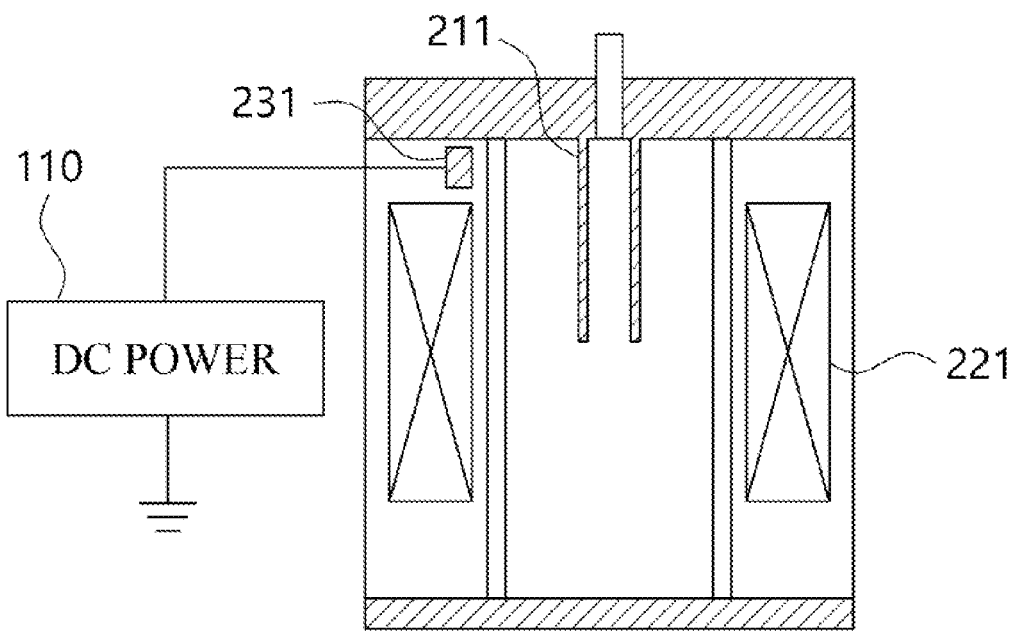
FIG. 6 is a diagram illustrating a DC electrode according to an embodiment of the present disclosure.
Figure 6:
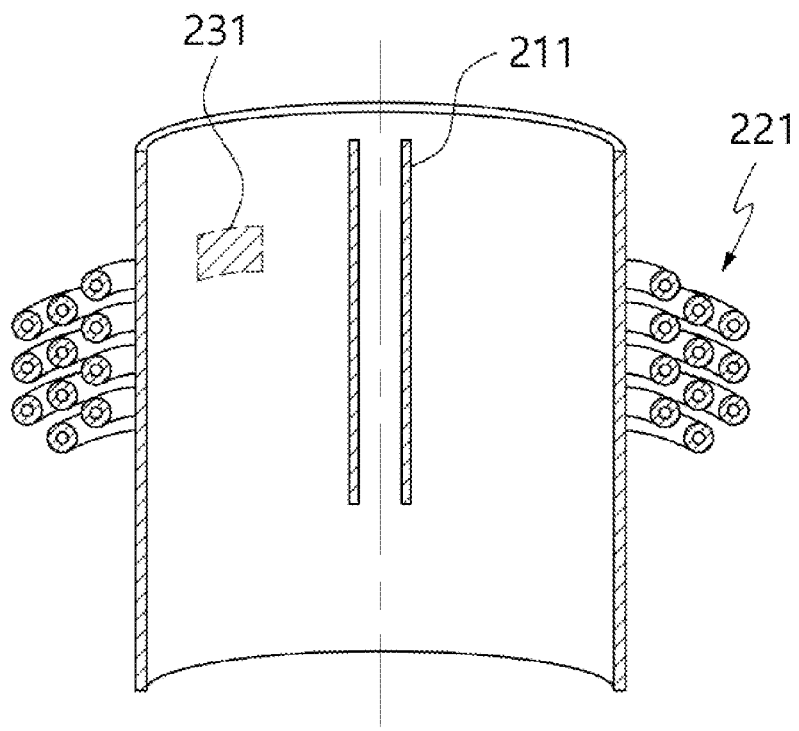

FIG. 6 is a diagram illustrating a discharge electrode according to another embodiment.

Referring to (a) of FIG. 6, a plasma generating device according to an embodiment may include an electrode 231 that is located near an antenna module 220 causing plasma discharge and is connected to a DC power source 110.

The plasma generating device may apply a high voltage to the electrode 231 through the DC power source 110, and may cause capacitively coupled discharge between the electrode 231 and a nearby object (for example, a metal object located inside/outside the dielectric tube). The plasma generating device may apply a high voltage to the electrode 231 through the DC power source 110, and may cause capacitively coupled discharge between the electrode 231 and the gas tube 211 that is located inside the dielectric tube and is grounded. The plasma generating device may cause discharge between the gas tube 211 and the electrode 231 to provide a seed charge.

Referring to (b) of FIG. 6, the plasma generating device may include the electrode 231 located at an outer surface of the dielectric tube and located above an inductive coil 221 of the antenna module 220. The electrode 231 may have the shape of a quadrangular plate. The plasma generating device applies a positive high voltage, through the DC power source, to the electrode 231 that is located at the outer surface of the dielectric tube and has the shape of a quadrangular plate so that discharge between the electrode 231 and the gas tube 211 that is located inside the dielectric tube and is grounded is induced. When a high-voltage pulse is applied to the electrode 231 by the DC power source, capacitively coupled plasma discharge, for example, streamer discharge, occurs between the electrode 231 and the gas tube 211.

Figure 7:
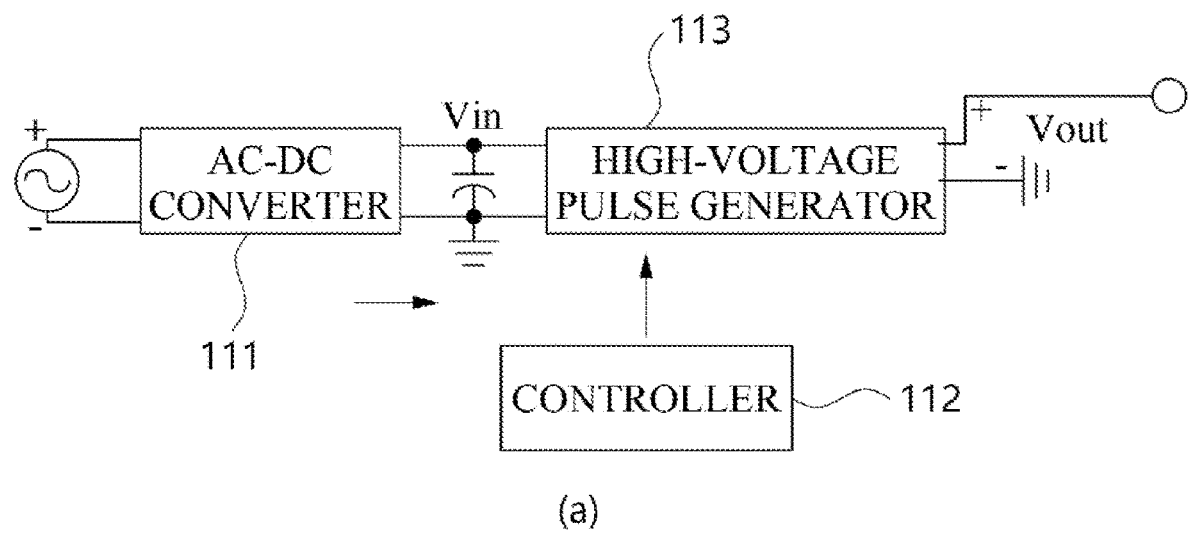
FIG. 7 is a diagram illustrating a DC power source according to an embodiment of the present disclosure.
Figure 7:
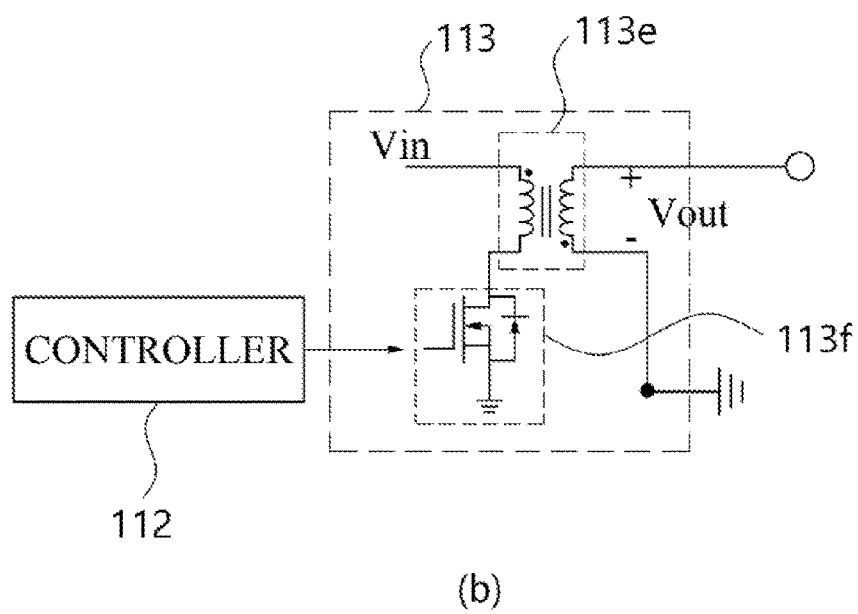

(a) of FIG. 7 is a diagram illustrating a power source according to an embodiment. (b) of FIG. 7 is a diagram illustrating an embodiment of the high-voltage pulse generator shown in (a) of FIG. 7. For the power source and the high-voltage pulse generator in (a) and (b) of FIG. 7, the contents described with reference to FIG. 5 may be similarly applied unless otherwise specifically described.

Referring to (b) of FIG. 7, a high-voltage pulse generator 113 according to an embodiment may include: a transformer 113e including a primary coil acquiring a DC voltage from an AC-DC converter and a secondary coil generating a positive DC high-voltage pulse; and a transistor 113f connected to the primary coil of the transformer 113e. A controller 112 may control the gate of the transistor 113e. One end of the secondary coil of the transformer 113f is grounded and another end of the secondary coil of the transformer 113f may output a positive DC high-voltage pulse Vout.

2.2.3 Induction Electrode

A plasma generating device may include one or more induction electrodes that causes discharge inside a dielectric tube. The plasma generating device may include one or more antenna modules that causes inductively coupled plasma discharge when power is supplied from an RF power source. The antenna modules may operate differently depending on the form thereof and frequency of an input power signal. Hereinafter, an antenna module according to several embodiments will be described.

2.2.3.1 Antenna Module of First Type

Figure 8:
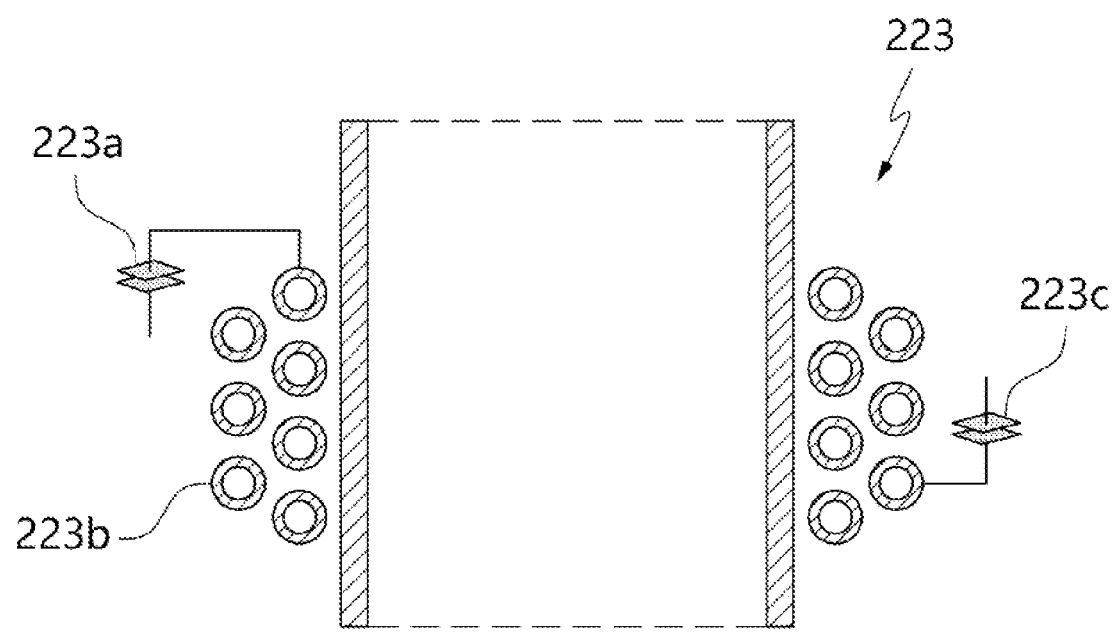
FIG. 8 is a diagram illustrating an antenna module according to an embodiment of the present disclosure.

FIG. 8 is a diagram illustrating a form of an antenna module according to an embodiment. Referring to FIG. 8, an antenna module 223 according to an embodiment may include a first capacitor 223a, an inductive coil 223b, and a second capacitor 223c.

The first capacitor 223a may be connected between one end of the inductive coil 223b and an RF power source, and the second capacitor 223c may be connected between another end of the inductive coil 223b and the RF power source. The first capacitor 223a and the second capacitor 223c may have the same capacitance.

The inductive coil 223b may be located between the first capacitor 223a and the second capacitor 223c. The inductive coil 223b may be a solenoid coil having a multi-layer structure. The inductive coil 223b may be a solenoid coil wound around the outer surface of a dielectric tube multiple times and in multiple layers. Unit turns constituting the inductive coil 223b may be wound to form a magnetic field that constructively interferes inside the dielectric tube in response to an AC power source. The inductive coil 223b may be a solenoid coil wound around the outer surface of a dielectric tube multiples times in one direction.

The inductive coil 223b may be a solenoid coil that is densely wound so that the number of windings per unit length of a dielectric tube is maximized. Although shown briefly in FIG. 5, the inductive coil 223b may be a solenoid coil having a larger number of windings than that shown in FIG. 8. For example, the inductive coil 223b may have a three-layer structure including an inner solenoid coil, an intermediate solenoid coil, and an outer solenoid coil connected to each other.

The inductive coil 223b may have the form of a pipe through which a cooling medium flows therein. The inductive coil 223b may be provided as a copper pipe. The cross section of the inductive coil 223b may be a circular shape or a quadrangular shape.

The first capacitor 223a, the inductive coil 223b, and the second capacitor 223c are connected to each other in series and may resonate at a first frequency. The first frequency may be determined by capacitance C1 of each of the first capacitor 223a and the second capacitor 223c, and inductance L1 of the inductive coil 223b.

Figure 9:
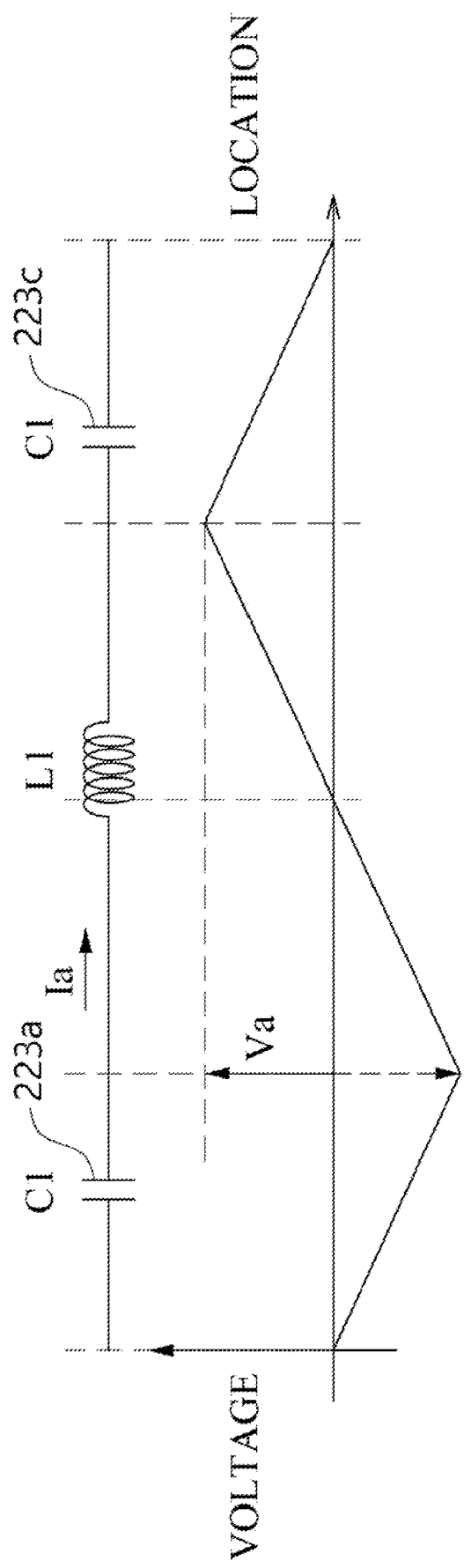
FIG. 9 is a diagram illustrating operation of an antenna module according to an embodiment of the present disclosure.

FIG. 9 is a diagram illustrating operation at a resonance frequency of the antenna module shown in FIG. 8.

Referring to FIG. 9, the antenna module may resonate at the first frequency determined by the capacitance C1 of each of the first capacitor 223a and the second capacitor 223c, and the inductance L1 of the inductive coil 223b. When power is supplied at the first frequency, the first capacitor 223a and the second capacitor 223c induce a voltage drop contrary to the inductive coil 223b so that the size of the voltage Va induced to the both ends of the inductive coil 223b is minimized.

In a resonance state, the first capacitor 223a and the second capacitor 223c may cancel the reactance of the inductive coil 223b. The plasma generating device supplies power to the antenna module at the first frequency such that the reactance of the inductive coil 223b is canceled by the first capacitor 223a and the second capacitor 223c, thereby performing impedance matching. The first capacitor 223a and the second capacitor 223c may be provided symmetrically with respect to the inductive coil 223b in order to reduce the voltage applied to the both ends of the inductive coil 223b.

2.2.3.2 Antenna Module of Second Type

Figure 10:
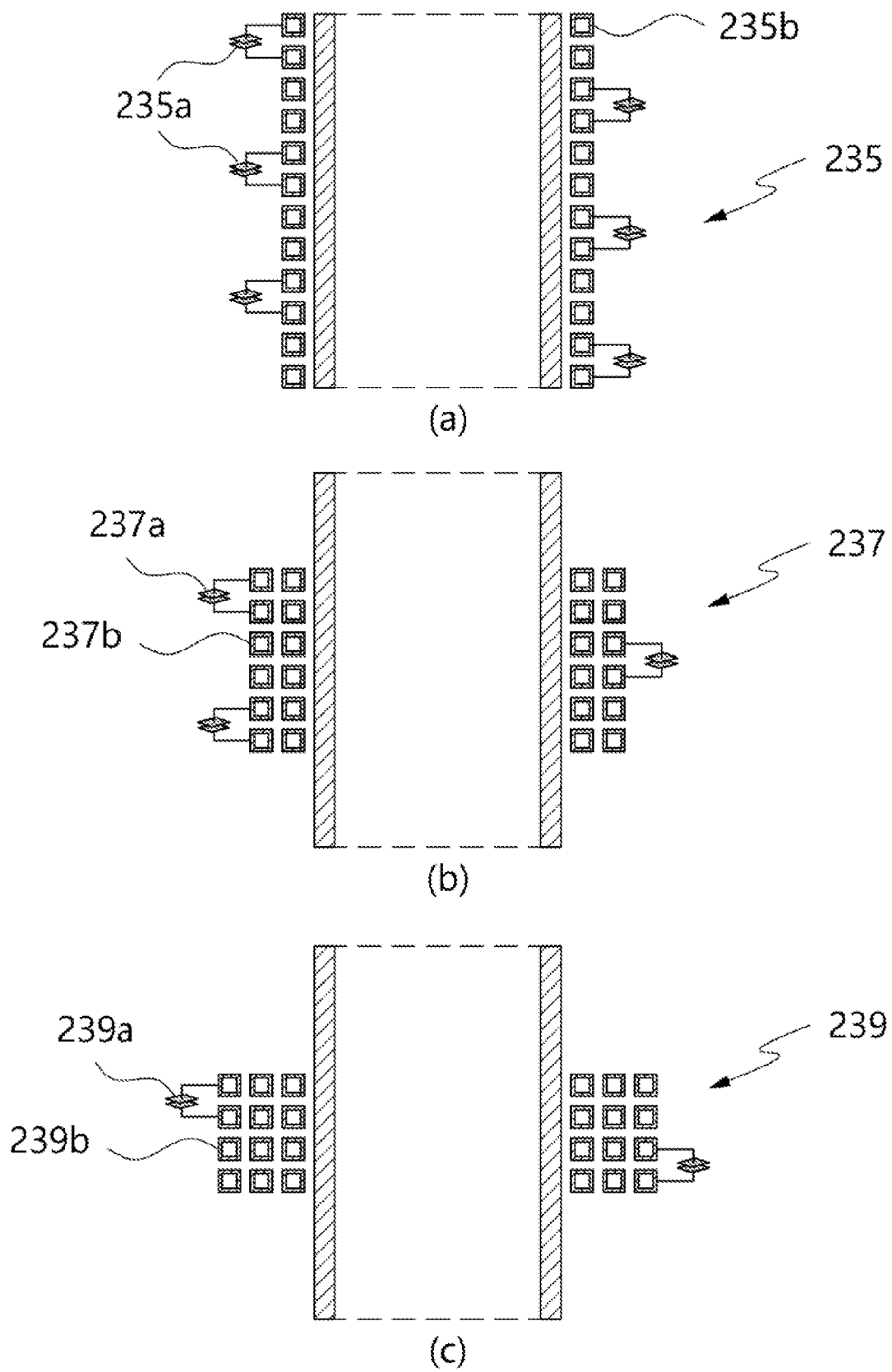
FIG. 10 is a diagram illustrating an antenna module according to an embodiment of the present disclosure.

FIG. 10 is a diagram illustrating forms of antenna modules according to several embodiments. (a), (b), and (c) of FIG. 10 are diagrams illustrating antenna modules having different numbers of turns of inductive coils per unit length of the dielectric tube. The antenna modules shown in (a), (b), and (c) of FIG. 10 may have different discharge characteristics.

The plasma generating device may have a characteristic wherein the smaller the number of turns of the inductive coil of the antenna module per unit length of the dielectric tube, the smaller the energy loss and the narrower the discharge window. The plasma generating device may have a characteristic wherein the greater the number of turns of the inductive coil of the antenna module per unit length of the dielectric tube, the wider the discharge window, the more advantageous in maintaining discharge, and the greater the energy loss.

Referring to (a) of FIG. 10, an antenna module 235 may include: unit coils 235b wound by one turn for each layer; and interlayer capacitors 235a connecting the unit coils of the respective layers. The 12*1-turn antenna module 235 shown in (a) of FIG. 10 may be configured such that all of the antenna unit turns are close to the outer surface of the dielectric tube. The antenna module 235 shown in (a) of FIG. 10 may have a small number of turns per unit length (N/L), and thus have relatively low discharge efficiency, low energy loss, and relatively high process performance.

Referring to (b) of FIG. 10, an antenna module 237 may include: unit coils 237b wound by two turns for each layer; and interlayer capacitors 237a connecting the unit coils of the respective layers. The 6*2-turn antenna module 237 shown in (b) of FIG. 10 may have a larger number of turns per unit length (N/L) than the antenna module 235 of (a) of FIG. 10. The antenna module 237 shown in (b) of FIG. 10 may have higher discharge efficiency than the antenna module 235 of (a) of FIG. 10. The discharge efficiency may be proportional to the number of turns per unit length (N/L). For example, the antenna module 237 shown in (b) of FIG. 10 may have twice the discharge efficiency of the antenna module 235 of (a) of FIG. 10.

Referring to (c) of FIG. 10, an antenna module 239 may include: unit coils 239b wound by three turns for each layer; and interlayer capacitors 239a connecting the unit coils of the respective layers. The antenna module 239 may have a larger number of turns per unit length (N/L) than the antenna modules 235 and 237 of (a) and (b) of FIG. 10, and may have higher discharge efficiency than the antenna modules 235 and 237 of (a) and (b) of FIG. 10. The antenna module 239 may have a characteristic wherein it is easy to maintain discharge in a gas condition in which discharge is difficult compared to the antenna modules 235 and 237 of (a) and (b) of FIG. 10.

The antenna modules shown in (a), (b), and (c) of FIG. 10 may have different inductances. The antenna module 235 of (a) may have first inductance, the antenna module 237 of (b) may have second inductance, and the antenna module 239 of (c) may have third inductance. The second inductance may be greater than the first inductance and the third inductance may be greater than the second inductance.

Figure 11:
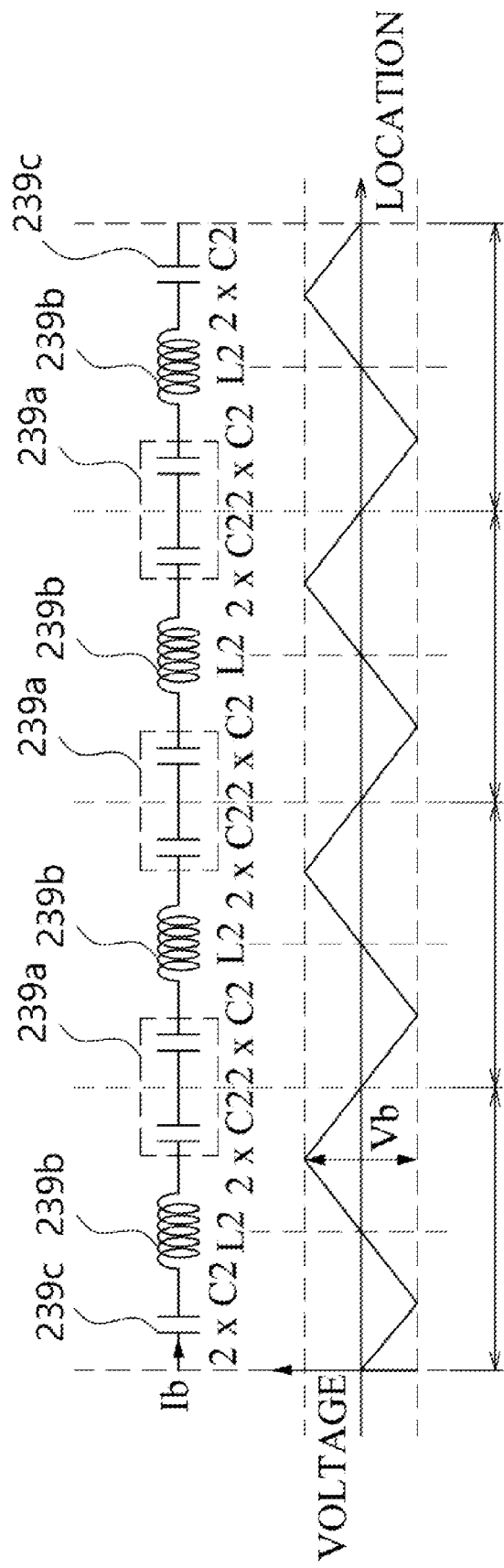
FIG. 11 is a diagram illustrating operation of an antenna module according to an embodiment of the present disclosure.

FIG. 11 is a diagram illustrating operation at a resonance frequency of the antenna module shown in (c) of FIG. 10. Hereinafter, with reference to FIG. 11, voltage distribution at the resonance frequency of the antenna module shown in (c) of FIG. 10 will be described.

Referring to FIG. 11, the antenna module according to an embodiment may include: multiple unit coils 239b; interlayer capacitors 239a provided between the multiple unit coils; and terminal capacitors 239c respectively connected to the unit coils respectively located at the upper stage and the lower stage, which are not shown.

The antenna module may resonate at a second frequency determined by capacitance of the interlayer capacitors 239a, inductance of the unit coils 239b, and capacitance of the terminal capacitors 239c.

In order to minimize the voltages applied to the unit coils 239b, the capacitance of the terminal capacitors 239c may be determined to be twice the capacitance of the interlayer capacitors 239a. Herein, the antenna module may resonate at the second frequency determined by capacitance C2 of the interlayer capacitors 239a, inductance L2 of the unit coils 239b, and capacitance 2*C2 of the terminal capacitors 239c. Referring to FIG. 11, it is shown that each of the interlayer capacitors 239a is serial connection of imaginary capacitors in a pair each having capacitance of 2*C2.

In a resonance state, multiple interlayer capacitors 239a and terminal capacitors 239c may reduce the voltages applied to the ends of the unit coils 239b. When power is supplied at the second frequency to the antenna module, the interlayer capacitors 239a and the terminal capacitors 239c induce a voltage drop contrary to the inductive coils 239b so that the size of the voltages Vb induced to the both ends of the inductive coils 239b is minimized.

The interlayer capacitors 239a and the terminal capacitors 239c may cancel the reactance of the inductive coils 239b. The plasma generating device supplies power to the antenna module at the second frequency such that the reactance of the inductive coils 239b is canceled by the interlayer capacitors 239a and the terminal capacitors 239c, thereby performing impedance matching. The terminal capacitors 239c may be provided symmetrically with respect to the inductive coils 239b in order to reduce the voltages applied to the both ends of the inductive coils 239b. The interlayer capacitor 239a may be provided between each of layers for the inductive coils 239b in order to prevent capacitive coupling by minimizing the interlayer voltage difference between the unit inductive coils 239b.

As the reactance of the inductive coils 239b is canceled by the interlayer capacitors 239a and/or the terminal capacitors 239c, the voltages at the respective unit coils 239b may have a corresponding relationship. For example, in a resonance state, the voltage between one end and another end of a unit coil 239b may correspond to the voltage between one end and another end of another unit coil 239b. The electric potential at one end of a unit coil 239b may correspond to the electric potential at one end of another unit coil 239b.

As a specific example, an antenna module may include: a first unit coil (or unit turn) having a first end and a second end; a first interlayer capacitor connected to the second end of the first unit coil in series; and a second unit coil having a first end and a second end, wherein the first end of the second unit coil is connected to the first interlayer capacitor in series. When the antenna module is in a resonance state, the electric potential at the first end of the first unit coil corresponds to the electric potential at the first end of the second unit coil. When the antenna module is in a resonance state, the voltage between the first end and the second end of the first unit coil corresponds to the electric potential between the first end and the second end of the second unit coil. When the antenna module is in a resonance state, the voltage between the first end and the second end of the first unit coil corresponds to the voltage between the first end of the first unit coil and the second end of the second unit coil.

Figure 12:
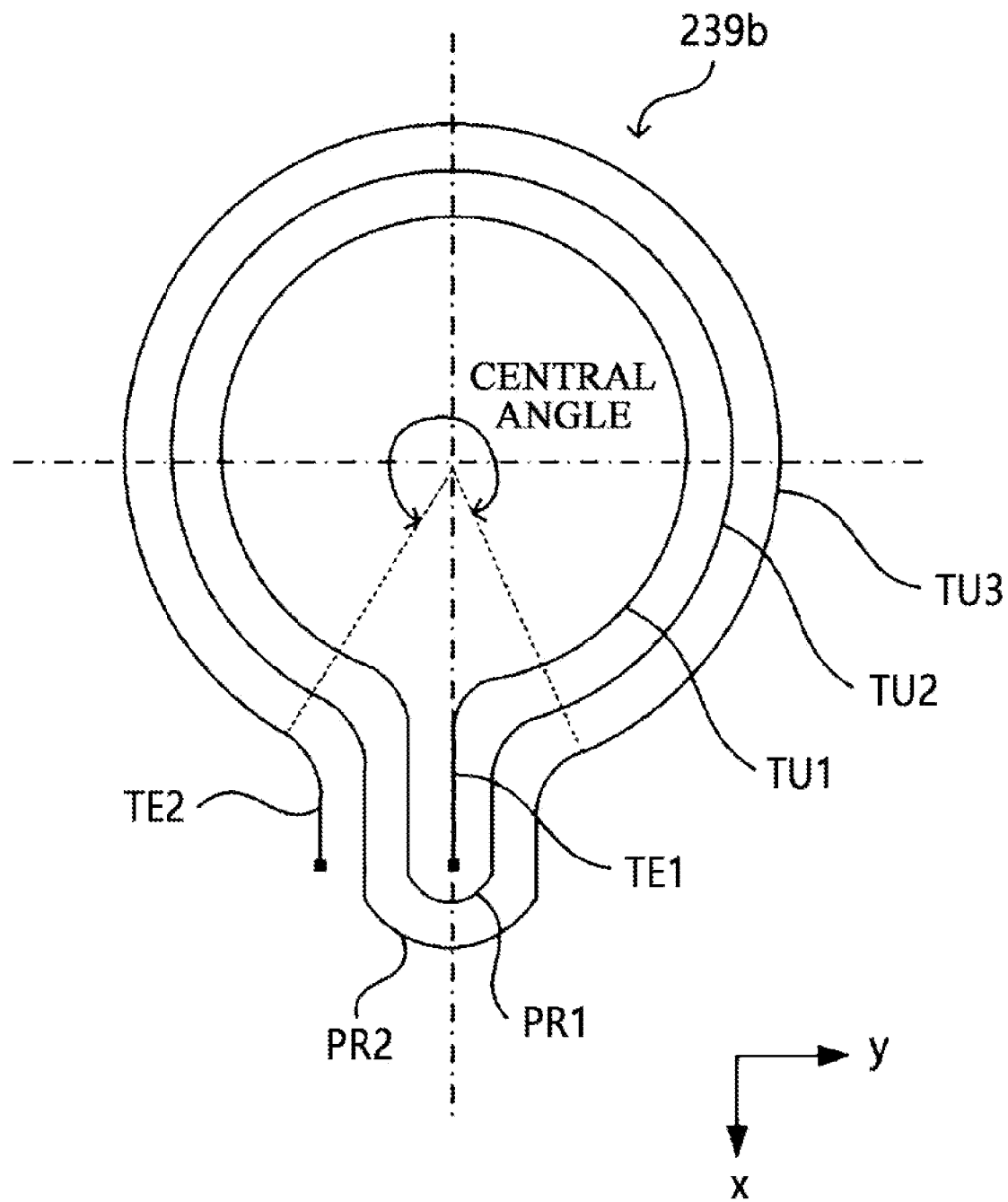
FIG. 12 is a diagram illustrating a shape of an antenna module according to an embodiment of the present disclosure.

FIG. 12 is a diagram illustrating the structure of the antenna module shown in (c) of FIG. 10. The antenna module according to an embodiment may include multiple unit coils 239b and interlayer capacitors 239c provided between the multiple unit coils. FIG. 12 shows a unit coil 239b of an antenna module according to an embodiment.

The unit coil 239b may include multiple turns TU1, TU2, and TU3. The unit coil 239b may include: a first terminal TE1; a first turn TU1 connected to the first terminal TE1; a first protrusion PR1 connected to the first turn TU1; a second turn TU2 connected to the first protrusion PR1; a second protrusion PR2 connected to the second turn TU2; a third turn TU3 connected to the second protrusion PR2; and a second terminal TE2 connected to the third turn TU3.

The unit coil 239b may have an opened part opened in one direction (the x-axis direction, see FIG. 12). The first terminal TE1 and the second terminal TE2 of the unit coil 239b may define the opened part opened in one direction.

The turns TU1, TU2, and TU3 may be provided on the same plane. Each of the turns TU1, TU2, and TU3 may have a predetermined central angle. The central angle of each turn may be equal to or greater than 270 degrees. The turns TU1, TU2, and TU3 may be provided to have the same central axis and may have different radii.

Each of the protrusions PR1 and PR2 connects the turns having different radii and may be provided in the shape of letter "U". The first protrusion PR1 may connect one end of the first turn TU1 to one end of the second turn TU2.

The first terminal TE1 or the second terminal TE2 may be connected to the interlayer capacitor 239c or the terminal capacitor 239a. For example, the first terminal TE1 may be connected to the terminal capacitor 239a and the second terminal TE2 may be connected to the interlayer capacitor 239c.

In the meantime, the antenna module may include multiple unit coils 239b. The multiple unit coils may be provided around the central axis of the dielectric tube. For example, a first unit coil may be provided such that a protrusion PR protrudes in a first direction with respect to the central axis of the dielectric tube. A second unit coil may be provided such that a protrusion PR protrudes in a second direction with respect to the central axis of the dielectric tube. The first direction and the second direction may form a predetermined angle with respect to the central axis of the dielectric tube. For example, the predetermined angle may be 90 degrees.

Figure 13:
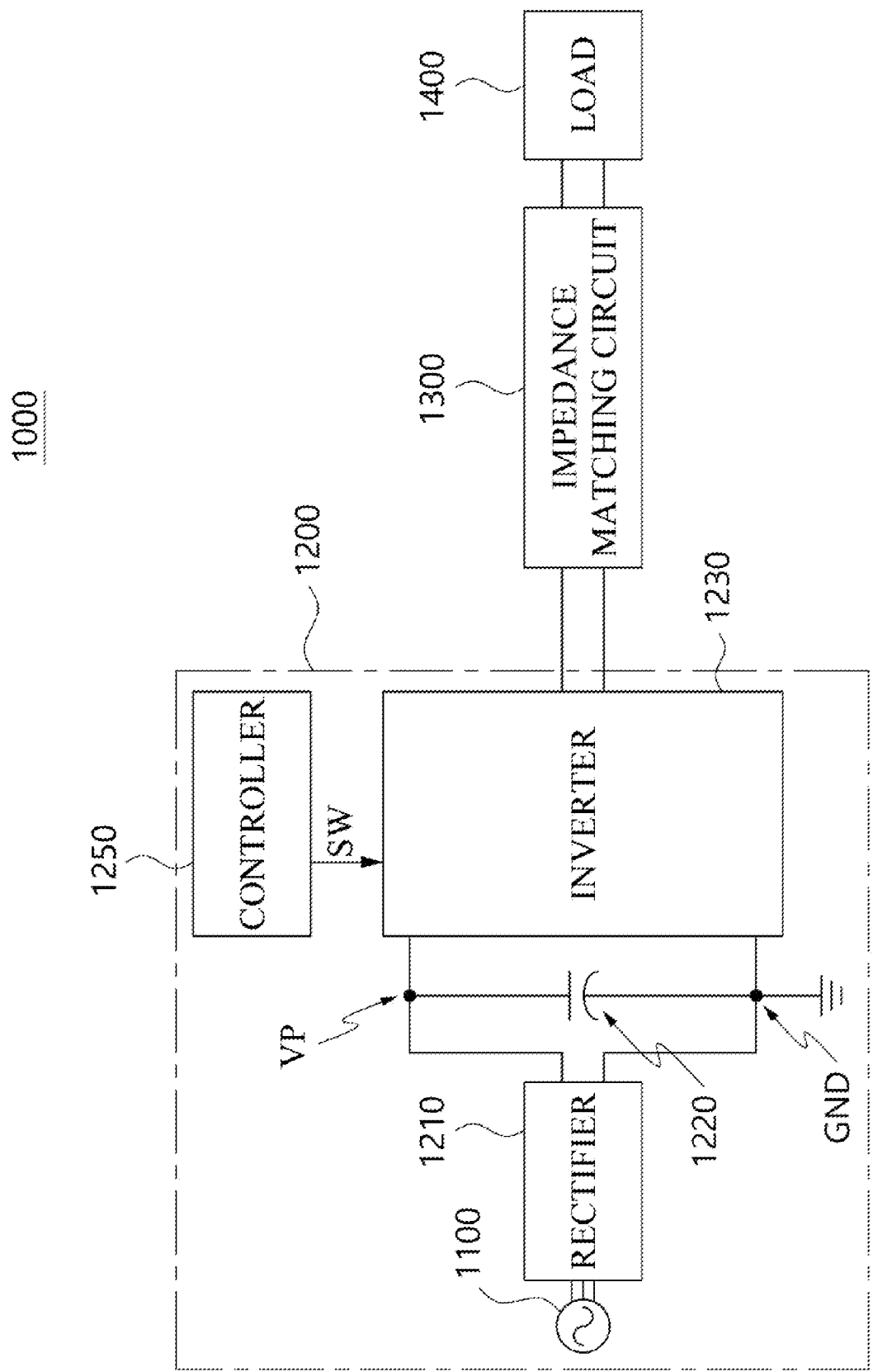
FIG. 13 is a diagram illustrating an RF power source according to an embodiment of the present disclosure.

FIG. 13 is a block diagram illustrating an RF power source according to an embodiment. Referring to FIG. 13, an RF power supply 100 according to an embodiment may include an AC power source 1100, a power supply device 1200, and a load 1400.

The AC power source 1100 may be a typical power source of 60 Hz used at home or at industrial sites. The load 1400 may be an electric or electronic device used at home or at industrial sites. The load 1400 may be a plasma generating device described in the present disclosure.

The power supply device 1200 may convert first AC power into second AC power and may supply the second AC power to the load 1400. For example, the second AC power may have a driving frequency of several hundreds of kHz to several tens of MHz and may provide power of several kW or greater. The power supply device 1200 may include a rectifier 1210, a capacitor 1220, an inverter 1230, an impedance matching circuit 1300, and a controller 1250.

The rectifier 1210 may convert the output of the AC power source 1100 into DC power. The rectifier 1210 may supply the DC power between a ground node GND and a power node VP. The capacitor 1220 may be connected between the power node VP and the ground node GND. The capacitor 1220 may discharge the AC component transmitted to the power node VP to the ground node GND.

The inverter 1230 may receive the DC power from the power node VP and the ground node GND. The inverter 1230 may receive a switching signal SW from the controller 1250. The inverter 1230 may convert the DC power into the second AC power in response to the switching signal SW. The second AC power may be supplied to the load 1400 through the impedance matching circuit 1300. The impedance matching circuit 1300 may provide impedance matching for impedance of the load 1400.

The controller 1250 may transmit a switching signal SW to the inverter 1230. The controller 1250 may control the switching signal SW such that the inverter 1230 converts the DC power into the second AC power. The controller 1250 may control the switching signal SW such that the amount of power supplied from the inverter 1230 to the load 1400 is adjusted.

3. Operation and Control Method of Plasma Generating Device

According to an embodiment of the present disclosure, there is provided a plasma generating device having multiple discharge modes and for performing plasma discharge of different characteristics in the respective modes.

For example, the plasma generating device may have: a first discharge mode with low energy loss; and a second discharge mode for discharging gas that is more difficult to discharge. In addition, for example, the plasma generating device may have: a first discharge mode advantageous for initial discharge of plasma; and a second discharge mode advantageous for main discharge with high energy efficiency.

As needed, the plasma generating device may change a plasma discharge mode by switching one or more antennas having different characteristics. The switching of the antennas may be interpreted in a broader sense than physical switching of circuits. For example, the plasma generating device may selectively apply the frequency of power transmitted to multiple antenna modules and may change the mainly operating antenna module, thereby switching the antennas. Alternatively, as needed, the plasma generating device changes the discharge characteristics of the antenna modules through different power modules or providing power at different driving frequencies, thereby switching the antennas.

According to the present disclosure, there is provided a plasma generating device capable of operating in more diverse environments and having a wider operation window. According to the present disclosure, there is provided a plasma generating device capable of performing plasma discharge even when the impedance measured at an antenna changes under various discharge conditions (gas type, flow rate, pressure, and RF power). According to the present disclosure, in a case of a plasma generating device including a single antenna module or a single power module, a predetermined matching range or a discharge range limited by the characteristics of components other than an antenna may be extended.

3.1 Case of One Antenna 3.1.1 Plasma Generation Process in Case of One Antenna

Figure 14:
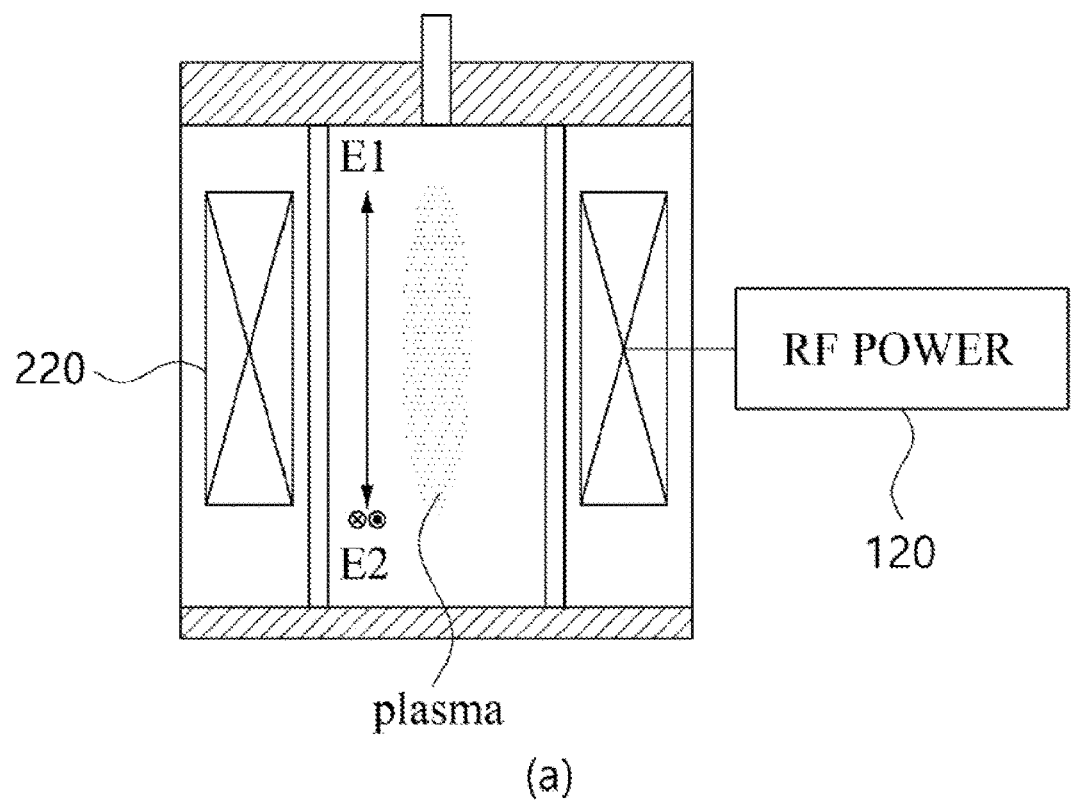
FIG. 14 is a diagram illustrating a plasma generation process according to an embodiment of the present disclosure.
Figure 14:
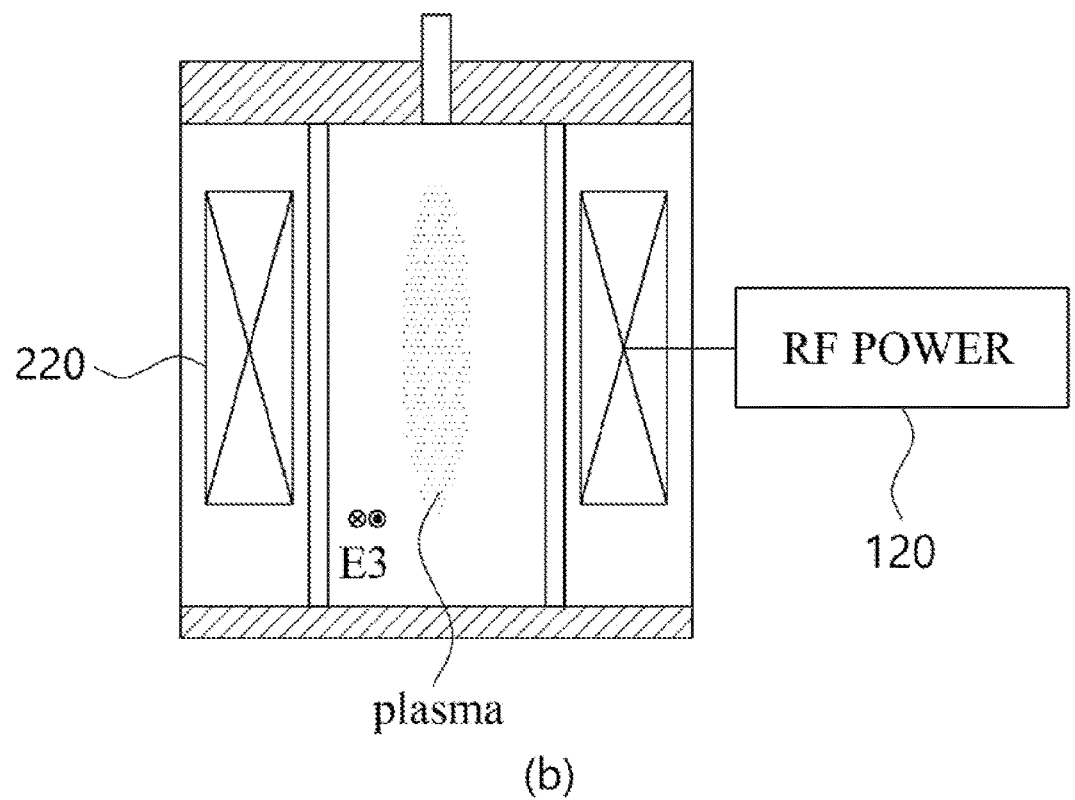

FIG. 14 is a diagram illustrating a plasma discharge process in a case in which a plasma generating device includes one antenna module 220 and an RF power supply 120. The RF power supply 120 may include one or more power modules. The RF power supply 120 may include one or more power modules having different output frequency bands.

Hereinafter, with reference to FIG. 14, a mode change plasma discharge process in a case of one antenna module will be described.

Referring to FIG. 14, in a case in which the plasma generating device includes one antenna module 220 and one frequency-variable RF power supply 120, the frequency-variable power supply 120 is used to change the frequency of the power signal provided to the antenna module 220, thereby changing a discharge mode.

Referring to (a) of FIG. 14, when an operation mode is a first mode, the plasma generating device transmits a power signal having a first frequency f1 to the antenna module 220 through the power supply 120 and induces plasma discharge inside a dielectric tube.

When the operation mode is the first mode, the plasma generating device forms a first electric field inside the dielectric tube. The first electric field may be an electric field in a vertical direction parallel to an axis direction of the dielectric tube or may be an electric field in an azimuthal direction parallel to a circumferential direction of the dielectric tube.

According to an embodiment, when the operation mode is the first mode, the plasma generating device transmits the power signal having the first frequency f1 to the antenna module 220 and forms an electric field E1 in a vertical direction. The plasma generating device may form the electric field E1 in the vertical direction through the antenna module 220 and may induce generation of capacitively coupled plasma inside the dielectric tube.

According to an embodiment, when the operation mode is the first mode, the plasma generating device induces generation of capacitively coupled plasma inside the dielectric tube. When the operation mode is the first mode, the plasma discharge induced inside the dielectric tube of the plasma generating device is mainly capacitively coupled plasma discharge or discharge caused by a capacitively coupled mode (E-mode).

According to an embodiment, when the operation mode is the first mode, the plasma generating device transmits the power signal having the first frequency f1 to the antenna module 220 and forms an electric field E2 in an azimuthal direction. The plasma generating device may form the electric field E2 in the azimuthal direction through the antenna module 220 and may induce generation of inductively coupled plasma inside the dielectric tube. When the operation mode is the first mode, the plasma generating device forms the electric field E2 in the azimuthal direction having a first intensity.

According to an embodiment, when the operation mode is the first mode, the plasma generating device induces generation of inductively coupled plasma inside the dielectric tube. When the operation mode is the first mode, the plasma discharge induced inside the dielectric tube of the plasma generating device is mainly inductively coupled plasma discharge or discharge caused by an inductively coupled mode (H-mode).

Referring to (b) of FIG. 14, when the operation mode is a second mode, the plasma generating device transmits a power signal having a second frequency f2 to the antenna module 220 through the power supply 120 and induces plasma discharge inside the dielectric tube. The second frequency f2 and the first frequency f1 may differ. The second frequency f2 may be different from the first frequency f1 by a particular value or more. The second frequency f2 may be higher or lower than the first frequency f1 by a particular value or more (for example, 0.2 MHz).

When the operation mode is the second mode, the plasma generating device transmits the power signal of the second frequency f2 to the antenna module 220 and induces an electric field E3 in an azimuthal direction. The plasma generating device may form the electric field E3 in the azimuthal direction through the antenna module 220 and may induce generation of inductively coupled plasma discharge inside the dielectric tube. When the operation mode is the second mode, the plasma generating device forms the electric field E3 in the azimuthal direction having a second intensity. The second intensity may be higher or lower than the intensity of the electric field E2 in the azimuthal direction in the first mode.

When the operation mode is the second mode, the plasma generating device induces inductively coupled plasma discharge inside the dielectric tube. When the operation mode is the second mode, the plasma discharge induced inside the dielectric tube of the plasma generating device is mainly inductively coupled plasma discharge or discharge caused by the inductively coupled mode (H-mode).

Figure 15:
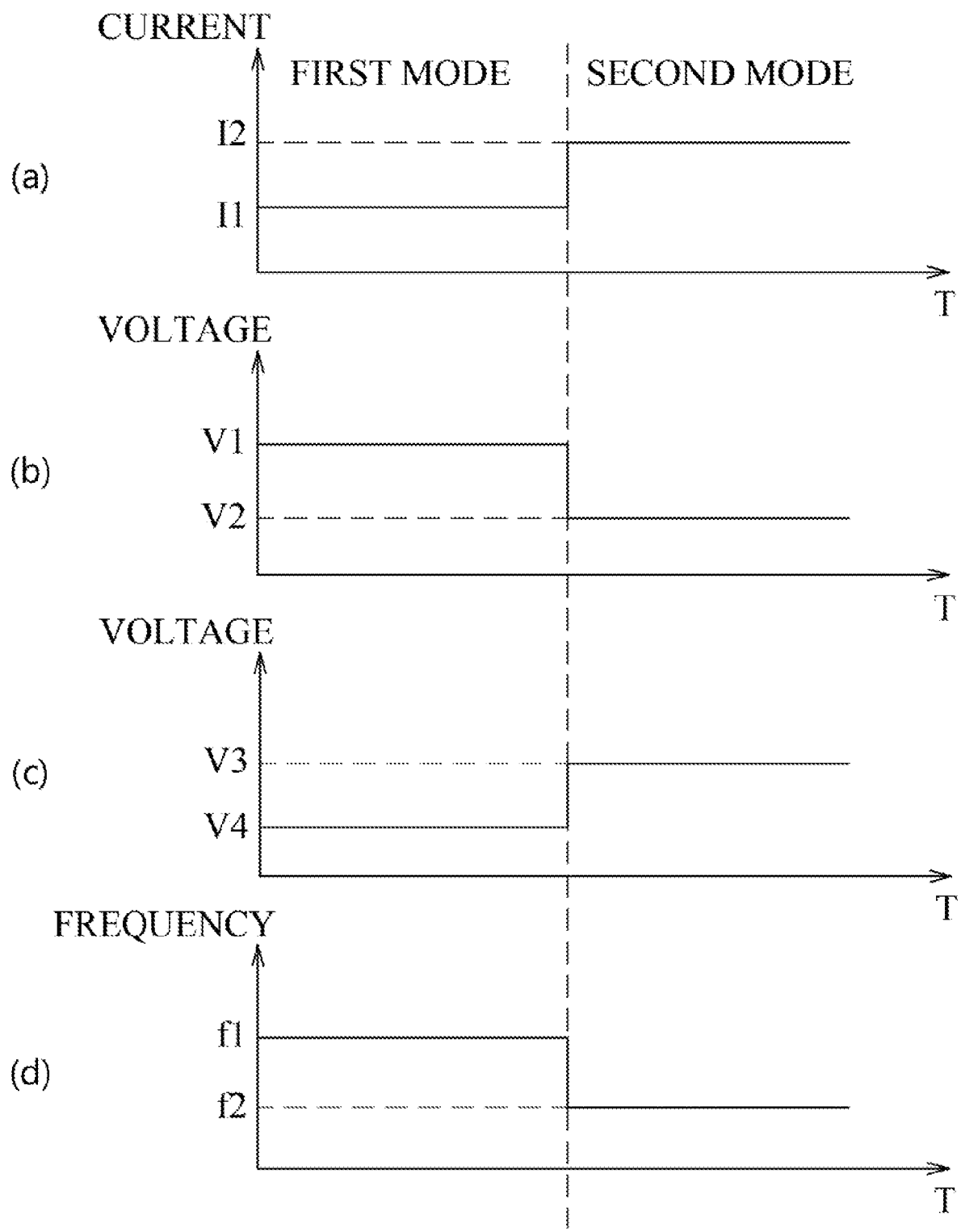
FIG. 15 is a diagram illustrating a plasma generation process according to an embodiment of the present disclosure.

FIG. 15 is a diagram illustrating changing of a plasma discharge mode regarding to the current flowing through an antenna module, the voltage at both ends of an antenna module, the voltage at both ends of a unit coil, and a frequency of a power signal, respectively. In FIG. 15, the current and voltage graphs show sizes.

Hereinafter, regarding FIG. 15, description is given for the case in which the antenna module 220 includes unit coils constituting a unit layer and interlayer capacitors provided between the unit coils as shown in FIG. 10.

Referring to FIG. 15, when the plasma generating device operates in the first mode, the power supply 120 provides the power signal having the first frequency f1 to the antenna module 220 and a first current I1 flows through the antenna module.

When the operation mode of the plasma generating device is the first mode, the voltage at both ends of an inductive coil included in the antenna module is a first voltage V1. When the operation mode is the first mode, the voltage at both ends of unit coils (coils constituting a unit layer) constituting an inductive coil included in the antenna module is a third voltage V3.

Referring to FIG. 15, when the plasma generating device operates in the second mode, the power supply 120 provides the power signal having the second frequency f2 to the antenna module 220 and a second current I2 flows through the antenna module.

When the operation mode of the plasma generating device is the second mode, the voltage at both ends of an inductive coil is a second voltage V2. When the operation mode is the second mode, the voltage at opposites ends of unit coils constituting an inductive coil included in the antenna module is a fourth voltage V4.

The second frequency f2 may be lower than the first frequency f1. When the second frequency f2 is lower than the first frequency f1, the second current I2 is greater than the first current I1. When the second frequency f2 is lower than the first frequency f1, the second voltage V2 is lower than the first voltage V1. When the second frequency f2 is lower than the first frequency f1, the third voltage V3 is higher than the fourth voltage V4.

When the operation mode is the second mode, the voltage V2 at both ends of a coil of the antenna module 220 is lower than the voltage V1 at both ends of a coil of the antenna module in the first mode. When the operation mode is the second mode, the antenna module has discharge characteristics having higher energy efficiency than that in the first mode.

The second frequency may be a resonance frequency of the antenna module 220. When the operation mode is changed to the second mode, the antenna module 220 resonates at the second frequency with impedance matched.

In the meantime, according to an embodiment, a plasma discharge state may change over time. The operation mode of the plasma generating device may be changed according to the change in the plasma discharge state. For example, in the case in which the plasma generating device has the first discharge mode advantageous for initial discharge of plasma and the second discharge mode advantageous for main discharge with high energy efficiency, the operation mode of the plasma generating device may be changed according to the change in the plasma discharge state.

For example, plasma discharge according to the first mode may be mainly performed by the capacitively coupled mode. Afterward, as plasma is sufficiently generated by the capacitively coupled mode, a second electric field E2 that is an induced electric field in an azimuthal direction is formed inside the dielectric tube. When the second electric field E2 is formed, inductively coupled plasma discharge or generation of plasma by the inductively coupled mode (H-mode) is performed.

The plasma generating device may change the operation mode in response to the change in the plasma discharge state. Referring to (a) of FIG. 14, the plasma generating device may transmit the power signal having the first frequency f1 to the antenna module 220 through the power supply 120 and may change the operation mode in response to the transition of the plasma discharge state.

The plasma generating device may detect the change in the plasma discharge.

The plasma generating device may include a sensor device that acquires the current flowing through the antenna module 220 and/or the voltage applied to the both ends of the antenna module 220. The plasma generating device may acquire the current flowing through the antenna module 220 and/or the voltage applied to both ends of a coil of the antenna module 220, may acquire the change in the plasma discharge state, and may change the driving frequency of the power supply 120 and/or the operation mode.

The plasma generating device may include a sensor device that acquires a change in a voltage or a current signal from the RF power supply described with reference to FIG. 13. For example, the plasma generating device may include a sensor device that acquires the voltage (voltage between the VP and the GND) applied to the both ends of the capacitor 1220 of the power supply device 1200 of FIG. 13 and/or the current flowing to the inverter (the current flowing from the VP to the inverter). The plasma generating device may acquire the change in the discharge state based on the change in the voltage or the current signal acquired form the above-described RF power supply.

When the plasma discharge state is changed, the current flowing through the antenna module 220 and/or the voltage applied to the both ends of the antenna module 220 is changed. For example, when a main plasma discharge state is changed from capacitively coupled plasma discharge to inductively coupled plasma discharge, the current flowing through the antenna module 220 and/or the voltage applied to the both ends of the antenna module 220 is reduced.

In response to the reduction of the current flowing through the antenna module 220 and/or the voltage applied to the both ends of the antenna module 220, the plasma generating device may change the operation mode to the second mode.

According to an embodiment, the plasma discharge state caused by the plasma generating device may have a capacitively coupled mode, a transition mode, and an inductively coupled mode. When the plasma generating device operates in the first mode, the plasma discharge state is transitioned from the capacitively coupled mode to the transition mode. When the plasma discharge state is transitioned to the transition mode, the operation mode of the plasma generating device is changed from the first mode to the second mode. When the operation mode is changed to the second mode, the plasma discharge state is transitioned from the transition mode to the inductively coupled mode.

Alternatively, the plasma discharge state may have a first inductively coupled mode and a second inductively coupled mode. As the operation mode of the plasma generating device is changed from the first mode to the second mode, the plasma discharge state is changed from a first inductively coupled plasma discharge to a second inductively coupled plasma discharge.

Figure 16:
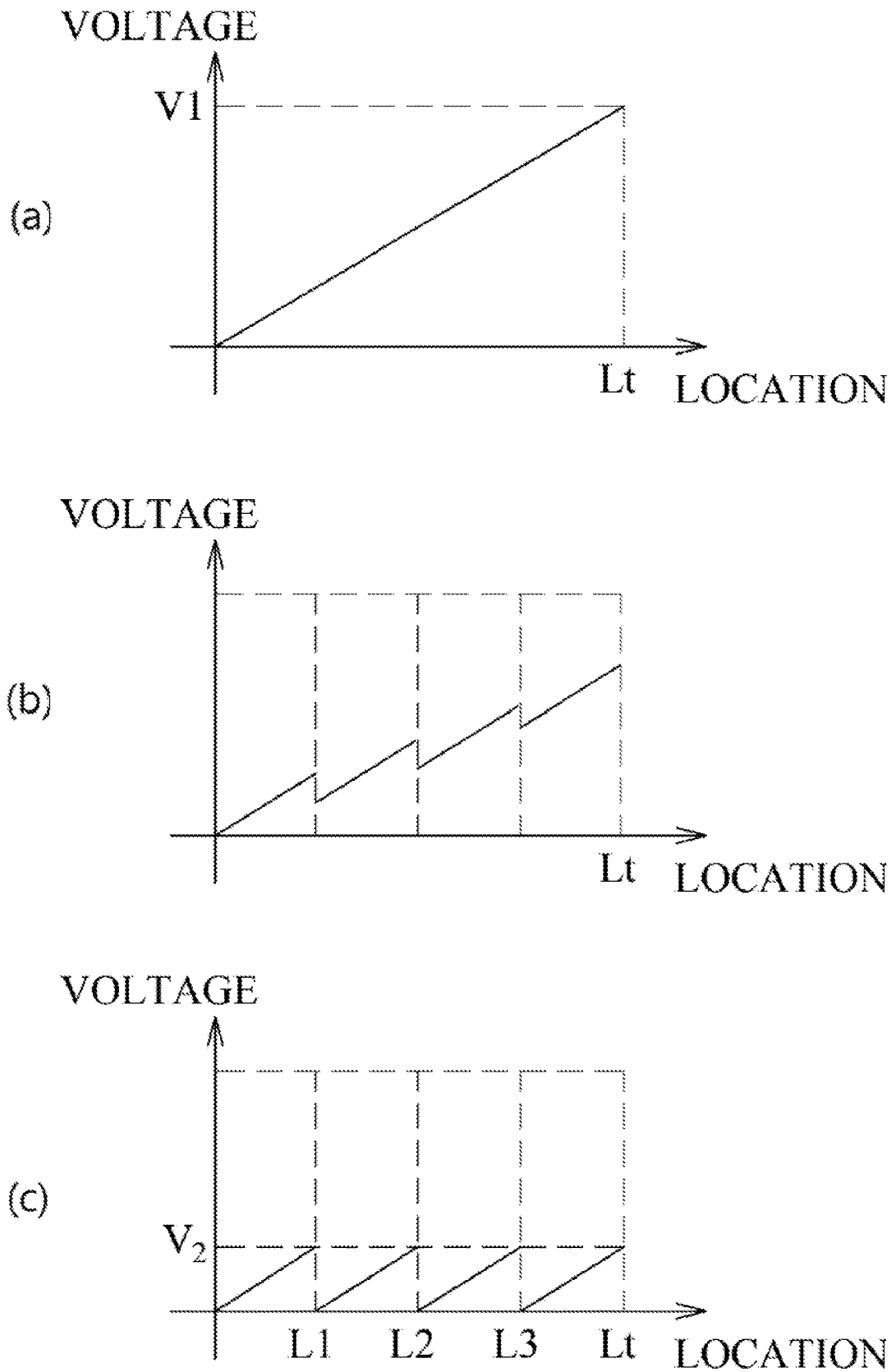
FIG. 16 is a diagram illustrating a plasma generation process according to an embodiment of the present disclosure.

FIG. 16 is a diagram illustrating voltage change depending on change in an operation mode in a plasma generating device according to an embodiment. FIG. 16 is a diagram illustrating voltage distribution depending on a location in a coil of an antenna module in a plasma generating device according to an embodiment. Hereinafter, with reference to FIGS. 14 to 16, the change in the voltage at the both ends of the antenna module and the change in the voltage at the both ends of a unit coil according to the change in the operation mode will be described.

The voltage distribution shown in FIG. 16 is described for the case, like the antenna module shown in (c) of FIG. 10, in which an antenna module includes four unit inductive coils provided different planes and interlayer capacitors provided between the inductive coils.

(a) of FIG. 16 is a diagram illustrating voltage distribution depending on a location in the antenna module according to an embodiment when the plasma generating device according to an embodiment is in the first mode. When the operation mode is the first mode, the plasma generating device uses the first frequency as a driving frequency.

Referring to (a) of FIG. 16, when the operation mode of the plasma generating device according to an embodiment is the first mode, the voltage between both ends of the antenna module having a total length of Lt is the first voltage V1. When the operation mode is the first mode, inductive coil reactance cancellation by the interlayer capacitors between the unit coils is minimized. When the operation mode is the first mode, the plasma generating device operates at the driving frequency of the first frequency so that reactance cancellation is minimized, the voltage at both ends of inductive coils is maximized, and capacitively coupled plasma discharge is induced. Preferably, the voltage at both ends of each of the unit coils constituting the antenna module having a total length of Lt may be a value acquired by dividing the voltage at the both ends of the antenna module by the number of unit coils.

However, the influence of reactance of the interlayer capacitors may not be completely eliminated. In other words, FIG. 16 show for convenience that voltage rise (or drop) occurs continuously in inductive coils, but at least a part of inductive coil reactance may be cancelled by the interlayer capacitors between the unit coils. That is, voltage distribution in the first mode may appear similar to that of (b) of FIG. 16.

(b) of FIG. 16 is a diagram illustrating voltage distribution depending on a location in the antenna module when the plasma generating device according to an embodiment is driven at frequency between the first frequency and the second frequency.

Referring to (b) of FIG. 16, when the plasma generating device is in a transient state between the first mode and the second mode or when the plasma generating device has a driving frequency between the first frequency and the second frequency, the voltage between both ends of the antenna module having a total length of Lt is lower than the first voltage V1. In the transient state, at least a part of inductive coil reactance may be cancelled by the interlayer capacitors between the unit coils, and the voltage at the both ends may be lower than the first voltage V1.

When the operation mode is the first mode, inductive coil reactance cancellation by the interlayer capacitors between the unit coils is minimized. When the operation mode is the first mode, the plasma generating device operates at the driving frequency of the first frequency so that reactance cancellation is minimized, the voltage at both ends of inductive coils is maximized, and capacitively coupled plasma discharge is induced.

(c) of FIG. 16 is a diagram illustrating voltage distribution depending on locations in inductive coils when the plasma generating device according to an embodiment is in the second mode. When the operation mode is the second mode, the driving frequency is the second frequency and the antenna module is in a resonance state at the second frequency with impedance matched. According to an embodiment, the plasma generating device may change the operation mode to the second mode in response to the change in the plasma discharge state to the transition mode.

Referring to (c) of FIG. 16, when the operation mode of the plasma generating device according to an embodiment is the second mode, the voltage between both ends of the antenna module, having a total length of Lt, is the second voltage V2. The second voltage V2 may be lower than the first voltage V1.

When the operation mode of the plasma generating device is the second mode, the interlayer capacitors of the antenna module cancels voltage rise (or drop) at the both ends of the antenna module. When the operation mode is the second mode, the voltage at both ends of the inductive coils is minimized. When the operation mode is the second mode, the interlayer capacitors and the terminal capacitors constituting the antenna module cancel reactance of the inductive coils. When the operation mode is the second mode, the plasma generating device operates at the driving frequency of the second frequency so that the voltage at both ends of the inductive coils is maximized and inductively coupled plasma discharge is induced.

Referring to (c) of FIG. 16, when the operation mode of the plasma generating device according to an embodiment is the second mode, the voltage between both ends of the antenna module, having a total length of Lt, is the second voltage V2. Preferably, the voltage at both ends of the unit coils constituting the antenna module may be the second voltage V2 the same as the voltage at both ends of the antenna module. However, it may be difficult to reach a complete resonance state because of the characteristics of the plasma generating device and the limitations of power frequency resolution. In this case, voltage distribution in the second mode may show an ascending (or descending) saw-tooth shape because at least a part of reactance of the inductive coils is not canceled.

In the meantime, in the above embodiments, description has been given for the case in which the operation mode is changed from the first mode to the second mode in response to transition of plasma, but the change in the operation mode may be performed in the reverse order. The plasma generating device may change the operation mode from the second mode described with reference to (b) of FIG. 14 to the first mode described with reference to (a) of FIG. 14.

3.1.2 One Antenna and Two Inverters

A plasma generating device according to an embodiment may include one antenna module and one or more RF power modules. The plasma generating device described below may operate similarly to the above-described embodiment unless otherwise specifically described.

The RF power modules may be AC power sources having predetermined output frequency ranges and matching ranges. Different RF power modules may have different output frequency ranges and matching ranges.

Figure 17:
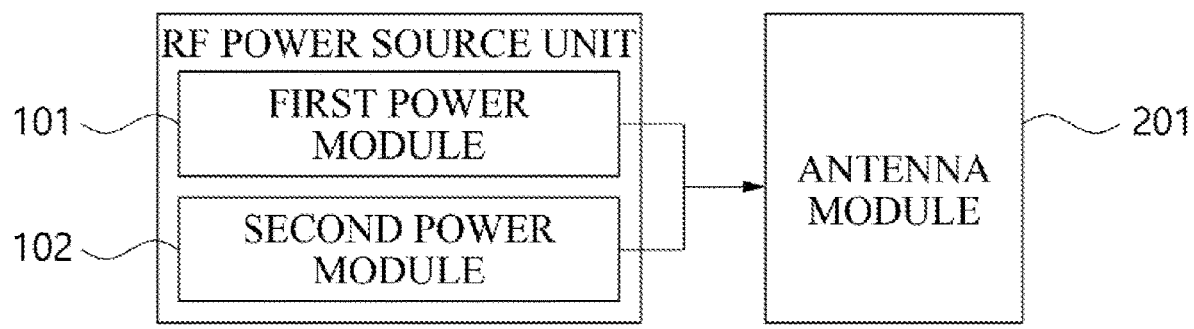
FIG. 17 is a diagram illustrating a plasma generating device according to an embodiment of the present disclosure.
Figure 17:
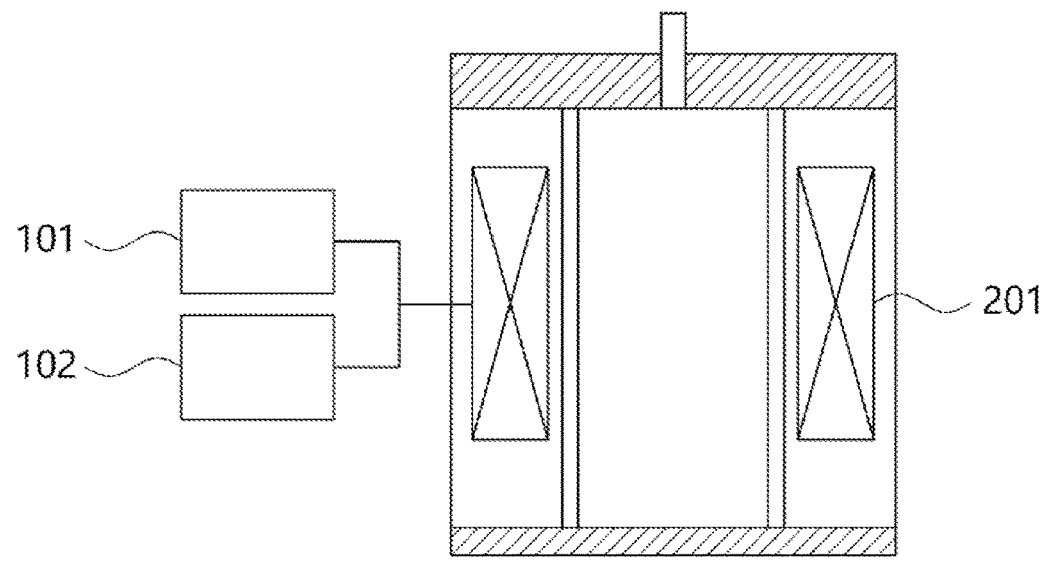

FIG. 17 is a diagram illustrating a plasma generating device according to an embodiment. Referring to (a) and (b) of FIG. 17, a plasma generating device according to an embodiment may include a first power module 101, a second power module 102, and an antenna module 201.

The first power module 101 may have a first driving frequency range. The second power module 102 may have a second driving frequency range that is at least partially different from the first driving frequency range. The first power module 101 may be driven at a first frequency within the first driving frequency range. The second power module 102 may be driven at a second frequency within the second driving frequency range.

According to an embodiment, the first power module 101 may include a first matching element. The second power module 102 may include a second matching element having impedance different from that of the first matching element. Each matching element may increase power transfer efficiency for the antenna module of each power module. In addition, each matching element may serve as a filter in a frequency band rather than a resonance frequency.

Figure 18:
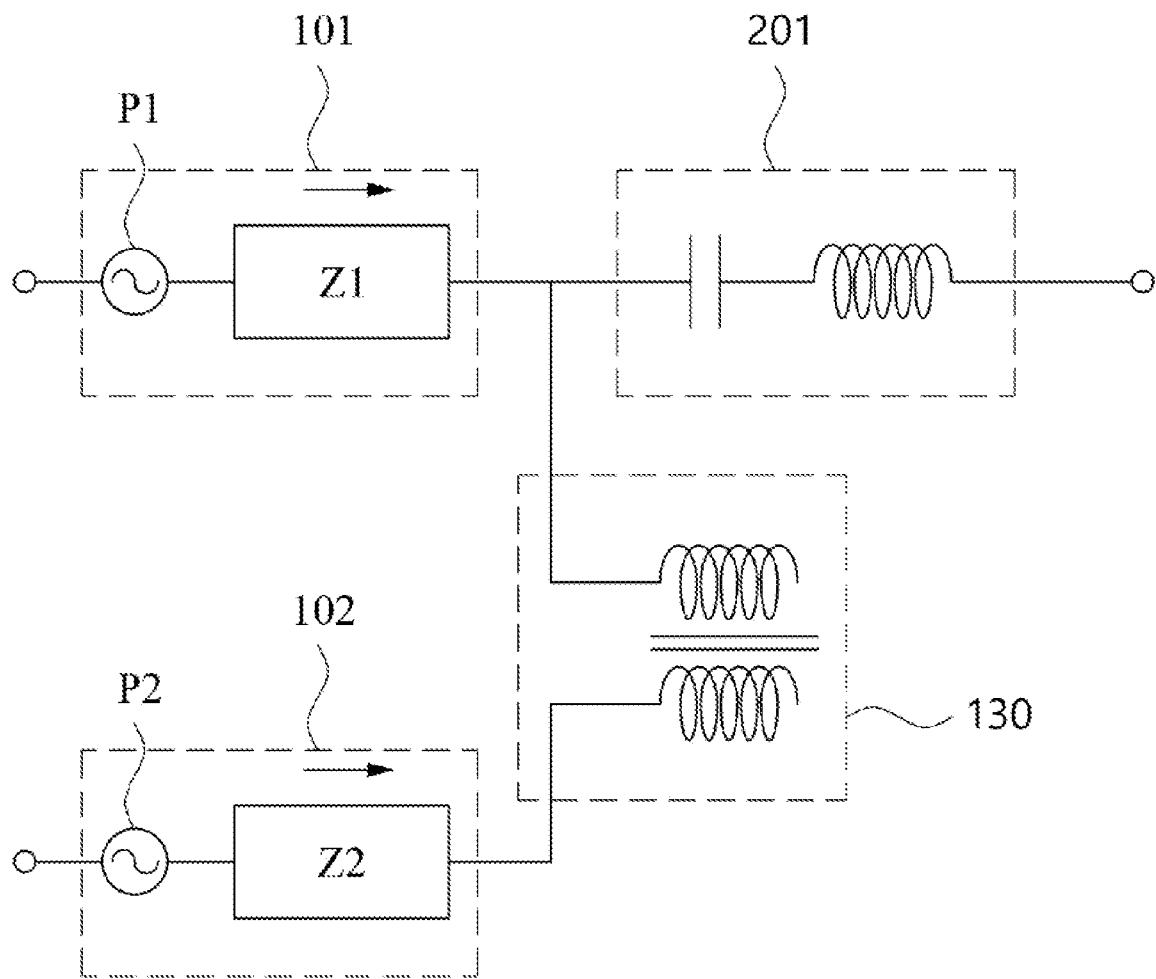
FIG. 18 is a diagram illustrating a plasma generating device according to an embodiment of the present disclosure.

FIG. 18 is a diagram illustrating a plasma generating device according to an embodiment. Referring to FIG. 18, a plasma generating device according to an embodiment may include: a first power module 101 including a first power source unit P1 and a first matching element Z1; a second power module 102 including a second power source unit P2 and a second matching element Z2; and an antenna module 201.

The first power module 101 may include the first matching element, and the first matching element and the antenna module 201 may resonate at a first frequency in a first driving frequency range. The first matching element and the antenna module 201 may resonate at the first frequency determined by the impedance of the first matching element and the impedance of the antenna module 201.

The second power module 102 may include the second matching element, and the second matching element and the antenna module 201 may resonate at the first frequency in the first driving frequency range. The second matching element and the antenna module 201 may resonate at the second frequency determined by the impedance of the second matching element and the impedance of the antenna module 201.

Referring to FIG. 18, the plasma generating device may further include an isolation element 130. The isolation element 130 blocks signal transmission and reception between the circuit on the side of the second power module 102 and the circuit on the side of the first power module 101 when the first power module 101 operates. Examples of the isolation element 130 may include a transformer. Examples of the isolation element 130 may include isolation transformers such as a shield transformer, an insulating transformer, and a noise cut transformer. Examples of the isolation element 130 may include a switch.

In the meantime, according to another embodiment, an antenna module 201 or a plasma generating device including an antenna module 201 may include a first matching element and a second matching element. The first matching element may be connected between a first power module 101 and the antenna module 201, and the second matching element may be connected between a second power module 102 and the antenna module 201. That is, the above embodiments have been described for the case in which a matching element is included in a power module, but a plasma generation system may be configured such that a plasma generating device or an antenna module includes one or more matching elements and each matching element is connected to the antenna module and the power module.

A control method of a plasma generating device according to an embodiment may comprise: controlling the plasma generating device in the first mode through the first power module; and controlling the plasma generating device in the second mode through the second power module. The above description may be applied to the first mode and the second mode.

Figure 19:
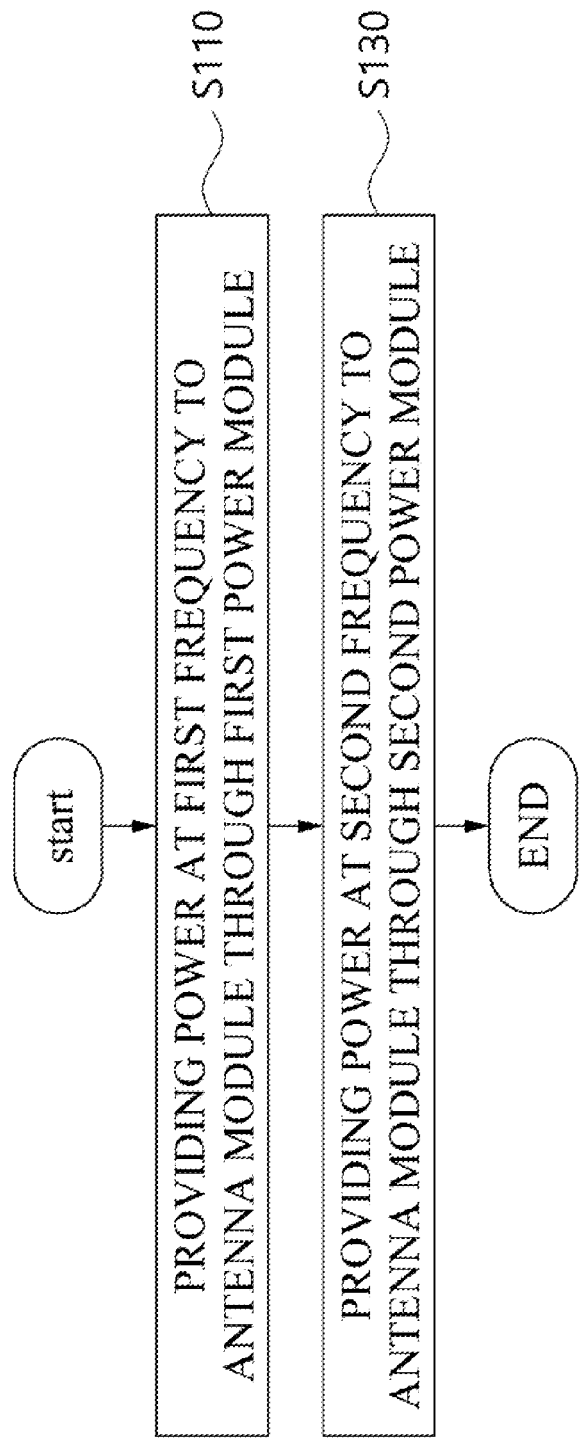
FIG. 19 is a diagram illustrating a control method of a plasma generating device according to an embodiment of the present disclosure.

FIG. 19 is a diagram illustrating a control method of a plasma generating device according to an embodiment.

Referring to FIG. 19, a control method of a plasma generating device according to an embodiment may include: providing power at a first frequency to an antenna module through a first power module at step S110; and providing power at a second frequency to the antenna module through a second power module at step S130.

The providing of the power at the first frequency to the antenna module through the first power module at step S110 may include providing the antenna module with the power at the first frequency that is a resonance frequency determined by the impedance of a first matching element provided between the first power module and the antenna module and the impedance of the antenna module. Herein, the power distribution of the antenna module may appear as the example related to (a) of FIG. 16.

Alternatively, the providing of the power at the first frequency to the antenna module through the first power module at step S110 may include providing the antenna module with a power signal at the first frequency that is different from the resonance frequency determined by the impedance of the antenna module. Herein, the power distribution of the antenna module may appear as the example related to (a) of (b) of FIG. 16.

The providing of the power at the first frequency to the antenna module through the first power module at step S110 may include inducing capacitively coupled plasma discharge inside a dielectric tube by providing a power signal at the first frequency to the antenna module through the first power module.

Alternatively, the providing of the power at the first frequency to the antenna module through the first power module at step S110 may include inducing inductively coupled plasma discharge inside the dielectric tube through an induced electric field having a first intensity by providing a power signal at the first frequency to the antenna module through the first power module.

The providing of the power at the second frequency to the antenna module through the second power module at step S130 may include providing the antenna module with a power signal at the second frequency that is a resonance frequency determined by the impedance of a second matching element provided between the second power module and the antenna module and the impedance of the antenna module. Herein, the voltage distribution of the antenna module may appear as the example related to (c) of FIG. 16.

The providing of the power at the second frequency to the antenna module through the second power module at step S130 may include inducing inductively coupled plasma discharge inside the dielectric tube by providing a power signal at the second frequency to the antenna module through the second power module. The providing of a power signal at the second frequency to the antenna module through the second power module at step S130 may include inducing inductively coupled plasma discharge by forming an induced electric field having a second intensity inside the dielectric tube. The second intensity may be higher or lower than the first intensity of the electric field induced by the first power module.

According to an embodiment, the control method of the plasma generating device may further include acquiring a change in the power signal. The control method of the plasma apparatus may include acquiring the change in the current flowing through the antenna module or in the voltage at both ends of the antenna module (or some elements constituting the antenna module). The control method of the plasma apparatus may include acquiring the above-described change and controlling the first power module and/or the second power module based on the change. The control method of the plasma apparatus may include acquiring the above-described change, and stopping the operation of the first power module and starting the operation of the second power module based on the change. Alternatively, the control method of the plasma apparatus may include acquiring the above-described change, and stopping the operation of the second power module and starting the operation of the first power module based on the change.

3.1.3 One Antenna and One Inverter

A plasma generating device according to an embodiment may include one antenna module and one frequency-variable RF power module. The plasma generating device described below may operate similarly to the above-described embodiment unless otherwise specifically described.

Figure 20:
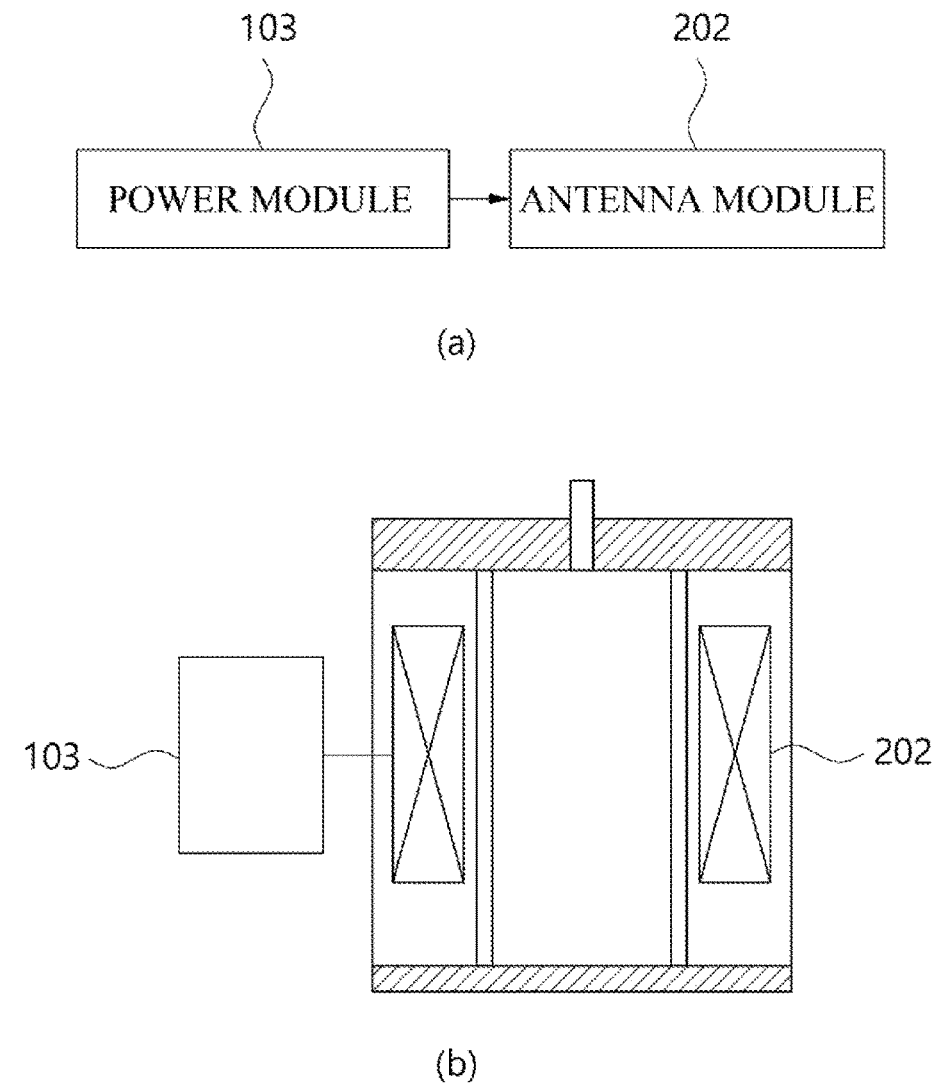
FIG. 20 is a diagram illustrating a plasma generating device according to an embodiment of the present disclosure.

FIG. 20 is a diagram illustrating a plasma generating device according to an embodiment. Referring to (a) and (b) of FIG. 20, a plasma generating device according to an embodiment may include a power module 103 and an antenna module 202.

The RF power module 101 may be an AC power source having a predetermined frequency-variable range. The power module 101 may provide power to the antenna module 202 using the resonance frequency of the antenna module 202 as a driving frequency.

A control method of a plasma generating device according to an embodiment may comprise: controlling the plasma generating device in the first mode through the power module; and controlling the plasma generating device in the second mode through the power module. The above description may be applied to the first mode and the second mode.

Figure 21:
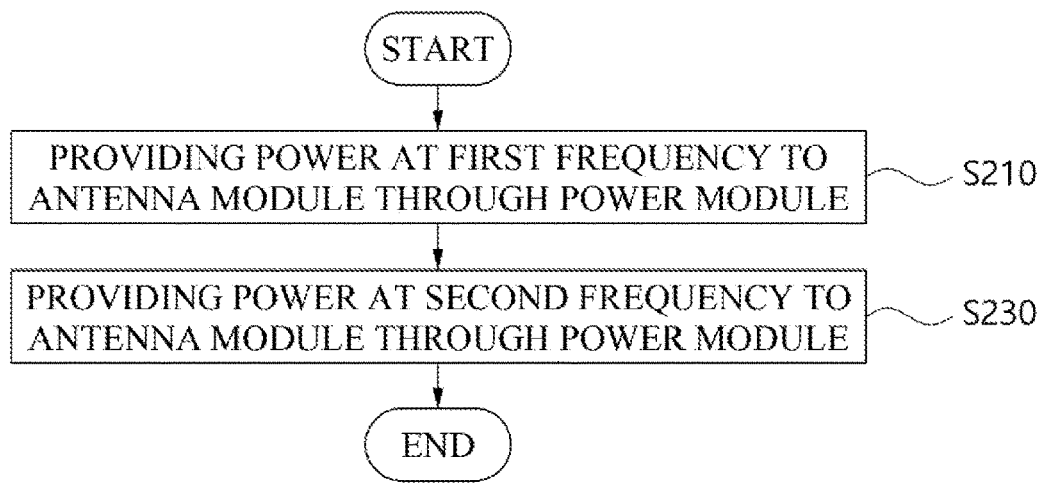
FIG. 21 is a diagram illustrating a control method of a plasma generating device according to an embodiment of the present disclosure.

FIG. 21 is a diagram illustrating a control method of a plasma generating device according to an embodiment.

Referring to FIG. 21, a control method of a plasma generating device according to an embodiment may include: providing power at a first frequency to an antenna module through a power module at step S210; and providing power at a second frequency to the antenna module through the power module at step S230. The second frequency may be a resonance frequency of the antenna module.

The providing of the power at the first frequency to the antenna module through the power module at step S210 may include providing the antenna module with a power signal at the first frequency that is different from the resonance frequency determined by the impedance of the antenna module. Herein, the voltage distribution of the antenna module may appear as the example related to (a) of FIG. 16.

The providing of the power at the first frequency to the antenna module through the power module at step S210 may include inducing capacitively coupled plasma discharge inside a dielectric tube by providing a power signal at the first frequency to the antenna module through the power module.

The providing of the power at the second frequency to the antenna module through the power module at step S230 may include providing the antenna module with a power signal at the second frequency that is the resonance frequency determined by the impedance of the antenna module. Herein, the voltage distribution of the antenna module may appear as the example related to (c) of FIG. 16 (or (b) of FIG. 16).

The providing of the power at the second frequency to the antenna module through the power module at step S230 may include inducing inductively coupled plasma discharge inside the dielectric tube by providing a power signal at the second frequency to the antenna module through the power module.

According to an embodiment, the control method of the plasma generating device may further include acquiring a change in the power signal. The control method of the plasma apparatus may include acquiring the change in the current flowing through the antenna module or in the voltage at the both ends of the antenna module (or some elements constituting the antenna module), and changing the driving frequency of the power module based on the acquired change.

3.1.4 Embodiments of Plasma Generating Device

According to an embodiment, having multiple operation modes including a first mode and a second mode, a plasma generating device for performing plasma discharge may be provided. The plasma generating device may include: a first power supply capable of changing a frequency within a first frequency range; a second power supply capable of changing a frequency within a second frequency range that is at least partially different from the first frequency range; a dielectric tube; and an antenna module including a first unit coil wound around the dielectric tube at least one time, a second unit coil wound around the dielectric tube at least one time, and a first capacitor connected in series between the first unit coil and the second unit coil.

In the plasma generating device, the antenna module induces a first plasma discharge based on a power signal having the first frequency in the first frequency range when the operation mode is the first mode, or the antenna module induces a second plasma discharge based on a power signal having the second frequency in the second frequency range when the operation mode is the second mode. Herein, the first unit coil and the second unit coil have a first inductance, the first capacitor has a first capacitance, and the first frequency corresponds to a first resonance frequency determined according to the first inductance and the first capacitance.

The first power supply may include a first matching element having a first impedance. When the operation mode is the first mode, the antenna module performs the first plasma discharge based on the power signal having the first frequency, wherein the first frequency corresponds to a first resonance frequency determined based on the first impedance, the first inductance, and the first capacitance.

The second power supply may include a second matching element having a second impedance. When the operation mode is the second mode, the antenna module performs the second plasma discharge based on the power signal having the second frequency, wherein the second frequency corresponds to a second resonance frequency that is determined based on the second impedance, the first inductance, and the first capacitance and is different from the first resonance frequency.

The second resonance frequency may be higher than the first resonance frequency. Herein, a first voltage is lower than a second voltage. The first voltage is a voltage between one end of the first unit coil not connected to the first capacitor and one end of the second unit coil not connected to the first capacitor when the operation mode is the first mode, and the second voltage is a voltage between the one end of the first unit coil not connected to the first capacitor and the one end of the second unit coil not connected to the first capacitor when the operation mode is the second mode.

When the operation mode is the first mode, the voltage between both ends of the first unit coil corresponds to the voltage between one end of the first unit coil not connected to the first capacitor and one end of the second unit coil not connected to the first capacitor.

The voltage at both ends of the antenna module when the operation mode is the first mode is lower than the voltage between both ends of the antenna module when the operation mode is the second mode.

The size of the first current flowing through the antenna module when the operation mode is the first mode may be smaller the size of the second current flowing through the antenna module when the operation mode is the second mode.

When the operation mode is the first mode, the power consumed by the antenna module is a first power. When the operation mode is the second mode, the power consumed by the antenna module is a second power lower than the first power.

According to an embodiment, there is provided a control method of a plasma generating device including: a first power supply capable of changing a frequency within a first frequency range; a second power supply capable of changing a frequency within a second frequency range that is at least partially different from the first frequency range; a dielectric tube; and an antenna module including a first unit coil wound around the dielectric tube at least one time, a second unit coil wound around the dielectric tube at least one time, and a first capacitor connected in series between the first unit coil and the second unit coil.

The control method of the plasma generating device may comprise: operating in the first mode in which an RF power is provided to the antenna module using the first frequency as a driving frequency; and operating in the second mode in which an RF power is provided to the antenna module using the second frequency as a driving frequency. The first unit coil and the second unit coil have a first inductance, the first capacitor has a first capacitance, and the second frequency corresponds to a second resonance frequency determined according to the first inductance and the first capacitance.

The second power supply may include a second matching element having a second impedance. The operating in the second mode may include operating with the second frequency as the driving frequency, wherein the second frequency corresponds to a second resonance frequency determined based on the first inductance, the first capacitance, and the second impedance.

The first power supply may include a first matching element having a first impedance. The operating in the first mode may include operating with the first frequency as the driving frequency, wherein the first frequency corresponds to a first resonance frequency determined based on the first inductance, the first capacitance, and the first impedance.

When the operation mode is the first mode, the power consumed by the antenna module is a first power. When the operation mode is the second mode, the power consumed by the antenna module is a second power higher than the first power.

When the operation mode is the first mode, the voltage between both ends of the first unit coil corresponds to the voltage between one end of the first unit coil not connected to the first capacitor and one end of the second unit coil not connected to the first capacitor.

The size of the first current flowing through the antenna module when the operation mode is the first mode may be smaller the size of the second current flowing through the antenna module when the operation mode is the second mode.

In the meantime, the control method of the plasma generating device may further comprise: acquiring the current flowing through the antenna module when the operation mode is the first mode; and changing the operation mode to the second mode when the current flowing through the antenna module is equal to or smaller than a reference value.

The control method of the plasma generating device may further comprise: acquiring the current flowing through an inverter of the first power supply when the operation mode is the first mode; and changing the operation mode to second mode when the current flowing through the inverter of the first power supply is equal to or smaller than a reference value.

According to another embodiment, there is provided a plasma generating device for generating plasma by receiving power from a first power supply capable of changing a frequency within a first frequency range when an operation mode is a first mode, or by receiving power from a second power supply capable of changing a frequency within a second frequency range that is at least partially different from the first frequency range when the operation mode is a second mode.

The plasma generating device may include an antenna module including a first unit coil wound around a dielectric tube at least one time, a second unit coil wound around the dielectric tube at least one time, and a first capacitor connected in series between the first unit coil and the second unit coil.

When the operation mode is the first mode, the antenna module induces a first plasma discharge based on a power signal having a first frequency within the first frequency range.

When the operation mode is the second mode, the antenna module induces a second plasma discharge based on a power signal having a second frequency within the second frequency range.

The first unit coil and the second unit coil have a first inductance, the first capacitor has a first capacitance, and the first frequency corresponds to a first resonance frequency determined based on the first inductance and the first capacitance.

The voltage at both ends of the antenna module when the operation mode is the first mode is lower than the voltage between both ends of the antenna module when the operation mode is the second mode.

When the operation mode is the first mode, the voltage between both ends of the first unit coil corresponds to the voltage between one end of the first unit coil not connected to the first capacitor and one end of the second unit coil not connected to the first capacitor.

As described above in the embodiments, an operation mode is changed by changing a driving frequency of power applied to an antenna module, thereby changing discharge characteristics of the antenna module. There is provided a plasma generating device that provides various discharge characteristics through a single antenna module, thereby having a wider matching range and various energy efficiencies and being capable of maintaining discharge in various environments.

In the meantime, when one antenna module is used, discharge characteristics that the antenna module has may be limited because of the limitations of the physical structure of the antenna module. Thus, a plasma generating device including two or more antenna modules may be provided. Hereinafter, a plasma generating device including two or more antenna modules and the operation of the apparatus will be described.

3.2 Case of Two Antennas 3.2.1 Plasma Generation Process for Case of Two Antennas A plasma generating device according to an embodiment may include two or more antenna modules. The plasma generating device may include multiple antenna modules having different discharge characteristics. The two or more antenna modules may have different impedances. The plasma generating device may be provided such that a leading antenna module is changed as needed. The leading antenna module may mean an antenna module that mainly consumes power. The two or more antenna modules may be connected to a frequency-variable power source in parallel.

The two or more antenna modules may operate differently according to a driving frequency of the plasma generating device. For example, when the driving frequency of the plasma generating device is a first frequency corresponding to a resonance frequency of a first antenna module, the first antenna module operates in a resonance state in which reactance is canceled and a second antenna module operates in a non-resonance state. For example, when the driving frequency of the plasma generating device is the first frequency corresponding to the resonance frequency of the first antenna module, current flow into the second antenna module having impedance different from that of the first antenna module is inhibited. When the driving frequency is a second frequency corresponding to the resonance frequency of the second antenna module, current flow into the first antenna module having impedance different from that of the second antenna module is inhibited. In addition, for example, when the driving frequency is a third frequency different from the resonance frequency of the first antenna module and from the resonance frequency of the second antenna module, the first antenna module and the second antenna module operate in a non-resonance state. The antenna module may induce capacitively coupled plasma discharge in a non-resonance state, or may induce inductively coupled plasma discharge in a resonance state.

As in the above examples, the plasma generating device described in the present disclosure controls the driving frequency to selectively switch a leading antenna module and change discharge characteristics.

The two or more antenna modules may have different structures. For example, as the example related to FIG. 8, one antenna module may include: a solenoid coil wound around a dielectric tube continuously multiple times; and terminal capacitors connected to both ends of the solenoid coil. As the examples related to FIGS. 10A to 10C, another antenna module may include multiple unit coils, and interlayer capacitors provided between the unit coils. In addition, for example, one antenna module may include: multiple unit coils including a first turn per layer and forming a first layer; interlayer capacitors provided between the unit coils; and terminal capacitors. Another antenna module may include:

multiple unit coils including a second turn between layers and forming a second layer; interlayer capacitors; and terminal capacitors.

Hereinafter, for convenience, description is given for the case of two antenna modules, but a plasma generating device may include two or more antenna modules. The plasma generating device may include two or more antenna modules having different impedances, structures, and/or functions, and may be provided such that a leading antenna is changed as needed. A frequency-variable power source may include one or more power modules.

According to the present disclosure, there is provided a plasma generating device including: an antenna module having discharge characteristics advantageous for initial discharge; an antenna module having discharge characteristics appropriate for maintaining discharge; and/or an antenna module having discharge characteristics with low energy loss, wherein mode change is achieved through antenna switching as needed.

As described above in the present disclosure, by using the plasma generating device including multiple antenna modules and configured to selectively operate the antenna modules, matching for a wider range of impedance or a range of real resistance may be achieved. In addition, there is provided a plasma generating device having a wider discharge control range by utilizing multiple antenna modules having different discharge control ranges (for example, flow rate, power, pressure, and gas type).

3.2.1.1 First Embodiment

Figure 22:
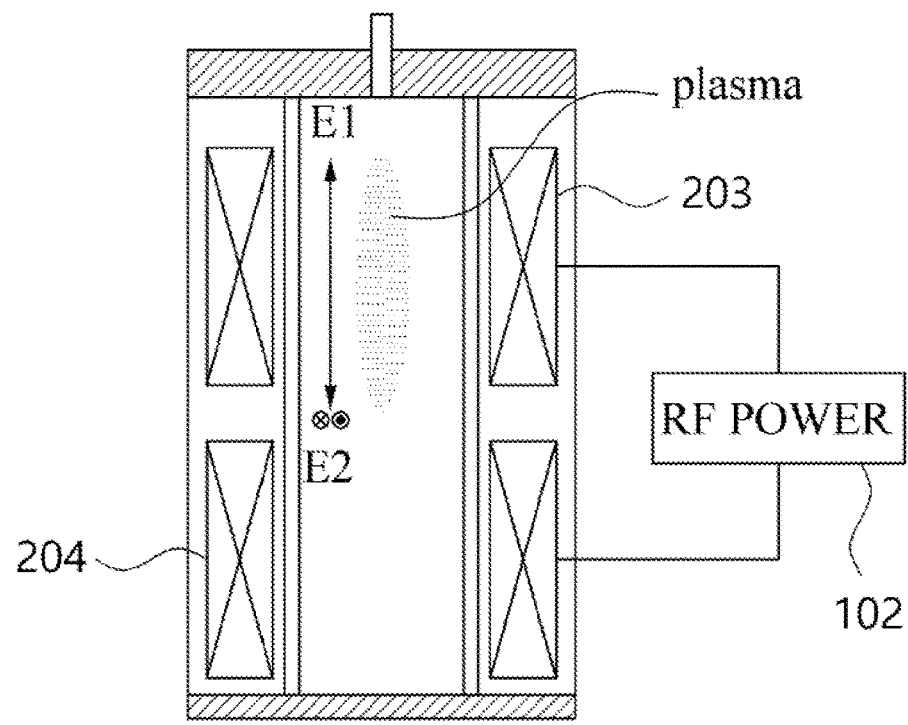
FIG. 22 is a diagram illustrating a plasma generation process according to an embodiment of the present disclosure.
Figure 22:
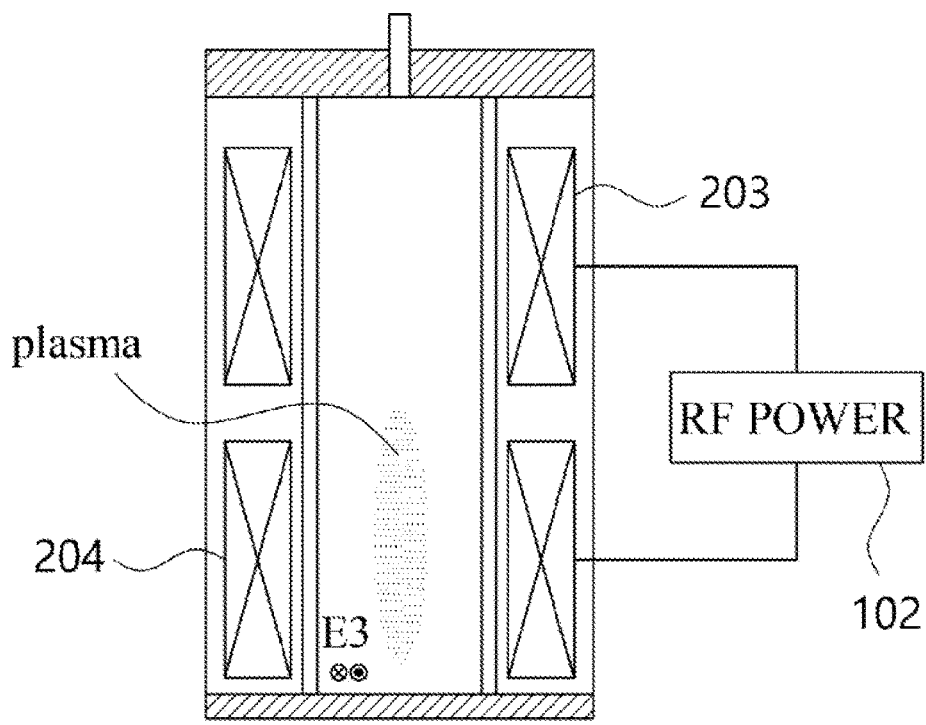

FIG. 22 is a diagram illustrating a plasma discharge process in a case in which a plasma generating device includes a first antenna module 203, a second antenna module 204, and an RF power supply 102. The RF power supply 102 may include one or more power modules. The RF power supply 102 may include one or more power modules having different output frequency bands.

Figure 23:
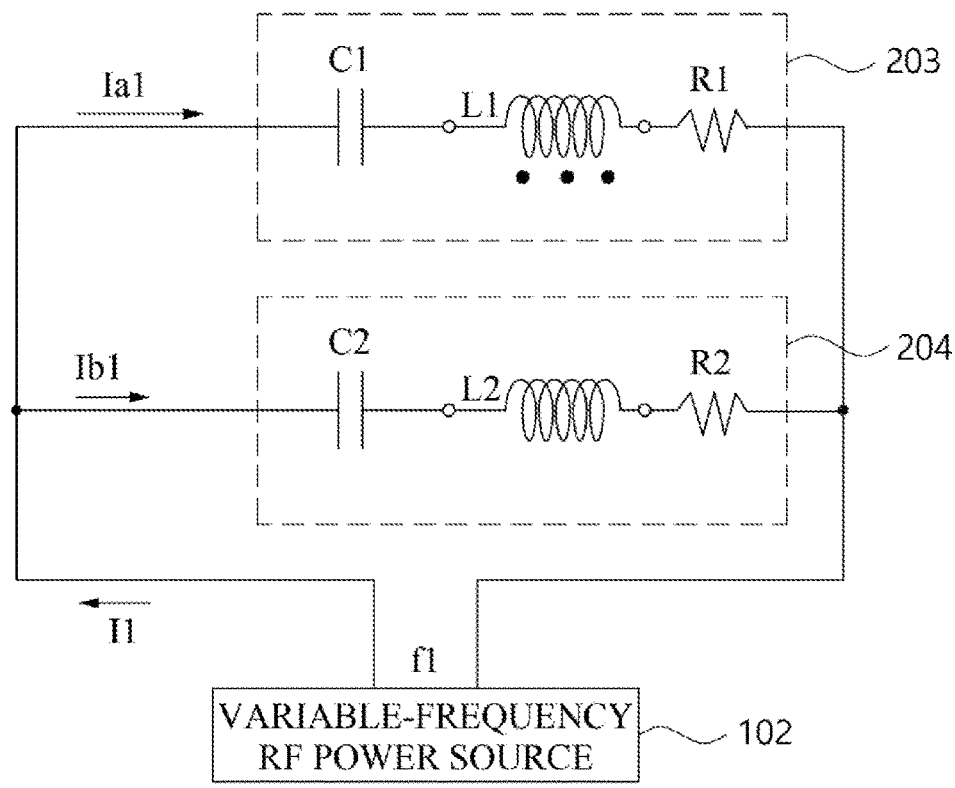
FIG. 23 is a diagram illustrating a plasma generation process according to an embodiment of the present disclosure.
Figure 24:
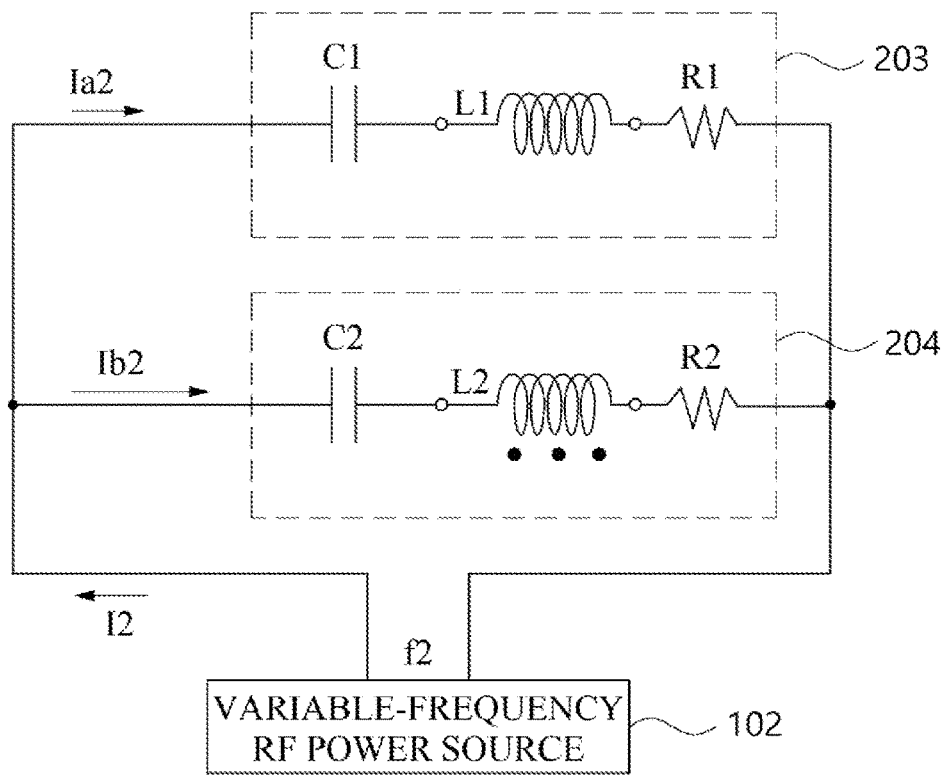
FIG. 24 is a diagram illustrating a plasma generation process according to an embodiment of the present disclosure.

FIGS. 23 and 24 are schematic circuit diagrams illustrating change in an operation mode of a plasma generating device.

Hereinafter, with reference to FIGS. 22 to 24, a mode change plasma discharge process in a case of two or more antenna modules will be described.

Referring to FIG. 22, in the case in which the plasma generating device includes the first antenna module 203, the second antenna module 204, and the RF power supply 102, the plasma generating device may change a leading antenna module by changing a driving frequency of the power supply 102.

Referring to (a) of FIG. 22, when an operation mode is a first mode, the plasma generating device transmits a power signal having a first frequency f1 to the first antenna module 203 and the second antenna module 204 through the power supply 102, and induces plasma discharge inside a dielectric tube. The first frequency f1 may be a driving frequency that enables the first antenna module 203 to operate as a leading antenna module.

When the operation mode is the first mode, the plasma generating device forms a first electric field E1 inside the dielectric tube. The first electric field E1 may be an electric field E1 in a vertical direction that is parallel to the axis direction of the dielectric tube. When the operation mode is the first mode, the plasma generating device forms, inside the dielectric tube, an electric field E2 in an azimuthal direction parallel to the circumferential direction of the dielectric tube.

According to an embodiment, when the operation mode is the first mode, the plasma generating device transmits the power signal having the first frequency f1 to the first antenna module 203 and the second antenna module 204 to form the electric field E1 in the vertical direction, and induces generation of capacitively coupled plasma inside the dielectric tube.

According to an embodiment, when the operation mode is the first mode, the plasma generating device transmits the power signal having the first frequency f1 to the first antenna module 203 and the second antenna module 204 to form the electric field E2 in the azimuthal direction, and induces generation of inductively coupled plasma inside the dielectric tube. When the operation mode is the first mode, the plasma generating device forms the electric field E2 in the azimuthal direction having a first intensity.

FIG. 23 is a diagram illustrating the operation of the plasma generating device shown in (a) of FIG. 22. Referring to FIG. 23, when the operation mode of the plasma generating device is the first mode, the plasma generating device outputs a first current I1 having a second frequency f2 to the first antenna module 203 and the second antenna module 204 through a variable-frequency RF power source.

When the operation mode of the plasma generating device is the first mode, a first-a current Ia1 is allocated to the first antenna module 203 and a first-b current Ib1 is allocated to the second antenna module 204. The first-a current Ia1 may be greater than the first-b current Ib1. When the operation mode is the first mode, the first frequency f1 that is the driving frequency corresponds to the resonance frequency of the first antenna module 203, the reactance of the first antenna module 203 is mostly canceled, and the reactance of the second antenna module 204 is canceled relatively little. Most of the current may be allocated to the first antenna module 203. When the operation mode of the plasma generating device is the first mode, a first power consumed by the first antenna module 203 is higher than a second power consumed by the second antenna module 204. When the operation mode of the plasma generating device is the first mode, the first antenna module 203 causes inductively coupled plasma discharge inside the dielectric tube and generated plasma is inductively coupled to an inductor of the first antenna module 203.

Referring to (b) of FIG. 22, when the operation mode is a second mode, the plasma generating device provides power to the first antenna module 203 and the second antenna module 204 through the power supply 102 using a second frequency f2 as the driving frequency. The second frequency f2 and the first frequency f1 may differ. The second frequency f2 may be different from the first frequency f1 by a particular value or more. The second frequency f2 may be higher or lower than the first frequency f1 by a particular value or more (for example, 0.2 MHz).

When the operation mode is the second mode, the plasma generating device transmits the power signal of the second frequency f2 to the first antenna module 203 and the second antenna module 204 to induce an electric field E3 in an azimuthal direction, and induces inductively coupled plasma discharge inside the dielectric tube. When the operation mode is the second mode, the plasma generating device forms the electric field E3 in the azimuthal direction having a second intensity. The second intensity may be higher or lower than the intensity of the electric field E2 in the azimuthal direction in the first mode.

FIG. 24 is a diagram illustrating the operation of the plasma generating device shown in (b) of FIG. 22. Referring to FIG. 24, when the operation mode of the plasma generating device is the second mode, the plasma generating device outputs a second current I2 having a second frequency f2 to the first antenna module 203 and the second antenna module 204 through the variable-frequency RF power source. When the operation mode of the plasma generating device is the second mode, a second-a current Ia2 is allocated to the first antenna module 203 and a second-b current Ib2 is allocated to the second antenna module 204. The second-a current Ia2 may be smaller than the second-b current Ib2. According to an embodiment, when the operation mode is the second mode, the second frequency f2 that is the driving frequency corresponds to the resonance frequency of the second antenna module 204, the reactance of the second antenna module 204 is mostly canceled, and the reactance of the first antenna module 203 is canceled relatively little. Most of the current may be allocated to the second antenna module 204. When the operation mode of the plasma generating device is the second mode, a second power consumed by the second antenna module 204 is higher than a first power consumed by the first antenna module 203. When the operation mode of the plasma generating device is the second mode, the second antenna module 204 causes inductively coupled plasma discharge inside the dielectric tube and generated plasma is inductively coupled to an inductor of the second antenna module 204.

Figure 25:
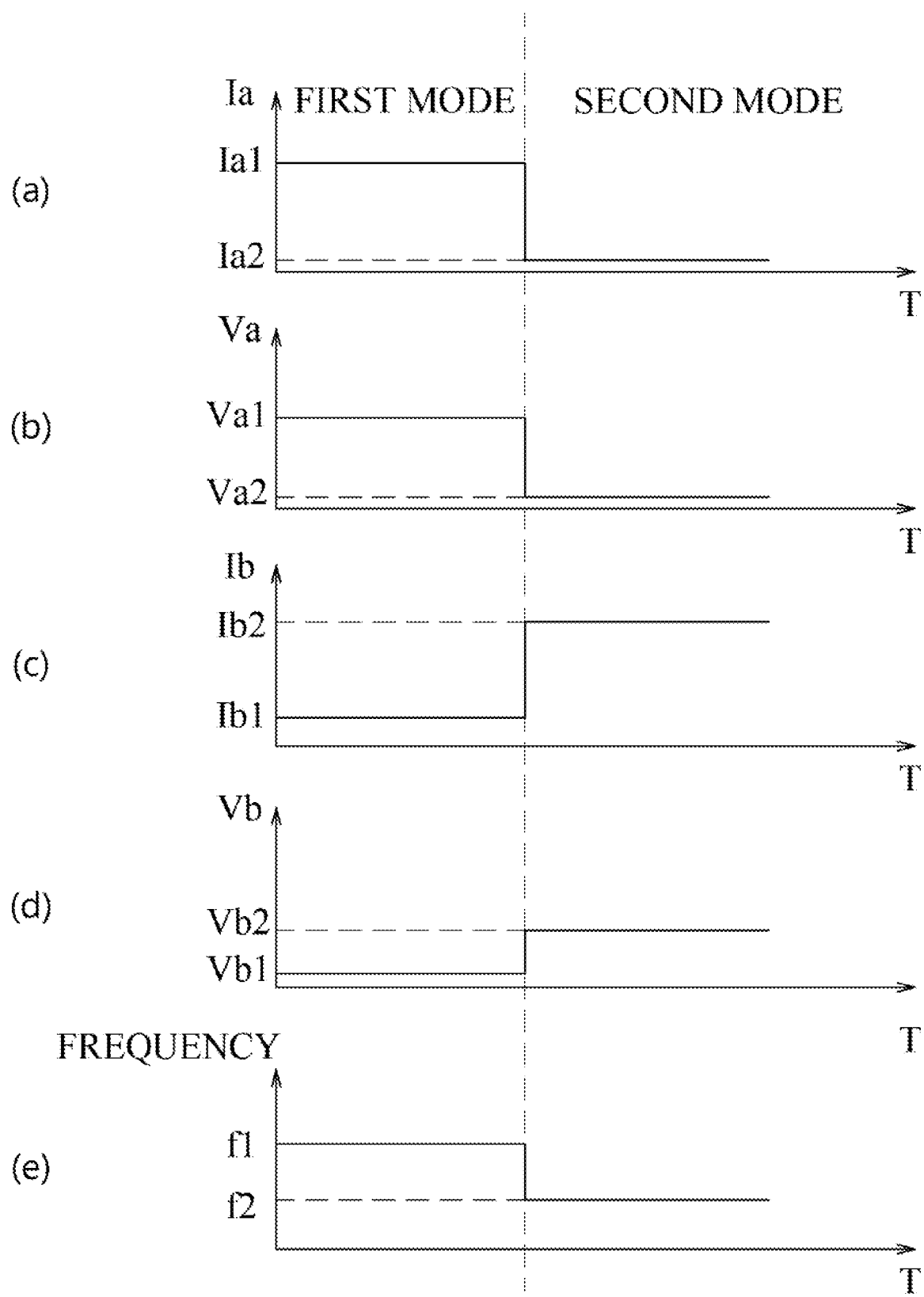
FIG. 25 is a diagram illustrating a plasma generation process according to an embodiment of the present disclosure.

FIG. 25 is a diagram illustrating voltage and current changes according to an operation mode of a plasma generating device. FIG. 25 is a diagram illustrating, over time, the current flowing through the first antenna module, the voltage at both ends of an inductive coil of the first antenna module, the current flowing through the second antenna module, the voltage at both ends of an inductive coil of the second antenna module, and a frequency, respectively. In FIG. 25, the current and voltage graphs show sizes.

Referring to (e) of FIG. 25, when the operation mode of the plasma generating device is the first mode, the power supply 102 provides the power signal having the first frequency f1 to the first antenna module 203 and the second antenna module 204. Hereinafter, referring to (a) and (c) of FIG. 25, the first-a current Ia1 flows through the first antenna module 203 and the first-b current Ib1 smaller than the first-a current Ia1 flows through the second antenna module 204. Referring to (b) and (d) of FIG. 25, when the operation mode of the plasma generating device is the first mode, the voltage at the both ends of the inductive coil of the first antenna module 203 is a first-a voltage Va1 and the voltage at the both ends of the inductive coil of the second antenna module 204 is a first-b voltage Vb1 lower than the first-a voltage Va1.

Referring to (e) of FIG. 25, when the operation mode of the plasma generating device is the second mode, the power supply 102 provides the power signal having the second frequency f2 to the first antenna module 203 and the second antenna module 204. Referring to (a) and (c) of FIG. 25, in the second mode, the second-a current Ia2 smaller than the first-a current Ia1 flows through the first antenna module 203, and the second-b current Ib2 greater than the first-b current Ib1 flows through the second antenna module 204, wherein the second-b current Ib2 may be greater than the first-a current Ia1. Referring to (b) and (d) of FIG. 25, when the operation mode of the plasma generating device is the second mode, the voltage at the both ends of the inductive coil of the first antenna module 203 is a second-a voltage Va2 lower than the first-a voltage Va1 and the voltage at the both ends of the inductive coil of the second antenna module 204 is a second-b voltage Vb2 higher than the first-b voltage Vb1. The second-b voltage Vb2 may be higher than the second-a voltage Va2.

Figure 26:
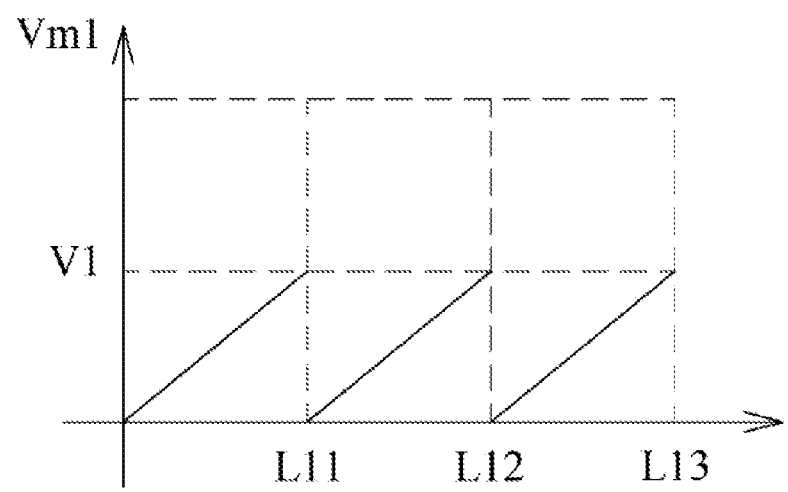
FIG. 26 is a diagram illustrating a plasma generation process according to an embodiment of the present disclosure.
Figure 26:
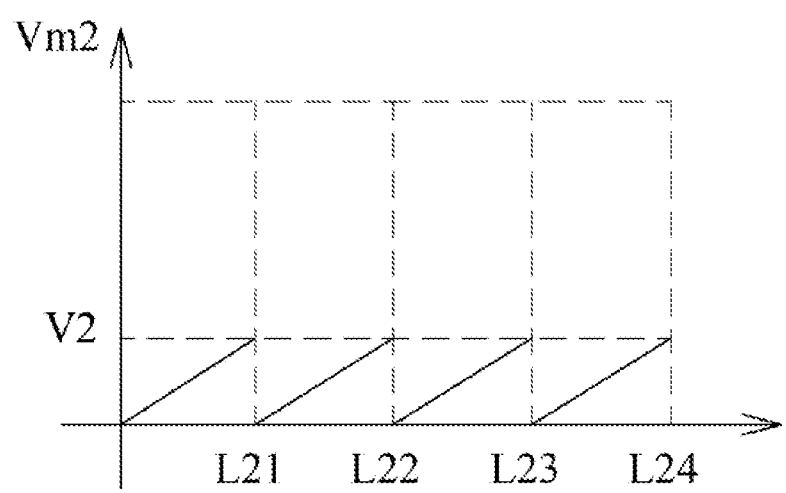

FIG. 26 is a diagram illustrating voltage drop in each antenna module of a plasma generating device according to an embodiment. Hereinafter, with reference to FIG. 24, voltage distribution depending on a location in an inductive coil of a leading antenna module in each operation mode will be described.

When the plasma generating device is in the first mode in which the first frequency corresponding to the resonance frequency of the first antenna module 203 is a driving frequency, most of the power supplied by the power source is consumed by the first antenna module 203 and the first antenna module 203 operates as a leading antenna module as described above.

(a) of FIG. 26 schematically shows a voltage Vm1 depending on the location in the inductive coil of the first antenna module 203 in the first mode in the case in which the first antenna module 203 includes unit coils (three unit coils in the example of (a) of FIG. 26) constituting a unit layer and interlayer capacitors provided between the unit coils, as shown in FIG. 10.

When the operation mode is the first mode, the first antenna module 203 is in a resonance state. When the operation mode is the first mode, inductive coil reactance cancellation by the interlayer capacitors between the unit coils of the first antenna module 203 is maximized, so that first inductively coupled plasma discharge is induced.

Referring to (a) of FIG. 26, the voltage between both ends of an antenna module having a total length of L13 may be a first voltage V1. Preferably, the voltage at both ends (from the origin to point L11, from point L11 to point L12, and from point L12 to point L13) of each of the unit coils constituting the antenna module may be substantially the same as the first voltage V1.

(b) of FIG. 26 is a diagram illustrating voltage distribution depending on a location in the second antenna module 204 when the plasma generating device according to an embodiment is in the second mode in which the second frequency is a driving frequency.

When the plasma generating device is in the second mode in which the second frequency corresponding to the resonance frequency of the second antenna module 204 is a driving frequency, most of the power supplied by the power source is consumed by the second antenna module 204 and the second antenna module 204 operates as a leading antenna module as described above.

(b) of FIG. 26 schematically shows a voltage Vm2 according to the location in the inductive coil of the second antenna module 204 in the second mode in the case in which the first antenna module 204 includes unit coils (four unit coils in the example of (b) of FIG. 26) constituting a unit layer and interlayer capacitors provided between the unit coils, as shown in FIG. 10.

When the operation mode is the second mode, the second antenna module 204 is in a resonance state. When the operation mode is in the second mode, inductive coil reactance cancellation by the interlayer capacitors between the unit coils of the second antenna module 204 is maximized, so that second inductively coupled plasma discharge is induced. The second inductively coupled plasma discharge may have higher energy efficiency than the first inductively coupled plasma discharge.

Referring to (b) of FIG. 26, the voltage between both ends of an antenna module having a total length of L24 may be a second voltage V2. Preferably, the voltage between both ends (from the origin to point L21, from point L21 to point L22, from point L22 to point L23, and from point L23 to point L24) of each of the unit coils constituting the antenna module may be substantially the same as the second voltage V2.

In the meantime, when the operation mode is the first mode, current flow into the second antenna module 204 is substantially blocked. Therefore, when the operation mode is the first mode, the voltage at both ends of inductive elements constituting the second antenna module 204 converges into a very small voltage. In addition, when the operation mode is the second mode, current flow into the first antenna module 204 is substantially blocked. Therefore, when the operation mode is the second mode, the voltage at both ends of inductive elements constituting the first antenna module 203 converges into a very small voltage.

According to an embodiment, the first antenna module 203 may be an antenna module including a solenoid coil wound multiple times without an interlayer capacitor as shown in FIG. 8. In the case in which the first antenna module 203 does not include an interlayer capacitor, the voltage at both ends of the inductive coil of the first antenna module 203 is the first voltage (maximum value) when the driving frequency is the first frequency, or the voltage is the second voltage lower than the first voltage when the driving frequency is the second frequency.

In the above embodiments, the mode change process in which the operation mode of the plasma generating device is changed from the first mode to the second mode and the driving frequency is reduced has been described, but this is only an example and the mode change form may be changed as needed. For example, the operation mode of the plasma generating device may be changed from the second mode to the first mode. Alternatively, the operation modes of the plasma generating device may include three or more modes.

3.2.1.2 Second Embodiment

Hereinafter, the embodiment described with reference to FIGS. 22 to 26 will be described with a more detailed example. According to an embodiment, when it is required to secure initial-discharge stability of plasma (for example, the case of normal-pressure plasma discharge), the plasma generating device further includes a DC power source and electrode for providing seed charge to plasma discharge. Herein, the operation modes of the plasma generating device may include a first mode (that is, an initial discharge mode) for assisting initial discharge and a second mode (that is, a main discharge mode) for assisting main discharge. Hereinafter, the contents of the embodiments described above with reference to FIGS. 22 to 26 may be similarly applied unless otherwise specifically described.

Figure 27:
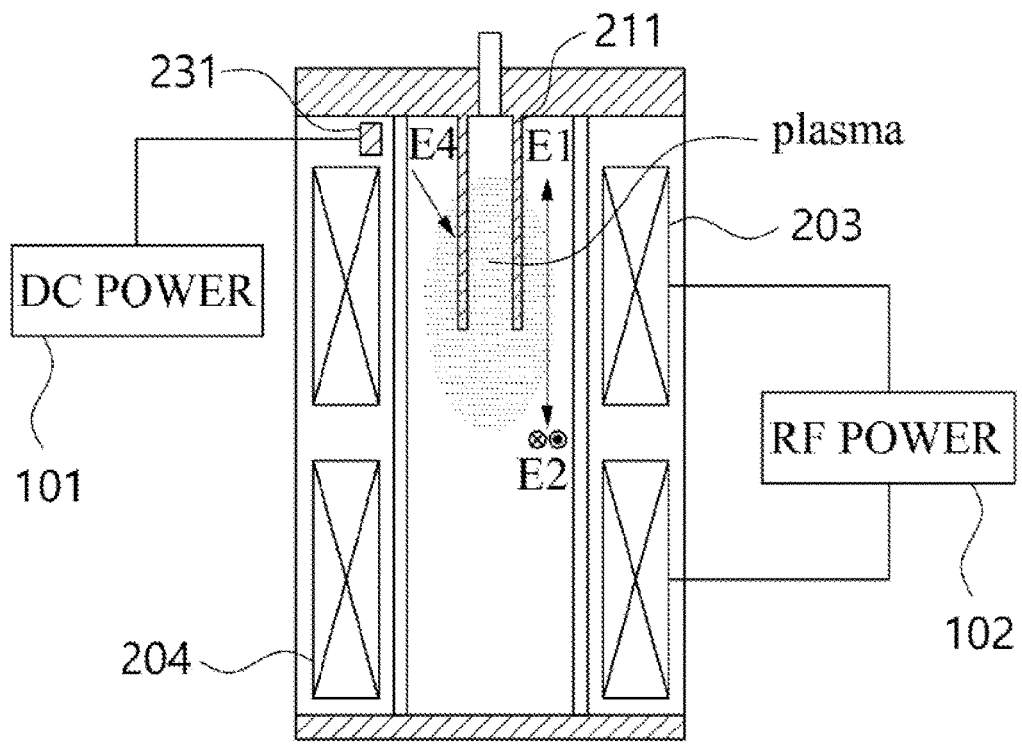
FIG. 27 is a diagram illustrating a plasma generation process according to an embodiment of the present disclosure.
Figure 27:
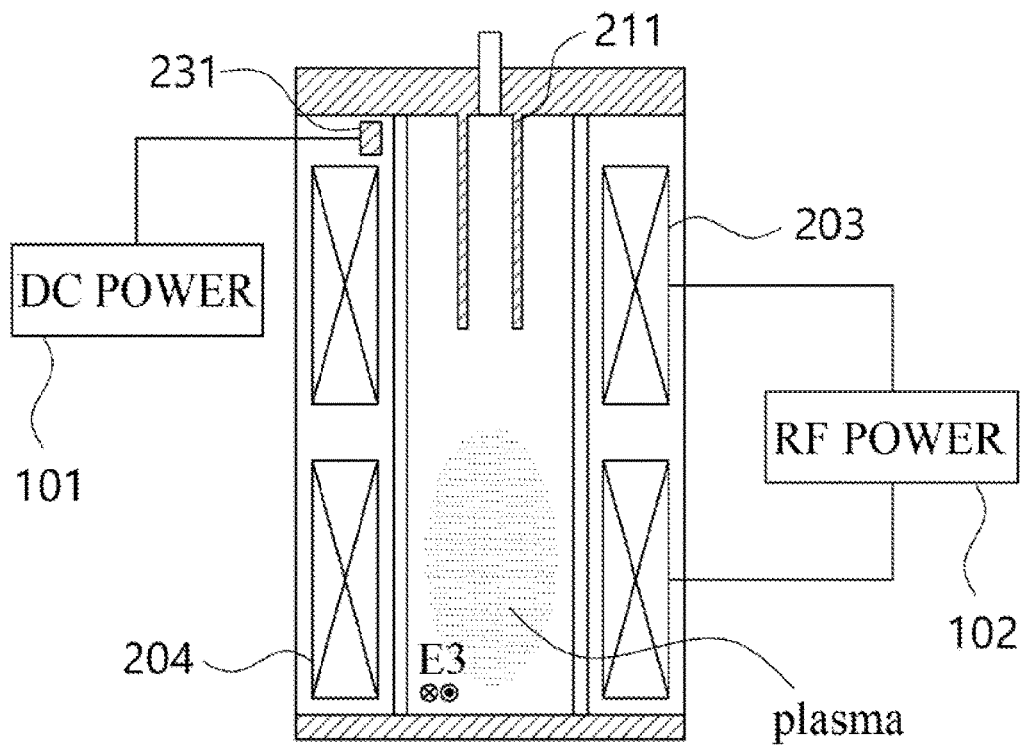

FIG. 27 is a diagram illustrating a plasma discharge process in a case in which a plasma generating device includes a first antenna module 203, a second antenna module 204, an RF power supply 102, a DC power supply 101, and a DC electrode 231, 233. The contents described with reference to FIGS. 4 to 7 may be similarly applied to the DC power supply 101 and the DC electrode 231.

Figure 28:
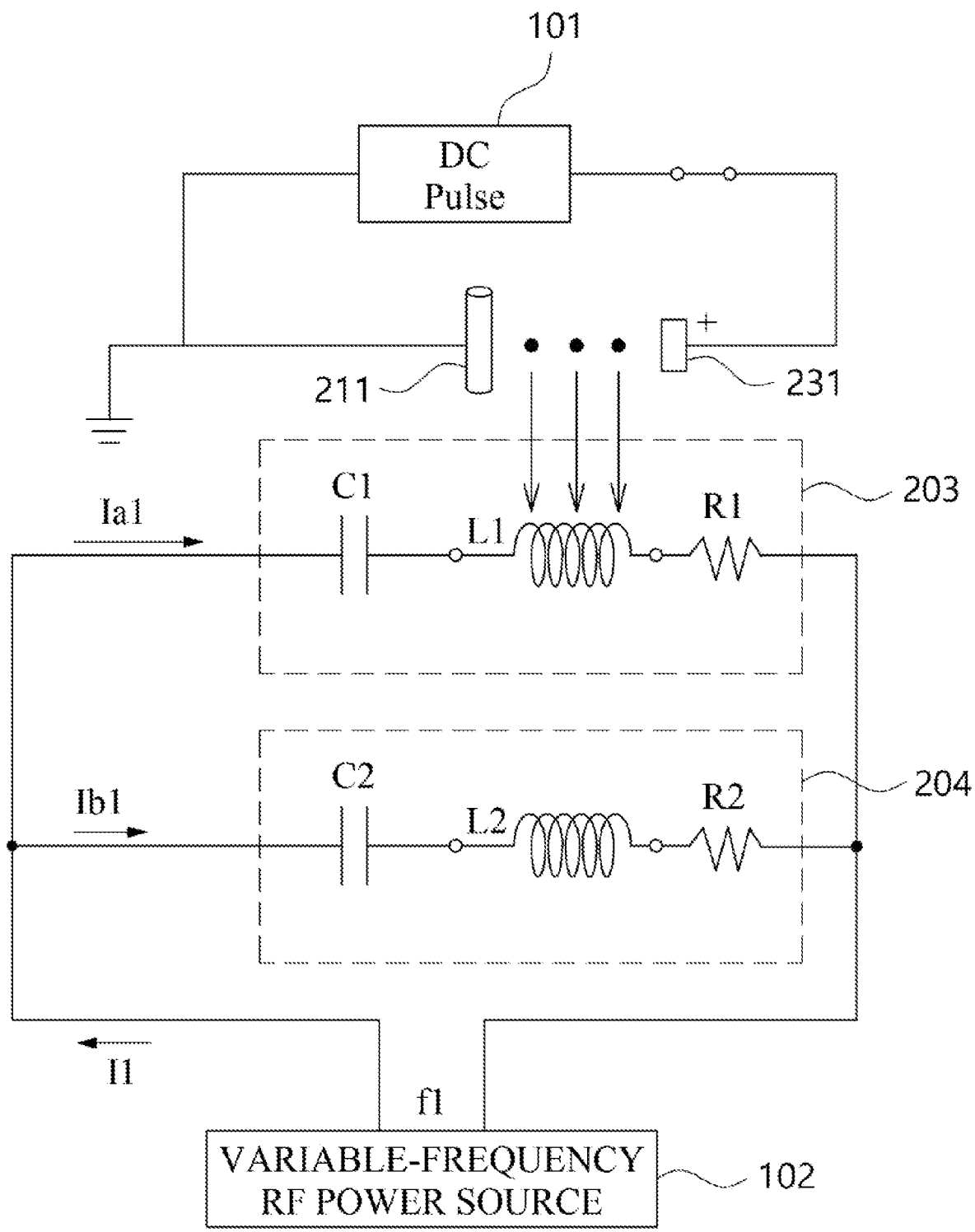
FIG. 28 is a diagram illustrating a plasma generation process according to an embodiment of the present disclosure.
Figure 29:
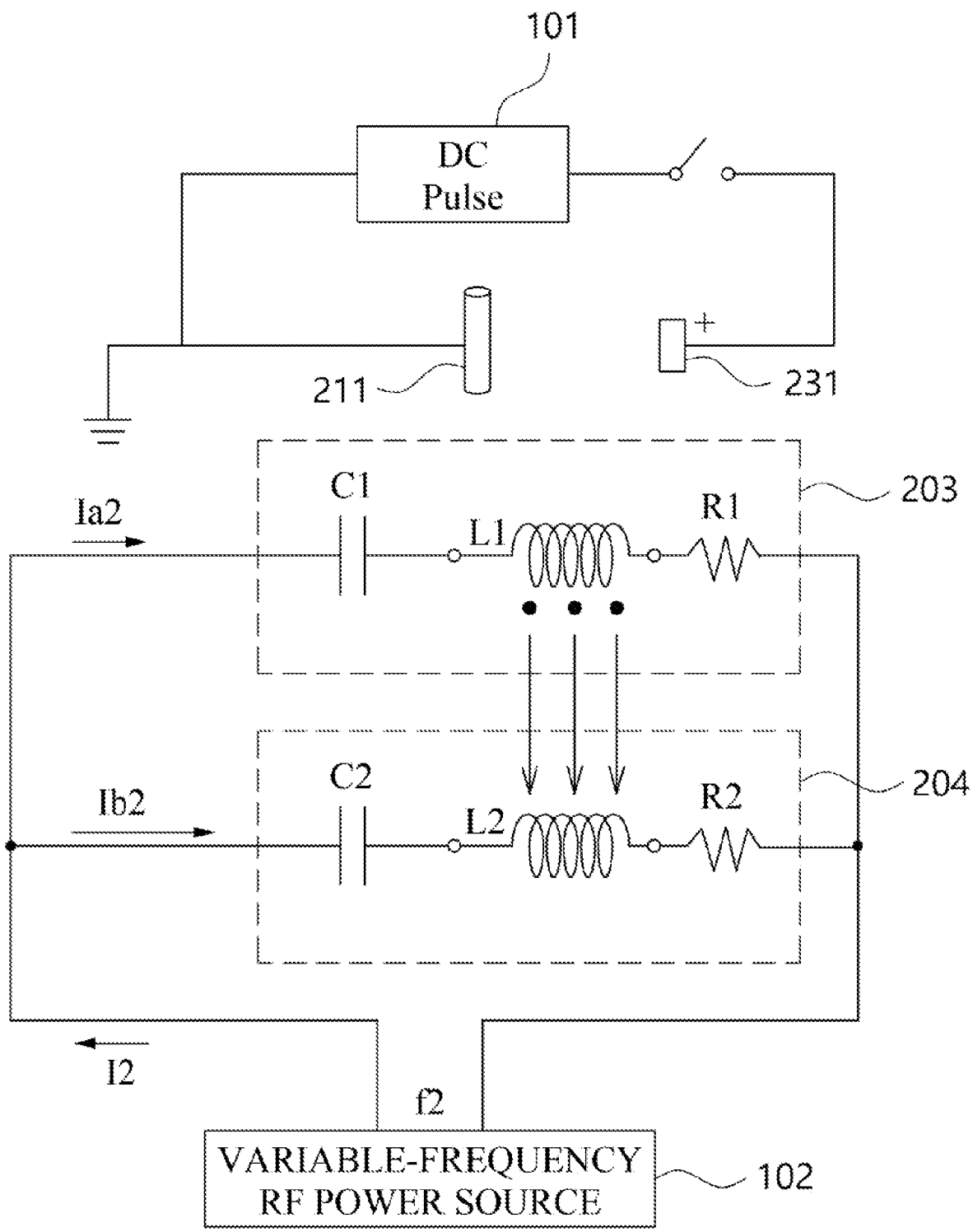
FIG. 29 is a diagram illustrating a plasma generation process according to an embodiment of the present disclosure.

FIGS. 28 and 29 are schematic circuit diagrams illustrating change in an operation mode of a plasma generating device shown in FIG. 27.

Hereinafter, with reference to FIGS. 27, 28, and 29, a mode change plasma discharge process of a plasma generating device including a DC electrode will be described.

Operation modes of the plasma generating device may include a first mode for performing initial plasma discharge, and a second mode for performing main plasma discharge. (a) of FIG. 27 is a diagram illustrating the operation of the plasma generating device in the first mode. (b) of FIG. 27 is a diagram illustrating the operation of the plasma generating device in the second mode.

Referring to (a) of FIG. 27, the plasma apparatus in the first mode may provide power to the first antenna module 203 and the second antenna module 204 through the power supply 102 using a first frequency corresponding to the resonance frequency of the first antenna module as a driving frequency.

Referring to (a) of FIG. 27, when the operation mode is the first mode, the DC power supply 101 applies a high-voltage pulse to the DC electrode 231. When the operation mode is the first mode, the plasma generating device applies a high-voltage pulse to the DC electrode 231 through the DC power supply 101 and forms an electric field E4. The electric field E4 may be formed between the DC electrode 231 and an object that serves as a counter electrode. For example, the electric field E4 may be formed between the DC electrode 231 and a gas tube 211. The plasma generating device may form the electric field E4, induces local discharge (for example, streamer discharge), and supplies a seed charge into the dielectric tube.

Referring to FIG. 28, when the operation mode is the first mode, the plasma generating device generates a seed charge by applying a high-voltage pulse to the DC electrode 231 through the DC power supply 101, and performs initial plasma discharge through the first antenna module 203 based on the generated seed charge.

When the operation mode is the first mode, the plasma generating device performs plasma discharge through first antenna module based on the seed charge. The plasma discharge through the first antenna module may be capacitively coupled plasma discharge or inductively coupled plasma discharge. Herein, description is given for the case in which discharge through the first antenna module is capacitively coupled plasma discharge.

According to an embodiment, a plasma discharge state may change over time. The operation mode of the plasma generating device may be changed according to the change in the plasma discharge state. For example, plasma discharge according to the first mode may be mainly performed by a capacitively coupled mode (E-mode). However, when plasma is sufficiently generated by the capacitively coupled mode, a second electric field E2 that is an induced electric field in an azimuthal direction is formed inside the dielectric tube. When the second electric field E2 is formed, inductively coupled plasma discharge or generation of plasma by the inductively coupled mode (H-mode) is performed.

The plasma generating device may change the operation mode in response to the change in the plasma discharge state. Referring to FIG. 28, the plasma generating device may transmit the power signal having the first frequency f1 to the first antenna module 203 and the second antenna module 204 through the power supply 102, and may change the operation mode in response to the transition of the plasma discharge state.

The plasma generating device may detect the change in the plasma discharge. The plasma generating device may include a sensor module that acquires the current flowing through the first antenna module 203 and/or through the second antenna module 204, and/or the voltage applied to both ends of the first antenna module 203 and/or of the second antenna module 204. The plasma generating device may acquire, through the sensor module, the change in the current flowing through the first antenna module 203 and/or through the second antenna module 204, and/or in the voltage applied to the opposites ends of the first antenna module 203 and/or of the second antenna module 204, and may change the driving frequency and/or operation mode of the power supply 102.

For example, when the plasma discharge state is changed, the current flowing through the first antenna module 203 and/or through the second antenna module 204, and/or the voltage applied to both ends of the first antenna module 203 and/or of the second antenna module 204 is changed. For example, when a main plasma discharge state is changed from capacitively coupled plasma discharge to inductively coupled plasma discharge, the current flowing through the first antenna module 203 and/or through the second antenna module 204, and/or the voltage applied to both ends of the first antenna module 203 and/or of the second antenna module 204 is reduced.

In response to the reduction of the current flowing through the first antenna module 203 and/or through the second antenna module 204 and/or of the voltage applied to both ends of the first antenna module 203 and/or of the second antenna module 204, the plasma generating device may change the operation mode to the second mode.

When the operation of the plasma generating device is changed, the plasma generating device provides power at the driving frequency of a second frequency to the first antenna module 203 and the second antenna module 204, and operates the second antenna module 204 as a leading antenna module as described above in the embodiments.

Referring to (b) of FIG. 27, the DC power source 101 may stop supplying power in the second mode. In the second mode, the plasma generating device may provide power to the first antenna module 203 and the second antenna module 204, using the second frequency corresponding to the resonance frequency of the second antenna module 204 as a driving frequency, and may perform main plasma discharge.

Referring to FIG. 29, when the operation mode is the second mode, the plasma generating device uses the second frequency as a driving frequency and, based on initial discharge plasma generated by the first antenna module 203, performs main plasma discharge through the second antenna module 204.

Figure 30:
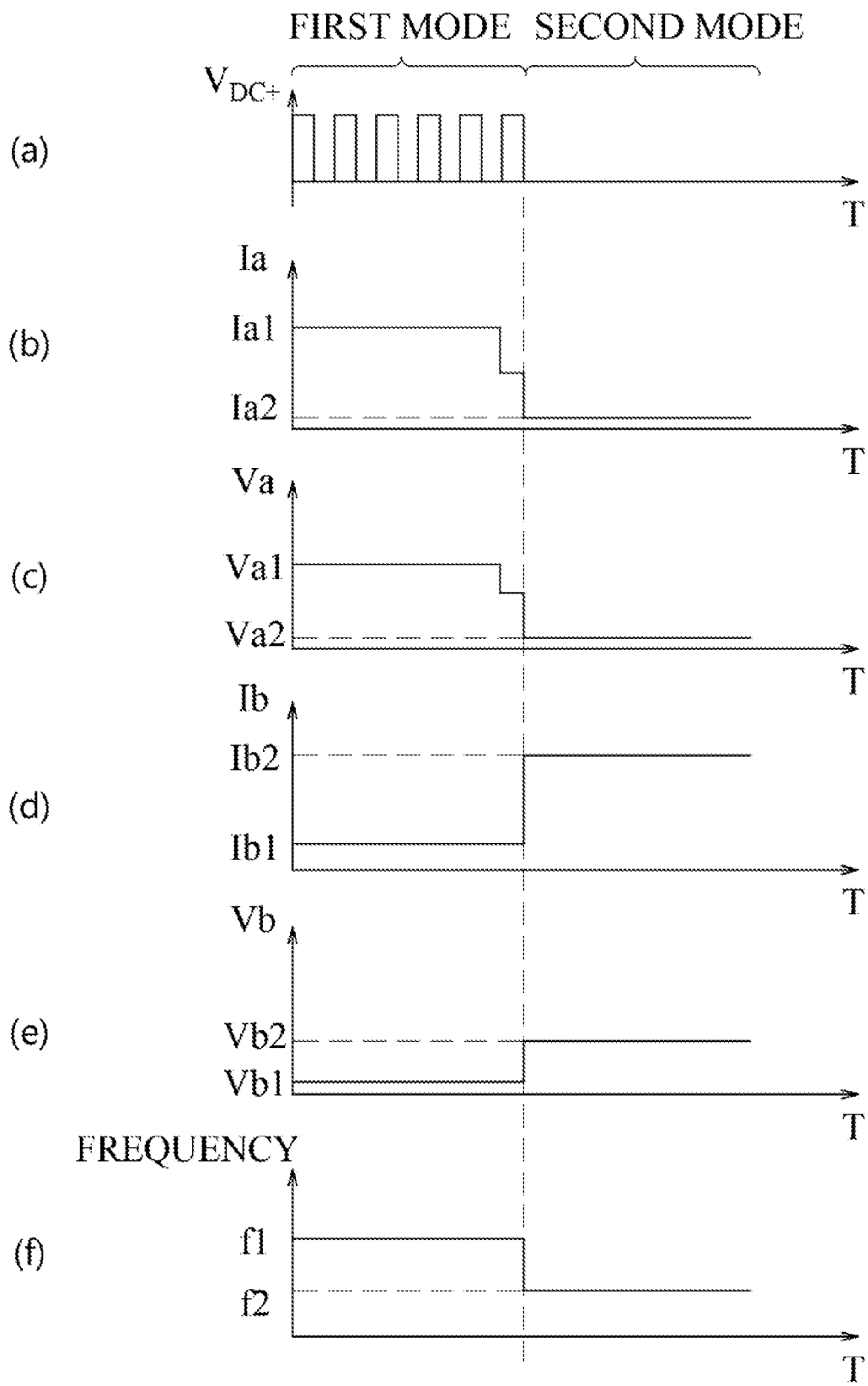
FIG. 30 is a diagram illustrating a plasma generation process according to an embodiment of the present disclosure.

FIG. 30 is a diagram illustrating voltage and current changes according to an operation mode of a plasma generating device. FIG. 30 is a diagram illustrating, over time, a DC high-voltage pulse, the current flowing through the first antenna module, the voltage at both ends of an inductive coil of the first antenna module, the current flowing through the second antenna module, the voltage at both ends of an inductive coil of the second antenna module, and a frequency, respectively. In FIG. 30, the current and voltage graphs show sizes.

Regarding (b), (c), (d), (e), (f) of FIG. 30, the contents described above with reference to FIG. 25 may be similarly applied to the current flowing through the first antenna module of the plasma generating device, the voltage at the both ends of the inductive coil of the first antenna module, the current flowing through the second antenna module, the voltage at the both ends of the inductive coil of the second antenna module, and the frequency.

Referring to (a) of FIG. 30, when the operation mode of the plasma generating device is the first mode, the DC power supply 101 generates a high-voltage pulse. The DC power supply 101 may generate a high-voltage pulse while the first mode is maintained (the driving frequency is maintained at the first frequency f1). The DC power supply 101 may stop generating a high-voltage pulse even before the first mode ends. The plasma generating device (or the controller of the plasma generating device) may control the DC power supply 101 such that a predetermined number of high-voltage pulses are generated. The plasma generating device may control the DC power supply 101 such that a high-voltage pulse is generated for a predetermined time.

Referring to (b) and (c) of FIG. 30, when the operation mode is the first mode, the current flowing through the first antenna module and/or the voltage at both ends of the inductive coil of the first antenna module is reduced because of the change in the plasma discharge state.

Referring to (d), (e), (f) of FIG. 28, in response to the reduction of the current flowing through the first antenna module and/or of the voltage at both ends of the inductive coil of the first antenna module, the plasma generating device changes the operation mode to the second mode. Referring to (a) of FIG. 30, when the operation mode of the plasma generating device is the second mode, the DC power source stops generating a high-voltage pulse.

In the meantime, in the above embodiments, description has been given for the case in which the operation mode is changed from the first mode to the second mode in response to the change in the plasma state, but the change in the operation mode may be performed in the reverse order.

3.2.2 Two Antennas and One Inverter

Figure 31:
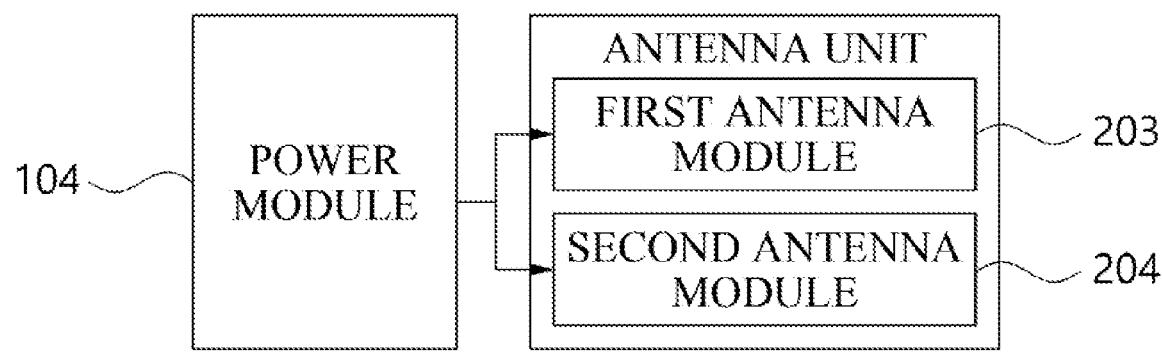
FIG. 31 is a diagram illustrating a plasma generating device according to an embodiment of the present disclosure.
Figure 31:
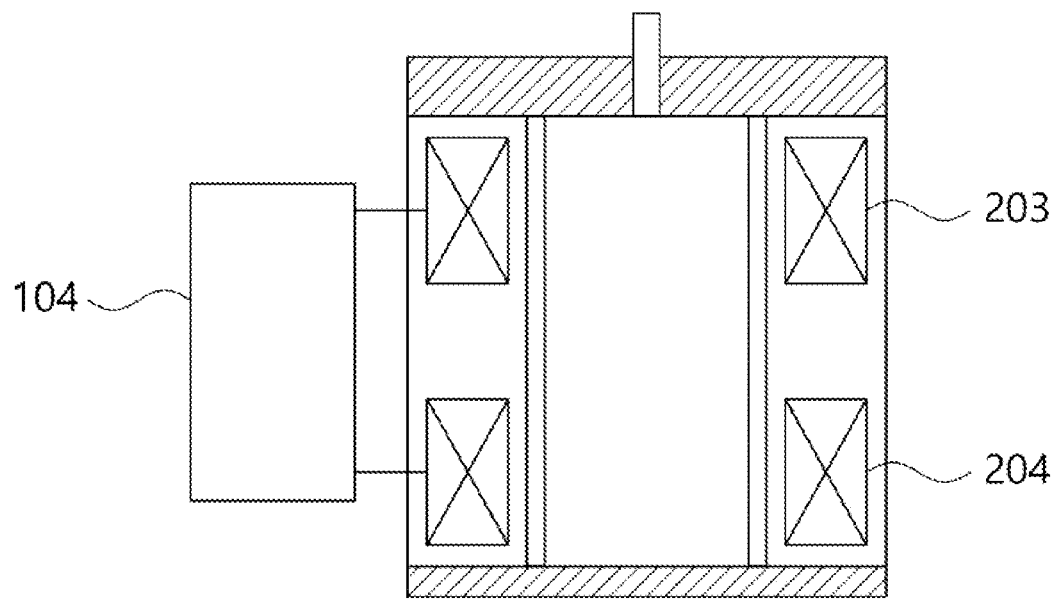

FIG. 31 is a diagram illustrating a plasma generating device according to an embodiment. Referring to FIG. 31, a plasma generating device may include a power module 104, a first antenna module 203, and a second antenna module 204.

The RF power module 104 may be an AC power source having a predetermined frequency-variable range. The power module 104 may operate using the resonance frequency of the first antenna module 203 and/or of the second antenna module 204 as a driving frequency.

A control method of a plasma generating device according to an embodiment may comprise: controlling the plasma generating device in the first mode through the power module; and controlling the plasma generating device in the second mode through the power module. The above description may be applied to the first mode and the second mode.

Figure 32:
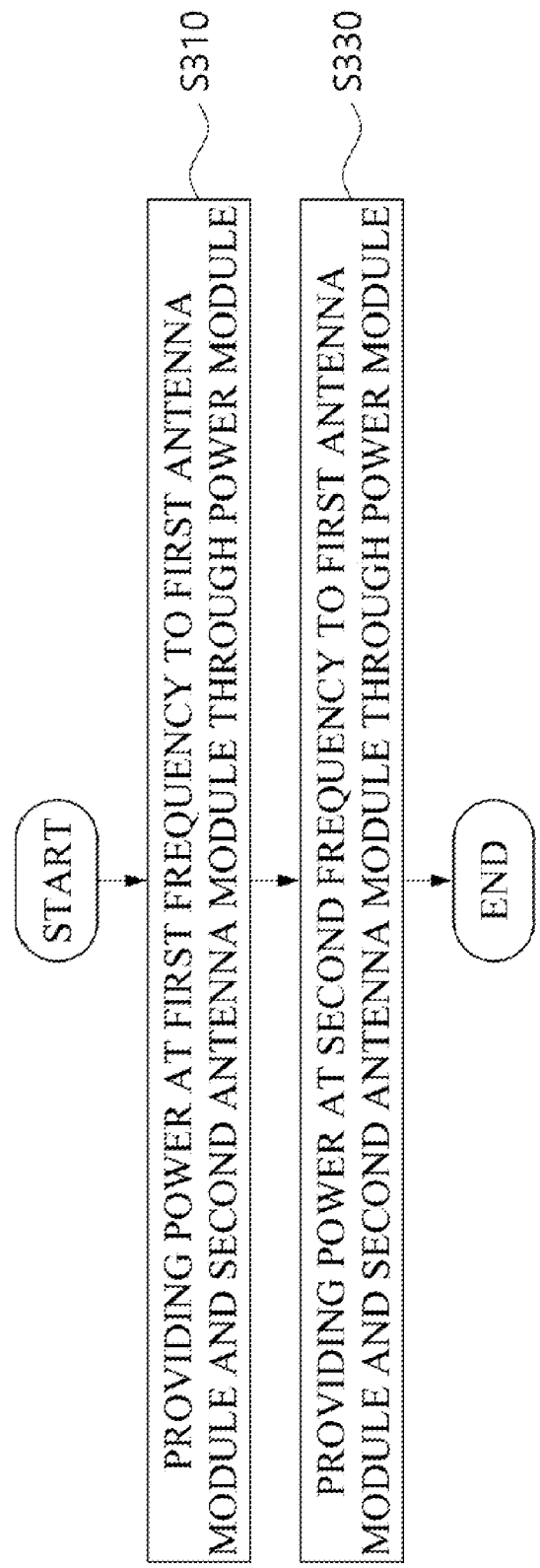
FIG. 32 is a diagram illustrating a control method of a plasma generating device according to an embodiment of the present disclosure.

FIG. 32 is a diagram illustrating a control method of a plasma generating device according to an embodiment.

Referring to FIG. 32, a control method of a plasma generating device according to an embodiment may comprise: providing power at a first frequency to a first antenna module and a second antenna module through a power module at step S310; and providing power at a second frequency to the first antenna module and the second antenna module through the power module at step S330.

The providing of the power at the first frequency to the first antenna module and the second antenna module through the power module at step S310 may include providing the power using the first frequency corresponding to a resonance frequency of the first antenna module as a driving frequency.

The first antenna module may be an antenna module including an interlayer capacitor. Herein, the voltage distribution of the first antenna module may appear as the example related to (a) of FIG. 26. Alternatively, the first antenna module may be an antenna module not including an interlayer capacitor. Herein, the power distribution of the first antenna module may appear as the example related to (a) of FIG. 16.

The providing of the power at the first frequency to the first antenna module and the second antenna module through the power module at step S310 may include inducing capacitively coupled plasma discharge through the first antenna module.

The providing of the power at the second frequency to the first antenna module and the second antenna module through the power module at step S330 may include providing the power using the second frequency corresponding to a resonance frequency of the second antenna module as a driving frequency.

The second antenna module may be an antenna module including an interlayer capacitor. Herein, the power distribution of the second antenna module may appear as the example related to (b) of FIG. 26.

The providing of the power at the second frequency to the first antenna module and the second antenna module through the power module at step S330 may include inducing inductively coupled plasma discharge through the second antenna module.

According to an embodiment, the control method of the plasma generating device may further comprise acquiring a change in the power signal. The control method of the plasma apparatus may include acquiring the change in the current flowing through the first antenna module or in the voltage at both ends of the first antenna module (or some elements constituting the first antenna module), and changing the driving frequency of the power module to the second frequency based on the acquired change.

3.2.3 Two Antennas and Two Inverters

Figure 33:
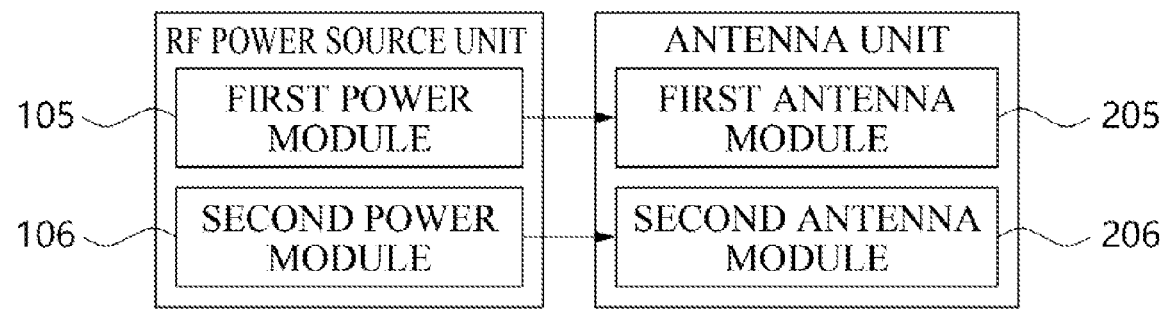
FIG. 33 is a diagram illustrating a plasma generating device according to an embodiment of the present disclosure.
Figure 33:
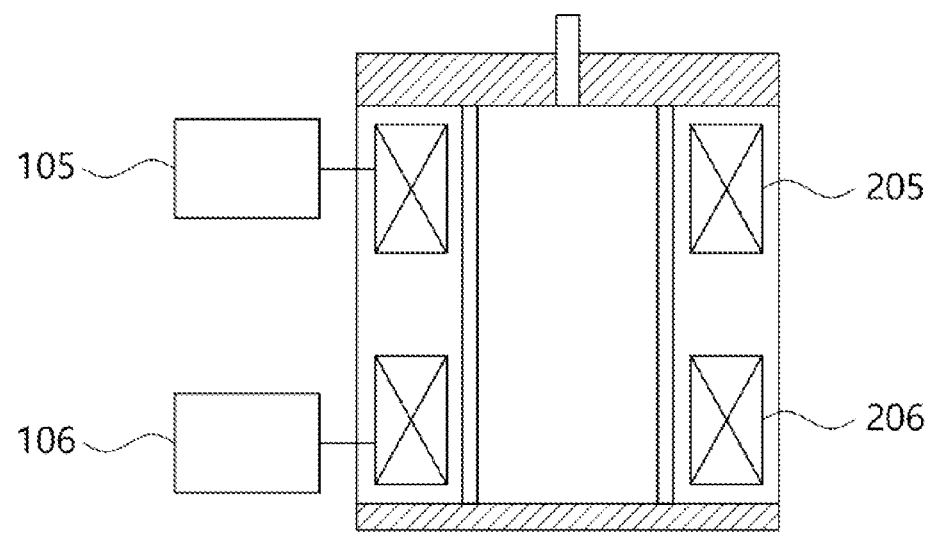

FIG. 33 is a diagram illustrating a plasma generating device according to an embodiment. Referring to FIG. 31, a plasma generating device according to an embodiment may include: a first power module 105 that is an AC power source having a first frequency band and a first matching range; a second power module 106 that is an AC power source having a second frequency band and a second matching range; a first antenna module 205 receiving power from the first power module 105 and performing plasma discharge; and a second antenna module 206 receiving power from the second power module 106 and performing plasma discharge.

The first power module 105 may have a first driving frequency range, and the second power module 106 may have a second driving frequency range that is at least partially different from the first driving frequency range. The first power module 105 may be driven at a first frequency within the first driving frequency range. The second power module 106 may be driven at a second frequency within the second driving frequency range. The first frequency may correspond to a resonance frequency of the first antenna module 205, and the second frequency may correspond to a resonance frequency of the second antenna module 206. The first power module 105 may include a first matching element. The second power module 106 may include a second matching element having impedance different from that of the first matching element.

A control method of a plasma generating device according to an embodiment may comprise: controlling the plasma generating device in the first mode through the first power module; and controlling the plasma generating device in the second mode through the second power module. The above description may be applied to the first mode and the second mode.

Figure 34:
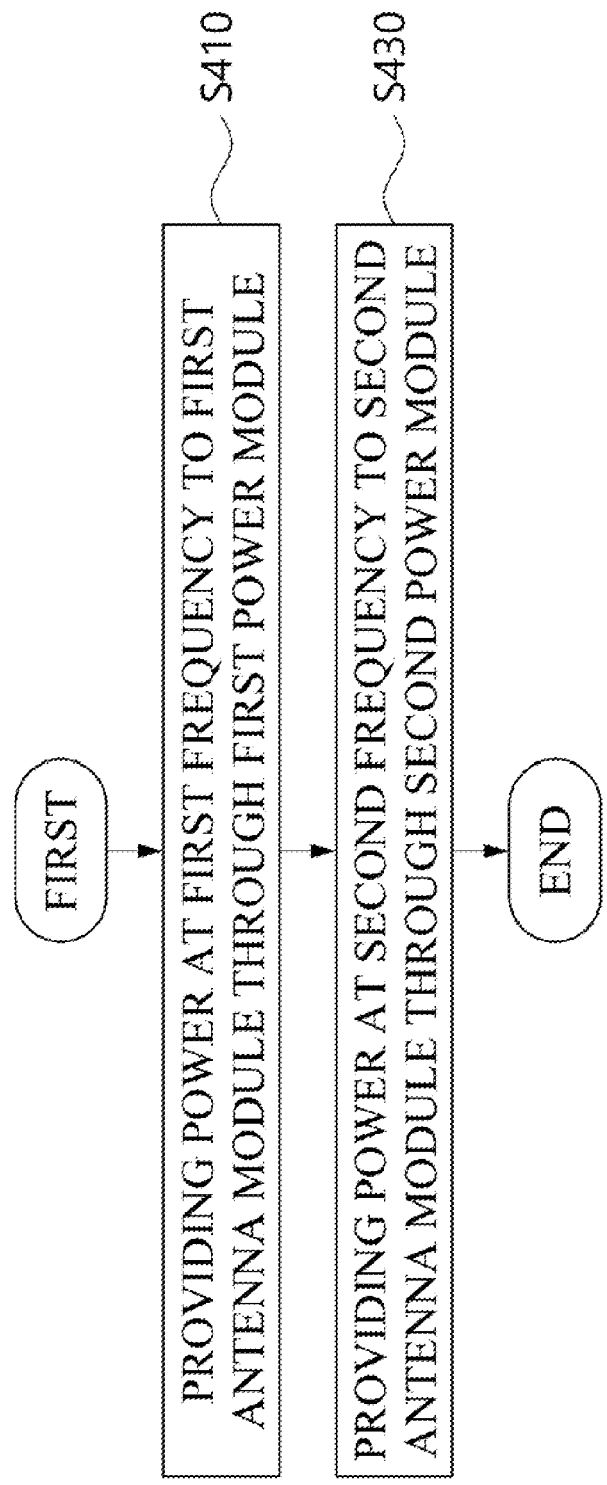
FIG. 34 is a diagram illustrating a control method of a plasma generating device according to an embodiment of the present disclosure.
Figure 35:
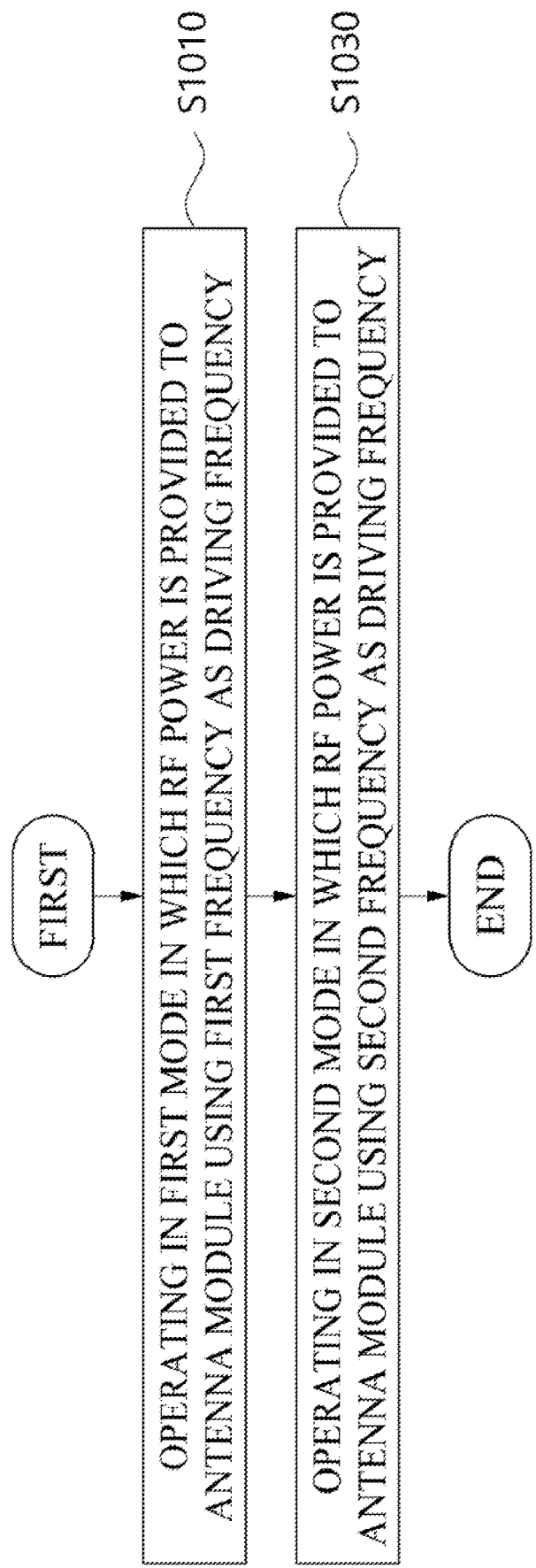
FIG. 35 is a diagram illustrating a control method of a plasma generating device according to an embodiment of the present disclosure.

FIG. 34 is a diagram illustrating a plasma generation method according to an embodiment.

Referring to FIG. 34, a control method of a plasma generating device according to an embodiment may comprise: providing power at a first frequency to a first antenna module through a first power module at step S410; and providing power at a second frequency to a second antenna module through a second power module at step S430.

The providing of the power at the first frequency to the first antenna module through the first power module at step S410 may include providing the first antenna module with the power at the first frequency that is a resonance frequency of the first antenna module through the first power module. Herein, the voltage distribution of the first antenna module may appear as the example related to (a) of FIG. 26.

The providing of the power at the first frequency to the first antenna module through the first power module at step S410 may include inducing capacitively coupled plasma discharge inside a dielectric tube through the first antenna module by operating at the first frequency as a driving frequency.

Alternatively, the providing of the power at the first frequency to the first antenna module through the first power module at step S410 may include inducing inductively coupled plasma discharge inside the dielectric tube through an induced electric field having a first intensity by providing the power at the first frequency to the first antenna module through the first power module.

The providing of the power at the second frequency to the second antenna module through the second power module at step S430 may include providing the second antenna module with the power at the second frequency that is a resonance frequency of the second antenna module through the second power module. Herein, the power distribution of the second antenna module may appear as the example related to (b) of FIG. 26.

The providing of the power at the second frequency to the second antenna module through the second power module at step S430 may include inducing inductively coupled plasma discharge inside the dielectric tube through the second antenna module by operating at the second frequency as a driving frequency.

The providing of the power at the second frequency to the second antenna module through the second power module at step S430 may include forming an induced electric field having a second intensity inside the dielectric tube and inducing inductively coupled plasma discharge by operating at the second frequency as a driving frequency. The second intensity may be higher or lower than the first intensity of the electric field induced by the first power module.

According to an embodiment, the control method of the plasma generating device may further include acquiring a change in the power signal. The control method of the plasma apparatus may include acquiring the change in the current flowing through the antenna module or in the voltage at both ends of the antenna module (or some elements constituting the antenna module). The control method of the plasma apparatus may include acquiring the above-described change and controlling the first power module and/or the second power module based on the change. For example, the control method of the plasma apparatus acquiring the drop in the current flowing through the first antenna module or in the voltage at both ends of the first antenna module (or some elements constituting the first antenna module, and stopping the operation of the first power module and starting the operation of the second power module based on the drop.

As described in the above embodiment, by using multiple antenna modules having different discharge characteristics, plasma discharge is performed selectively according to various discharge environments. There is provided a plasma generating device that performs plasma discharge by using multiple antenna modules, thereby being capable of performing discharge in various environments.

4. By-Product-Inhibited Plasma Generating Device

In the meantime, by the voltage applied to an antenna coil wound around a tube, a by-product may be formed other than a desired product. For example, an electric field having a direction component perpendicular to the tube is formed by the voltage applied to the coil, so that the plasma generated inside the tube is accelerated toward the inner wall of the tube and collides with the inner wall of the tube and a by-product separated from the inner wall of the tube due to collision is mixed with a plasma product (for example, radicals).

Hereinafter, a plasma generating device and a control method thereof for inhibiting production of a by-product according to several embodiments will be described.

4.1 Antenna Module

A plasma generating device according to an embodiment may include an antenna module that is designed to minimize production of a by-product.

The antenna module may include one or more unit antennas and unit capacitors. The antenna module may be provided around a plasma dielectric tube (see FIG. 4, FIG. 6).

The antenna module may include one or more unit antennas provided to fit into the plasma dielectric tube. The unit antennas may be provided spaced apart from each other at predetermined intervals in a length direction of the tube. The unit antennas may be provided spaced apart from each other in the length direction of the tube and may be provided around the central axis of the tube (for example, see FIG. 10 and related description thereto). The unit antennas may be inductors having inductance. The unit antennas may have the same inductance.

Each of the unit antennas may include unit turns. Each unit antenna may include: a first turn that is in contact with the dielectric tube; and a second turn located further away from the dielectric tube than the first turn does. The first turn and the second turn may be located on the same plane. The first turn and the second turn may be located on the plane perpendicular to the length direction of the dielectric tube. For example, a unit antenna module according to an embodiment may be provided as shown in FIG. 12.

The antenna module may comprise one or more unit capacitors connected to the unit antennas. The unit capacitors may be connected to the unit antennas and may be provided between the unit antennas. The unit capacitors may be provided between the unit antennas and a power source. For example, the unit capacitors may be provided as shown in FIG. 8 or FIG. 10. The one or more unit capacitors included in the antenna module may have the same capacitance. Alternatively, the one or more unit capacitors included in the antenna module may have different capacitances.

The antenna module may be connected to the power source, receive power from the power source, and provide plasma discharge inside a dielectric tube. The contents described in the present disclosure may be similarly applied to operation of power supply and plasma discharge.

Figure 36:
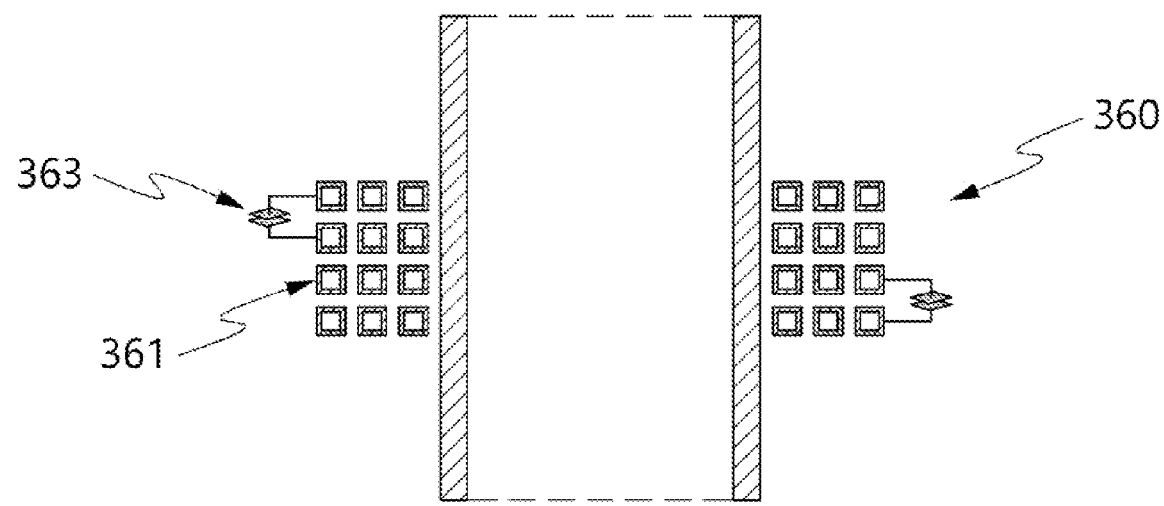
FIG. 36 is a diagram illustrating an antenna module according to an embodiment of the present disclosure.

FIG. 36 is a diagram illustrating an antenna module according to an embodiment.

An antenna module 360 may include one or more unit antennas 361 and one or more unit capacitors 363. The antenna module 360 may be provided around a dielectric tube. The antenna module 360 may include the one or more unit antennas 361 having the same shape. The unit antennas may be connected to the unit capacitors 363. The unit capacitors included in the antenna module 360 may be interlayer capacitors provided between the unit antennas 361, or terminal capacitors provided between the unit antennas and a power source. The antenna module may be connected to the power source and may receive power.

For example, the antenna module 360 may include: a first terminal capacitor connected to the power source; a first unit antenna connected to the first terminal capacitor; a first interlayer capacitor connecting the first unit antenna with a second unit antenna; the second unit antenna located below the first unit antenna; a second interlayer capacitor connecting the second unit antenna with a third unit antenna; the third unit antenna located below the second unit antenna; a third interlayer capacitor connecting the third unit antenna with a fourth unit antenna; and the fourth unit antenna located below the third unit antenna and connected to the power source. The unit antennas are provided in the form shown in FIG. 37, and may be provided in a round manner.

In FIG. 36, description is given for the case in which an antenna module includes four unit antennas, but this is only an example, and the number of unit antennas and/or unit capacitors may be changed. The contents described in the present disclosure may be similarly applied to the antenna module 360.

4.2 Configuration of Antenna Module

Hereinafter, a unit antenna and a unit capacitor constituting an antenna module according to an embodiment will be described.

Figure 37:
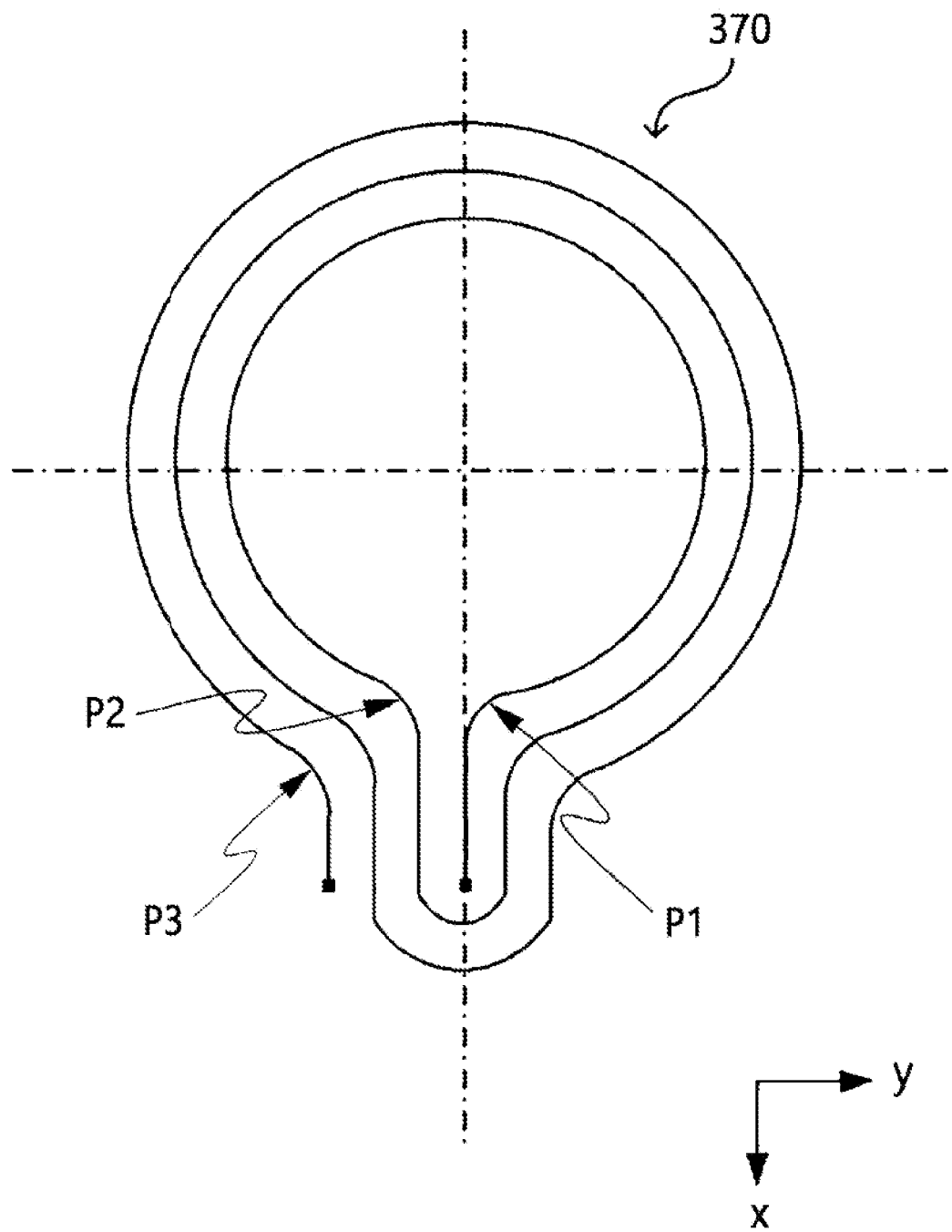
FIG. 37 is a diagram illustrating a unit antenna according to an embodiment of the present disclosure.

FIG. 37 is a diagram illustrating a unit antenna according to an embodiment. Referring to FIG. 37, a unit antenna may include at least two unit turns. The unit antenna may include two unit turns provided on the same plane and have the shape of a concentric circle (concentric arc). The unit antenna may include: a first unit turn located inside and having a smaller radius; and a second unit turn located outside and having a larger radius than the first unit turn. The first unit turn may be in contact with a dielectric tube in a state in which an antenna module is engaged with the dielectric tube. The unit antenna may include a connection part connecting the unit turns.

Referring to FIG. 37, a unit antenna may include: a first turn located on the innermost side; a second turn located outside the first turn; and a third turn located outside the second turn. The first turn and the second turn may be connected to each other through a first connection part. The second turn and the third turn may be connected to each other through a second connection part. The first turn may extend from a first point P1 to a second point P2 in an arc shape. The third turn located on the outermost side may have a third point P3 farthest from the first point, and the unit antenna may be connected from the first point to the third point.

In the meantime, the shape of the unit antenna shown in FIG. 37 is only an example, and examples of the antenna module may include a unit antenna of another shape. For example, FIG. 37 shows that an antenna module includes three turns, but an antenna module may include more or fewer than three turns.

Referring to FIGS. 36 and 37 together, the first terminal capacitor may be connected between the first point of the first unit antenna and the power source. The first interlayer capacitor may be connected between the third point of the first unit antenna and the first point of the second unit antenna. The second interlayer capacitor may be connected between the third point of the second unit antenna and the first point of the third unit antenna.

The unit capacitors may have a fixed capacitance or a variable capacitance. The unit antennas may have a fixed inductance or a variable inductance. The capacitance of the capacitor included in the antenna module or the inductance of the inductor included in the antenna module may be determined considering the arrangement of the antenna module with respect to the tube. The capacitance of the capacitor included in the antenna module or the inductance of the inductor included in the antenna module may be determined considering the arrangement of the antenna module in which each capacitor or inductor is connected. Considering the arrangement of the antenna module, the capacitors and/or the unit antennas, the antenna module may include a capacitor having capacitance determined to minimize by-product production or a unit antenna having inductance determined to minimize by-product production.

According to an embodiment, the interlayer capacitors may have a fixed capacitance, and the terminal capacitors may have a variable capacitance. Alternatively, the one or more interlayer capacitors may have the same capacitance, and the terminal capacitors may have capacitance different from the capacitance of the interlayer capacitors. For example, the interlayer capacitors may have a first capacitance, the first terminal capacitor may have a second capacitance different from the first capacitance, and the second terminal capacitor may have a third capacitance different from the second capacitance.

The capacitance value of the unit capacitors may be determined to minimize a by-product generated when plasma discharge is performed. When plasma discharge is performed, an electric field having a direction component perpendicular to the inner wall of the dielectric tube is formed by the voltage applied to the antenna, and thus plasma collides with the inner wall of the dielectric tube and a by-product is generated. The capacitance of the unit capacitors may be determined to minimize the influence of the voltage formed by the antenna to the plasma inside the dielectric tube.

For example, the capacitance of the terminal capacitors located at the both ends of the antenna module is set to be different from the capacitance of the interlayer capacitors, so that by-product production caused by the voltage applied to the antenna module is minimized. For example, by configuring the capacitances of the terminal capacitors asymmetrically, the electric potential at one point of the unit turn closest to a discharge tube among the unit turns constituting a unit antenna is minimized, so that by-product production caused by collision of plasma is minimized. That is, the maximum value (absolute value) of the electric potential at any point within the unit turn closest to the dielectric tube is minimized, thereby minimizing by-product production caused by collision of plasma. That is, by minimizing the voltage, to the ground, at any point within the unit turn closest to the dielectric tube, by-product production caused by collision of plasma is minimized.

Referring to FIGS. 36 and 37, in order to minimize by-product production, the absolute value voltage VR of the electric potential of a reactance component between the first point P1 and the second point P2 of the unit antenna may be minimized. That is, the voltage applied to the reactance component of the first turn located on the innermost side is minimized so that the voltage component in the direction perpendicular to the inner wall of the dielectric tube is minimized, thereby reducing by-product production.

The voltage (or electric potential) of the reactance component between the points may mean the voltage (or electric potential difference at both ends) applied to the total reactance component between the points.

According to an embodiment, the capacitance (capacitance of the capacitor connected to the first point P1 of the first turn) of the first terminal capacitor may be greater than the capacitance of the second terminal capacitor. The capacitance of the first terminal capacitor may be greater than the capacitance of the interlayer capacitors. The capacitance (capacitance of the capacitor connected to the third point P3 of the third turn) of the second terminal capacitor may be smaller than the capacitance of the interlayer capacitors. The total capacitance value of the first terminal capacitor and the second terminal capacitor may be the same as the capacitance value of the interlayer capacitors.

By appropriately adjusting the capacitance of the first terminal capacitor and the capacitance of the second terminal capacitor, the absolute values of the electric potentials at the first point P1 and the second point P2 are adjusted to be similar. By adjusting the absolute values of the voltages applied to the first point P1 and the second point P2 to be similar, the absolute value of the electric potential of the reactance component of the first turn located on the innermost side is minimized, thereby reducing by-product production.

According to another embodiment, in order to assist plasma discharge generation, the capacitance of the terminal capacitors may be changed such that the absolute value of the electric potential of the reactance component of the unit turn located on the innermost side is maximized.

For example, in order to assist plasma discharge, the absolute value VR of the electric potential of the reactance component between the first point P1 and the second point P2 of the unit antenna may be maximized. That is, by maximizing the absolute value of the electric potential of the reactance component of the first turn located on the innermost side, capacitively coupled discharge is induced inside the dielectric tube and discharge is assisted. To assist discharge, the capacitance of the first terminal capacitor may be set to be smaller than the capacitance of the second terminal capacitor. The capacitance of the first terminal capacitor may be smaller than the capacitance of the interlayer capacitors. The capacitance of the second terminal capacitor may be greater than the capacitance of the interlayer capacitors. The total capacitance value of the first terminal capacitor and the second terminal capacitor may be the same as the capacitance value of the interlayer capacitors.

According to an embodiment, an antenna module coupled to a dielectric tube and receiving power from a power source may be provided. The antenna module may include a first unit antenna including: a first unit turn extending from a first point to a second point; and a second unit turn extending from a third point to a fourth point. The first unit turn may be located on the inside of the second unit turn, and the second point may be connected to the third point. Each of the unit turns may extend in an arc shape or a circular shape. The unit turns may extend in an arc shape having the same central angle.

The antenna module may include: a first capacitor connected to the first point of the first unit turn and connected between a first terminal of the power source and the first point; and a second capacitor connected between a second terminal of the power source and the fourth point.

In order to minimize tube damage and by-product production due to the voltage applied to the antenna module, the capacitance of the second capacitor may be smaller than the capacitance of the first capacitor. In order to minimize tube damage and by-product production by minimizing the voltage applied to the reactance component of the first unit turn (the turn located on the innermost side of the first unit antenna) connected to the first capacitor, the capacitance of the second capacitor may be smaller than the capacitance of the first capacitor.

The capacitance of the first capacitor may be greater than twice the capacitance of the second capacitor. The capacitance of the first capacitor may be greater than twice the capacitance of the second capacitor so that the voltage applied to the reactance component of the first unit turn is minimized.

The antenna module may include a third capacitor connected between the fourth point of the second unit turn and the second capacitor. The capacitance of the third capacitor may be smaller than the capacitance of the second capacitor.

The total capacitance of the capacitance of the first capacitor and the capacitance of the second capacitor may correspond to the capacitance of the third capacitor. The total capacitance of the capacitance of the first capacitor and the capacitance of the second capacitor may be substantially the same as the capacitance of the third capacitor.

The antenna module may further include a second unit antenna including: a third unit turn extending from a fifth point to a sixth point; and a fourth unit turn extending from a seventh point to an eighth point. The third unit turn may be located on the inside of the fourth unit turn, and the sixth point may be connected to the seventh point. The third capacitor may be connected between the fourth point and the fifth point. The second capacitor may be connected between the eighth point and the second terminal of the power source.

In order to minimize tube damage and by-product production by minimizing the voltage applied to the reactance component of the first unit turn (the turn located on the innermost side of the first unit antenna) connected to the first capacitor, the capacitance of the third capacitor may be smaller than the capacitance of the second capacitor.

The first unit turn and the second unit turn may be located on the plane perpendicular to the length direction of the dielectric tube. The first unit turn may extend from the first point to the second point in a first direction, and the second unit turn may extend from the third point to the fourth point in the first direction similarly to the first unit turn.

The first point may be located closer to the tube than the fourth point does. The first point may correspond to P1 shown in FIG. 37. The fourth point may correspond to P3 shown in FIG. 37.

When power is applied to the antenna module, the voltage applied to the reactance component of the first capacitor is lower than the voltage applied to the reactance component between the first point and the second point, and the voltage applied to the reactance component of the third capacitor corresponds to the voltage applied to the reactance component between the first point and the fourth point.

The antenna module may resonate at the resonance frequency that is determined based on the capacitance of the third capacitor and the inductance of the first unit antenna. When the antenna module is in the resonance state, a point at which the electric potential for the first terminal becomes 0 is located at the first unit turn of the first unit antenna. The point may be a point at which the electric potential of the reactance component between the first terminal and the point is 0. The point may be a point at which the voltage applied to the reactance component between the first terminal and the point is 0.

The antenna module may resonate at the resonance frequency that is determined based on the capacitance of the third capacitor and the inductance of the first unit antenna. When the antenna module is in the resonance state, the voltage applied to the reactance component between the first point and the first terminal is substantially the same as the voltage applied to the reactance component between the second point and the first terminal.

According to another embodiment, an antenna module coupled to a dielectric tube and receiving power from a power source may be provided, the antenna module including a first unit antenna, a first capacitor, and a second capacitor.

The first unit antenna may include: a first unit turn extending from a first point to a second point; and a second unit turn extending from a third point to a fourth point. The first unit turn may be located on the inside of the second unit turn, and the second point may be connected to the third point.

The antenna module may include the first capacitor connected between a first terminal of the power source and the first point of the first unit turn.

The antenna module may include the second capacitor connected to the fourth point of the second unit turn.

The first capacitor may be connected between the first terminal of the power source and the first point.

When power is supplied to the antenna module, a point at which the voltage becomes the lowest at the first unit antenna is located at the first unit turn. The point may be a point at which the voltage of the reactance component between the first terminal and the point is 0.

The antenna module may resonate at the resonance frequency that is determined based on the capacitance of the second capacitor and the inductance of the first unit antenna.

When the antenna module is in the resonance state, a point at which the voltage becomes the lowest at the first unit antenna is located at the first unit turn.

When power is supplied to the antenna module, a point at which the voltage becomes the lowest at the first unit antenna is located at the first unit turn.

When power is supplied to the antenna module, a point at which the absolute value of the electric potential of the reactance component becomes lowest at the first unit antenna is located at the first unit turn.

The capacitance of the first capacitor may be greater than twice the capacitance of the second capacitor.

In order to minimize tube damage and by-product production due to the voltage applied to the antenna module, the capacitance of the second capacitor may be smaller than the capacitance of the first capacitor.

The antenna module may further include a second unit antenna including: a third unit turn extending from a fifth point to a sixth point; and a fourth unit turn extending from a seventh point to an eighth point. The third unit turn may be located on the inside of the fourth unit turn, and the sixth point may be connected to the seventh point.

The second capacitor may be connected between the fourth point and the fifth point.

A third capacitor connected between the eighth point and the second terminal of the power source may be further included.

The capacitance of the second capacitor may be smaller than the capacitance of the third capacitor.

The total capacitance of the capacitance of the first capacitor and the capacitance of the third capacitor may correspond to the capacitance of the second capacitor. The total capacitance of the capacitance of the first capacitor and the capacitance of the third capacitor may be substantially the same as the capacitance of the second capacitor.

According to another embodiment, an antenna module coupled to a dielectric tube and receiving power from a power source may be provided, the antenna module including a first unit antenna, a first capacitor, and a second capacitor.

The first unit antenna may include: a first unit turn extending from a first point to a second point; and a second unit turn extending from a third point to a fourth point. The first unit turn may be located on the inside of the second unit turn, and the second point may be connected to the third point.

The first capacitor may be connected to the first point of the first unit turn and may be connected between a first terminal of the power source and the first point.

The second capacitor may be connected between a second terminal of the power source and the fourth point. The capacitance of the second capacitor may be different from the capacitance of the first capacitor.

The antenna module may further include a third capacitor connected between the fourth point of the second unit turn and the second capacitor.

In the meantime, the antenna module may further include a second unit antenna including: a third unit turn extending from a fifth point to a sixth point; and a fourth unit turn extending from a seventh point to an eighth point. The third unit turn may be located on the inside of the fourth unit turn, and the sixth point may be connected to the seventh point.

The third capacitor may be connected between the fourth point and the fifth point. The second capacitor may be connected between the eighth point and the second terminal of the power source.

The total capacitance of the capacitance of the first capacitor and the capacitance of the second capacitor may correspond to the capacitance of the third capacitor. The total capacitance of the capacitance of the first capacitor and the capacitance of the second capacitor may be substantially the same as the capacitance of the third capacitor.

Figure 38:
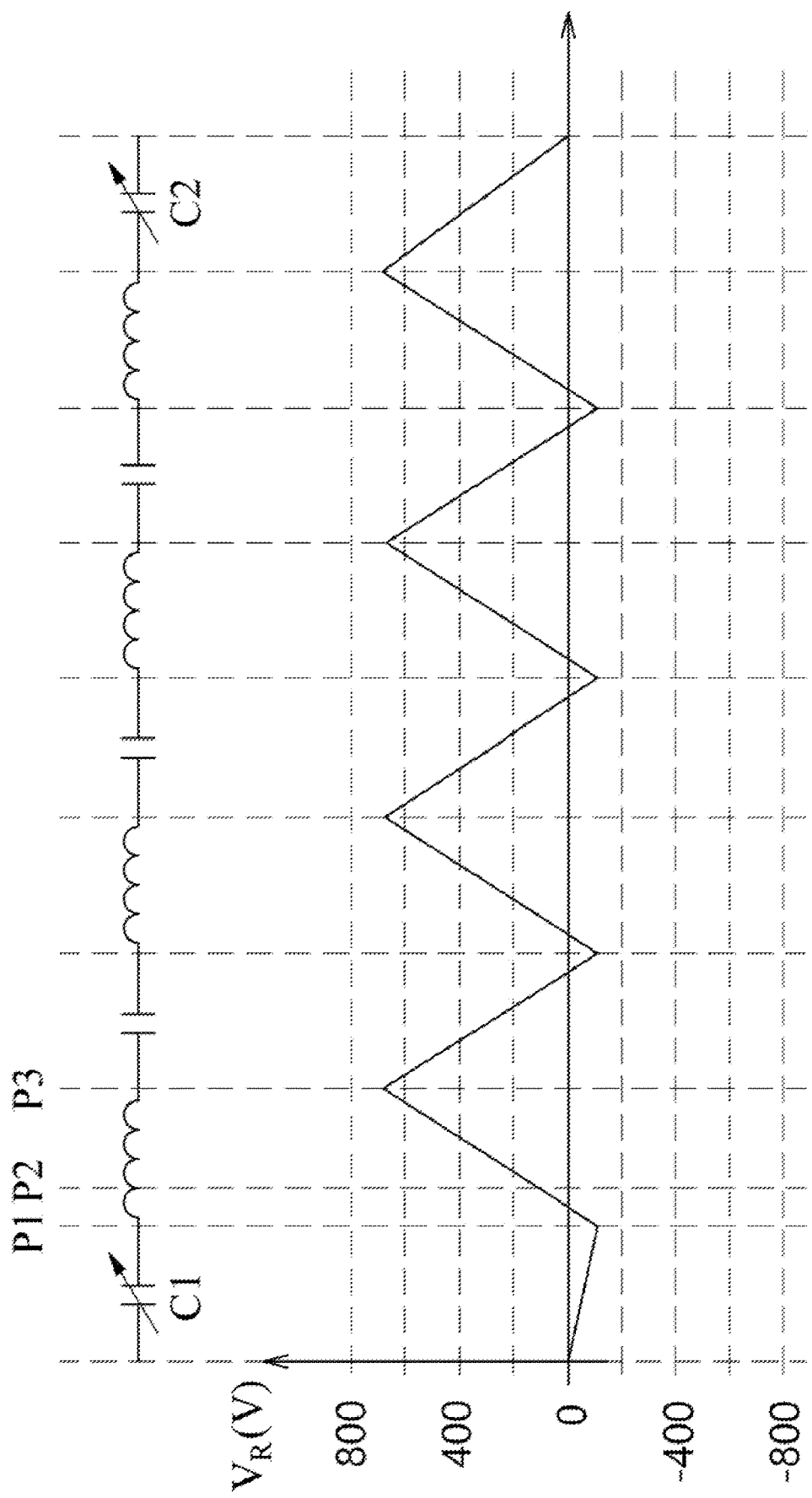
FIG. 38 is a diagram illustrating a voltage applied to an antenna module according to an embodiment of the present disclosure.
Figure 39:
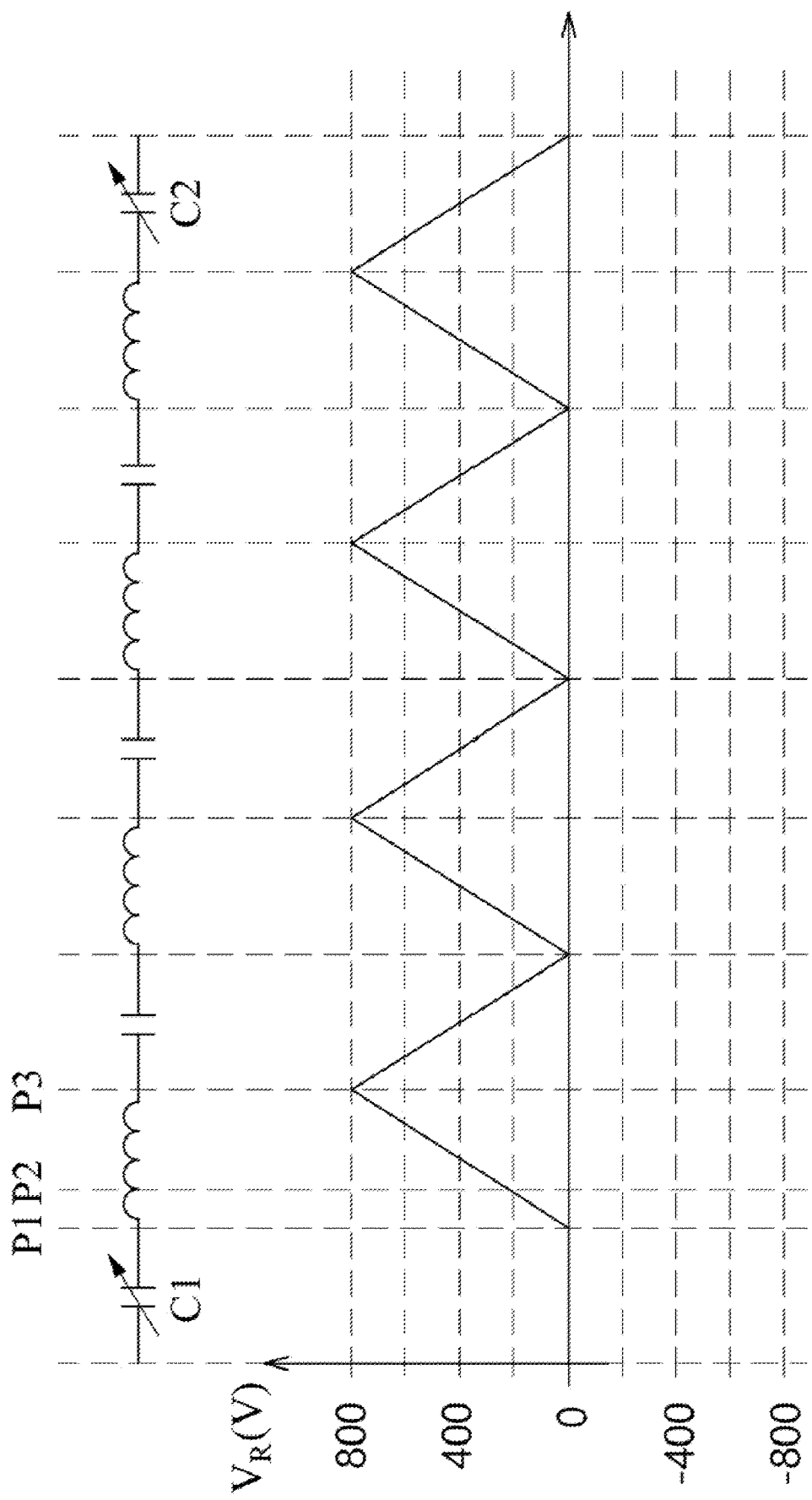
FIG. 39 is a diagram illustrating a voltage applied to an antenna module according to an embodiment of the present disclosure.
Figure 40:
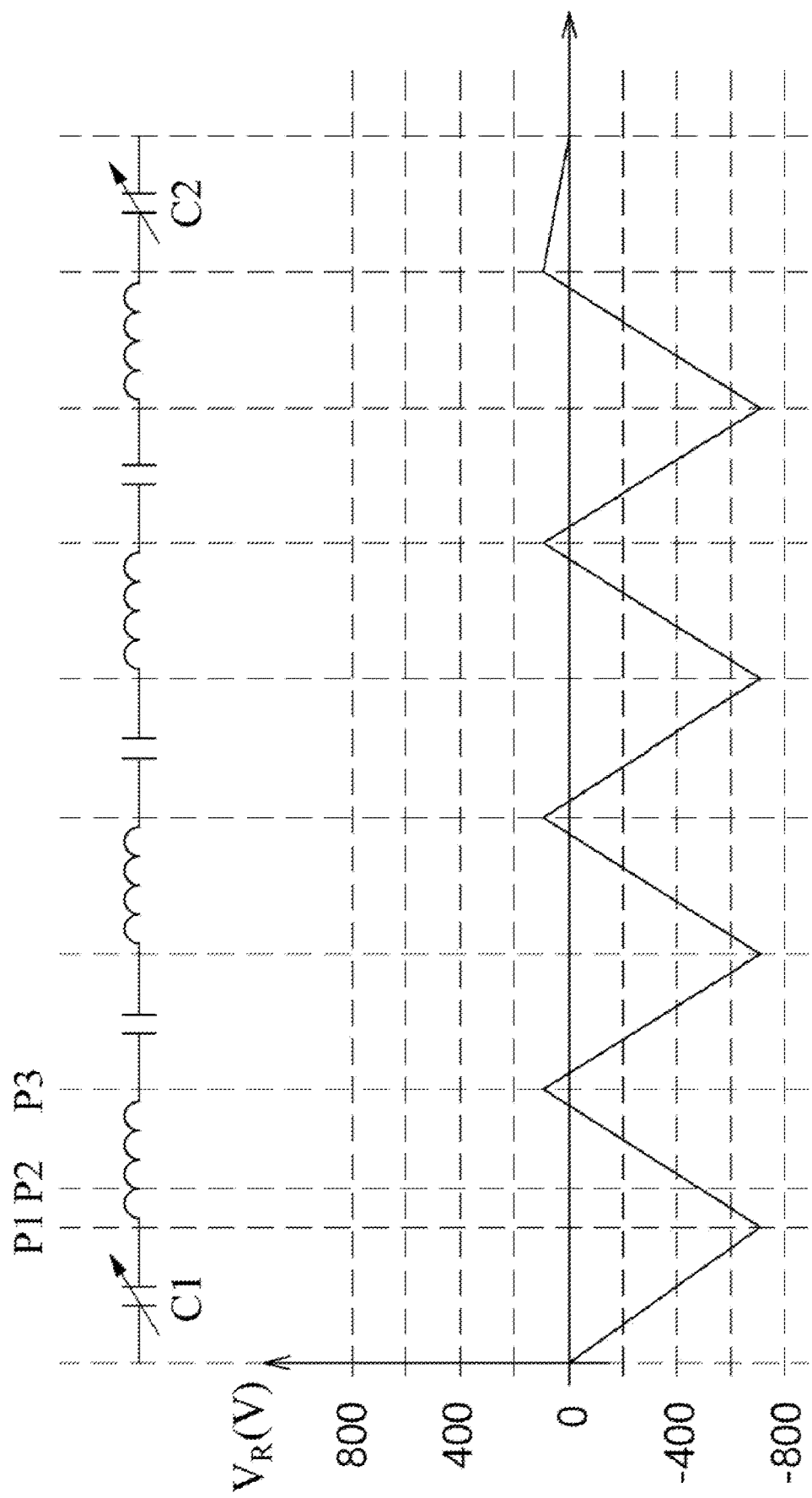
FIG. 40 is a diagram illustrating a voltage applied to an antenna module according to an embodiment of the present disclosure.

The capacitance of the first capacitor, the capacitance of the second capacitor, and the capacitance of the third capacitor may be understood similarly to the description of FIGS. 38 to 40.

4.3 Voltage Distribution During Plasma Discharge Operation

Hereinafter, an absolute value of an electric potential of a reactance component of a unit antenna according to capacitance of terminal capacitors will be described.

FIG. 38 is a diagram illustrating electric potential distribution applied to an antenna module according to an embodiment.

FIG. 38 is a diagram illustrating an antenna module and an electric potential of a reactance component of the antenna module according to an embodiment. FIG. 38 simply shows the voltage applied to a reactance component of the antenna module when capacitance of a first terminal capacitor C1 is greater than capacitance of a second terminal capacitor C2, under the condition of a frequency of about 3 MHz and a current of 20 A. Herein, the electric potential at a first point P1 measured −100 V, and the electric potential at a second point P2 measured 100 V.

During plasma discharge, in order to minimize a by-product that is produced because of collision of plasma with the dielectric tube due to both an electric field formed by the antenna and capacitive coupling of plasma, the capacitance of the terminal capacitors may be appropriately adjusted. FIG. 38 simply shows an antenna module of which capacitance of the terminal capacitors is determined to minimize a by-product, and an electric potential of a reactance component of the antenna module.

Compared with FIG. 11, the antenna module shown in FIG. 11 is provided such that the total capacitance of the opposite terminal capacitors corresponds to the capacitance of an interlayer capacitor, which is similar to the antenna module shown in FIG. 38. However, there is a difference with the antenna module shown in FIG. 38 because the capacitances of the opposite terminal capacitors are realized to be equal to each other in FIG. 11.

The antenna module shown in FIG. 11 may be designed such that the voltage (that is, the voltage applied between the ends of the antenna) applied to a reactance component of an antenna is canceled and the voltage applied to a reactance component of a terminal capacitor corresponds to half the voltage applied to a reactance component of a unit antenna. However, in the antenna module shown in FIG. 38, the capacitances of the opposite terminal capacitors may be set to be different from each other so that the electric potential of a reactance component corresponding to the innermost turn of a unit antenna of the antenna module is the minimum.

The antenna module shown in FIG. 38 may be configured such that the voltage applied to the reactance component of the first terminal capacitor C1 is different from the voltage applied to the reactance component of the second terminal capacitor C2.

The antenna module according to an embodiment may be configured such that the voltage applied to the reactance component of the first terminal capacitor C1 connected to the innermost turn of the first unit antenna is lower than the voltage applied to the reactance component of the second terminal capacitor C2 connected to the outermost turn of the second unit antenna.

The antenna module according to an embodiment may be configured such that the capacitance of the first terminal capacitor C1 connected to the innermost turn of the first unit antenna is greater than the capacitance of the second terminal capacitor C2 connected to the outermost turn of the second unit antenna.

The antenna module according to an embodiment may be provided such that the size of the electric potential of the reactance component of the innermost turn of the first unit antenna connected to the first terminal capacitor having a first capacitance is smaller than the size of the electric potential of the reactance component of the outermost turn of the second unit antenna connected to the second terminal capacitor having a second capacitance smaller than the first capacitance.

The antenna module according to an embodiment may be provided such that the size of the electric potential of the reactance component of the first unit turn located on the innermost side of the unit antenna is smaller than the size of the electric potential of the reactance component of the second unit turn located on the outermost side of the unit antenna.

In the antenna module according to an embodiment, the point at which in relation to the power source (for example, the end of the first terminal capacitor not connected to the unit antenna, or the ground), the electric potential difference is the minimum is located at the first unit turn located on the innermost side of the unit antenna, and the point at which in relation to the power source, the electric potential difference is the maximum is located at the second unit turn located on the outermost side of the unit antenna. Referring to FIG. 38, the antenna module may be provided such that the point (that is, the point at which in relation to voltage, the electric potential difference is the minimum) at which the electric potential of the reactance component in the unit antenna is 0 is closer to the first terminal capacitor C1 or the power source, compared to FIG. 10. That is, the capacitance of the terminal capacitors may be adjusted such that the point at which the electric potential is 0 is located at the innermost turn of the unit antenna (that is, between the first point P1 and the second point P2). Through this, it is possible to reduce the damage to the dielectric tube caused by the voltage applied to the innermost turn closest to the dielectric tube and to reduce by-product production due to the damage.

FIG. 39 simply shows an antenna module and the voltage applied to a reactance component of the antenna module according to another embodiment. FIG. 39 simply shows the voltage applied to a reactance component of the antenna module when a first terminal capacitor C1 is omitted, under the condition of a frequency of about 3 MHz and a current of 20 A. Herein, the electric potential at a first point P1 measured 0 V, and the electric potential at a second point P2 measured 200 V.

The antenna module shown in FIG. 39 is described for the case in which a first terminal capacitor C1 is omitted and capacitance of a second terminal capacitor C2 is the same as capacitance of interlayer capacitors. Referring to FIG. 39, the voltage applied to a reactance component of a first unit turn (innermost turn) extending from the first point P1 to the second point P2 may be higher than the voltage applied to a reactance component of the first turn of the antenna module shown in FIG. 38.

Referring to FIGS. 38 and 39, it is found that an absolute value of an electric potential at a point of a reactance component of an innermost turn is reduced by appropriately determining a value of a first terminal capacitor.

FIG. 40 simply shows an antenna module and the voltage applied to a reactance component of the antenna module according to still another embodiment.

FIG. 40 simply shows the voltage applied to a reactance component of the antenna module when capacitance of a first terminal capacitor C1 is smaller than capacitance of a second terminal capacitor C2, under the condition of a frequency of about 3 MHz and a current of 20 A. Herein, the electric potential at a first point P1 measured −700 V, and the electric potential at a second point P2 measured −500 V.

The antenna module shown in FIG. 40 may be used to assist plasma discharge. The antenna module shown in FIG. 40 enables the absolute value of the electric potential at a point of a reactance component of the innermost turn of the antenna module to be the maximum, thereby assisting plasma discharge to occur more smoothly.

To assist plasma discharge, the capacitance of the first terminal capacitor C1 may be provided to be smaller than the capacitance of the second terminal capacitor C2. The total capacitance of the first terminal capacitor C1 and the second terminal capacitor C2 may correspond to the capacitance of interlayer capacitors.

Although embodiments have been described and shown, various modifications and variations are possible from the above description by those of skilled in the art. For example, although the described techniques are performed in a different order than the described method, and/or the elements of the described system, structure, apparatus, and circuit are coupled or combined in a different form that the described method, or replaced or substituted by other elements or equivalents, appropriate results may be achieved.

Therefore, other implementations, embodiments, and equivalents to the claims are also within the scope of the following claims.

What is claimed is:

1. An antenna module coupled to a dielectric tube and receiving a power from a power supply, the antenna module comprising:
    a multi-layer coil structure including a first end, a second end, and a first coil structure to an Nth coil structure electrically interposed between the first end and the second end, wherein:
        N is a natural number greater than or equal to 2,
        each of the first coil structure to the Nth coil structure includes two or more turns, the two or more turns comprise an innermost turn and an outermost turn,
        the first coil structure to the Nth coil structure are on respective first to Nth planes, and the first to Nth planes are parallel to but different from each other, and
        the multi-layer coil structure further includes a first inter-layer capacitor to an Mth inter-layer capacitor, wherein the first coil structure to the Nth coil structure and the first inter-layer capacitor to the Mth inter-layer capacitor alternate in series such that the first inter-layer capacitor is electrically connected between the first coil structure and the second coil structure, and so on until the Mth inter-layer capacitor is electrically connected between the N−1th coil structure and the Nth coil structure, and M is equal to N−1;
    a first terminal capacitor electrically connected between the first end and a first terminal of the power supply, wherein the innermost turn of the first coil structure is at the first end; and
    a second terminal capacitor electrically connected between the second end and a second terminal of the power supply, wherein the outermost turn of the Nth coil structure is at the second end; wherein
        the first terminal capacitor has a first capacitance and the second terminal capacitor has a second capacitance, and
        the first capacitance is greater than the second capacitance,
        each of the first inter-layer capacitor to the Mth inter-layer capacitor has a third capacitance, and
        a sum of (i) a reciprocal of the first capacitance and (ii) a reciprocal of the second capacitance has a same value as a reciprocal of the third capacitance, such that, when the antenna module receives the power, an absolute value of an electric potential with respect to ground is minimal on the innermost turn of the two or more turns in each of the first coil structure to the Nth coil structure.

2. The antenna module of claim 1, wherein the electric potential is a voltage.

3. The antenna module of claim 2, wherein when the antenna module receives the power, the voltage becomes maximum on the outermost turn of each of the first coil structure to the Nth coil structure.

4. The antenna module of claim 1, wherein:
    the first terminal capacitor is directly connected to the innermost turn of the first coil structure, and
    the second terminal capacitor is directly connected to the outermost turn of the Nth coil structure.

5. The antenna module of claim 1, wherein the first capacitance is greater than or equal to two times of the second capacitance.

6. The antenna module of claim 2, wherein when the antenna module receives the power, the innermost turn of each of the first coil structure to the Nth coil structure includes a point where the voltage is zero.

7. The antenna module of claim 1, wherein the first capacitance is greater than the third capacitance.

8. The antenna module of claim 7, wherein the second capacitance is smaller than the third capacitance.

9. The antenna module of claim 1, wherein the minimal absolute value of the electric potential on the innermost turn minimizes production of a by-product caused by collision with the dielectric tube of a plasma produced in the dielectric tube when the antenna module receives the power.

10. The antenna module of claim 1, wherein each of the first coil structure to the Nth coil structure includes three or more turns.

11. The antenna module of claim 1, wherein N is four or more.

12. A plasma generating system, comprising:
a dielectric tube providing a space for inducing a plasma;
a power supply configured to provide a power; and
an antenna module coupled to the dielectric tube and configured to induce the plasma by receiving the power from the power supply; wherein
the antenna module includes:
a multi-layer coil structure including a first end, a second end, and a first coil structure to an Nth coil structure electrically interposed between the first end and the second end, wherein N is a natural number greater than or equal to 2,
at least one first terminal capacitor electrically connected between the first end and a first terminal of the power supply, and
at least one second terminal capacitor electrically connected between the second end and a second terminal of the power supply,
each of the first coil structure to the Nth coil structure includes two or more turns, the two or more turns comprise an innermost turn and an outermost turn, the innermost turn of the first coil structure is at the first end, and the outermost turn of the Nth coil structure is at the second end,
the first coil structure to the Nth coil structure are on respective first to Nth planes, and the first to Nth planes are parallel to but different from each other,
the multi-layer coil structure further includes a first inter-layer capacitor to a Mth inter-layer capacitor, wherein the first coil structure to the Nth coil structure and the first inter-layer capacitor to the Mth inter-layer capacitor alternate in series such that the first inter-layer capacitor is electrically connected between the first coil structure and the second coil structure, and so on until the Mth inter-layer capacitor is electrically connected between the N−1th coil structure and the Nth coil structure, and M is equal to N−1;
the first terminal capacitor has a first capacitance and the second terminal capacitor has a second capacitance,
the first capacitance is greater than the second capacitance,
each of the first inter-layer capacitor to the Mth inter-layer capacitor have a third capacitance, and
a sum of (i) a reciprocal of the first capacitance and (ii) a reciprocal of the second capacitance has a same value as a reciprocal of the third capacitance, such that, when the antenna module receives the power, an absolute value of an electric potential with respect to ground minimal on the innermost turn of the two or more turns in each of the first coil structure to the Nth coil structure.

13. The plasma generating system of claim 12, wherein the electric potential is a voltage.

14. The plasma generating system of claim 11, wherein:
the first terminal capacitor is directly connected to the innermost turn of the first coil structure, and
the second terminal capacitor is directly connected to the outermost turn of the Nth coil structure.

15. The plasma generating system of claim 12, wherein the first capacitance is greater than or equal to two times of the second capacitance.

16. The plasma generating system of claim 13, wherein when the antenna module receives the power, the innermost turn of each of the first coil structure to the Nth coil structure includes a point where the voltage is zero, and the voltage becomes maximum on the outermost turn of each of the first coil structure to the Nth coil structure.

17. The plasma generating system of claim 12, wherein the first capacitance is greater than the third capacitance, and the second capacitance is smaller than the third capacitance.

18. The plasma generating system of claim 12, wherein the minimal absolute value of the electric potential on the innermost turn minimizes production of a by-product caused by collision with the dielectric tube of the plasma.

19. The plasma generating system of claim 12, wherein each of the first coil structure to the Nth coil structure includes three or more turns, and N is four or more.

20. The plasma generating system of claim 12, wherein the power supply comprises a variable-frequency RF power source, and the variable-frequency RF power source comprises a rectifier converting commercial AC power into DC power; a controller controlling a driving frequency and the power by providing a switching signal; and an inverter converting the DC power into RF power based on the switching signal.

* * * * *